US012740059B2

(12) United States Patent
Yamamoto

(10) Patent No.: US 12,740,059 B2
(45) Date of Patent: Sep. 15, 2026

(54) THREE-DIMENSIONAL MEMORY DEVICE INCLUDING CAPPED HOLLOW TUBE-SHAPED DRAIN REGIONS

(71) Applicant: SANDISK TECHNOLOGIES LLC, Addison, TX (US)

(72) Inventor: Keita Yamamoto, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 423 days.

(21) Appl. No.: 18/351,235

(22) Filed: Jul. 12, 2023

(65) Prior Publication Data

US 2024/0196611 A1 Jun. 13, 2024

Related U.S. Application Data

(60) Provisional application No. 63/386,374, filed on Dec. 7, 2022.

(51) Int. Cl.

| | |
|---|---|
| ***H10B 43/27*** | (2023.01) |
| ***G11C 16/04*** | (2006.01) |
| ***H10B 41/10*** | (2023.01) |
| ***H10B 41/27*** | (2023.01) |
| ***H10B 41/35*** | (2023.01) |

(Continued)

(52) U.S. Cl.

CPC ......... *H10B 43/27* (2023.02); *G11C 16/0483* (2013.01); *H10B 41/10* (2023.02); *H10B 41/27* (2023.02); *H10B 41/35* (2023.02); *H10B 43/10* (2023.02); *H10B 43/35* (2023.02); *H10W 20/42* (2026.01); *H10W 20/435* (2026.01)

(58) Field of Classification Search

CPC ........ H10B 43/27; H10B 43/10; H10B 43/35; H10B 43/42; H10B 41/10; H10B 41/27; H10B 41/35; G11C 16/0483; H10W 20/435

See application file for complete search history.

(56) References Cited

U.S. PATENT DOCUMENTS

| | | | | |
|---|---|---|---|---|
| 5,915,167 | A | 6/1999 | Leedy | |
| 2020/0203381 | A1 * | 6/2020 | Rabkin | H10B 51/20 |

(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — William B Partridge
*Assistant Examiner* — Chevy J Boegel
(74) *Attorney, Agent, or Firm* — THE MARBURY LAW GROUP PLLC

(57) ABSTRACT

A semiconductor structure includes an alternating stack of insulating layers and electrically conductive layers, a memory opening vertically extending through the alternating stack, and a memory opening fill structure located in the memory opening and including a memory film, a vertical semiconductor channel, a dielectric core laterally surrounded by the vertical semiconductor channel, and a drain region overlying the dielectric core and the vertical semiconductor channel. The drain region includes an end cap portion and a hollow tubular portion vertically protruding downward from the end cap portion and laterally surrounding a top tip portion of the dielectric core.

7 Claims, 41 Drawing Sheets

(51) Int. Cl.
*H10B 43/10* (2023.01)
*H10B 43/35* (2023.01)
*H10W 20/41* (2026.01)
*H10W 20/42* (2026.01)

(56) References Cited

U.S. PATENT DOCUMENTS

| | | | | |
|---|---|---|---|---|
| 2021/0159169 | A1* | 5/2021 | Zhao | G11C 16/16 |
| 2021/0305384 | A1* | 9/2021 | Cui | H10D 30/694 |
| 2022/0208785 | A1 | 6/2022 | Titus et al. | |

OTHER PUBLICATIONS

U.S. Appl. No. 17/355,955, filed Jun. 23, 2021, SanDisk Technologies LLC.
U.S. Appl. No. 17/494,114, filed Oct. 5, 2021, SanDisk Technologies LLC.
U.S. Appl. No. 17/508,036, filed Oct. 22, 2021, SanDisk Technologies LLC.
U.S. Appl. No. 17/590,278, filed Feb. 1, 2022, SanDisk Technologies LLC.
U.S. Appl. No. 17/657,521, filed Mar. 31, 2022, SanDisk Technologies LLC.
U.S. Appl. No. 17/811,145, filed Jul. 7, 2022, SanDisk Technologies LLC.
U.S. Appl. No. 18/151,662, filed Jan. 9, 2023, SanDisk Technologies LLC.
U.S. Appl. No. 18/346,504, filed Jul. 3, 2023, SanDisk Technologies LLC.
U.S. Appl. No. 18/346,520, filed Jul. 3, 2023, Western Digital Technologies, Inc.

* cited by examiner 180
170
142
132
142
132
100
200
148
128
110'
165
6
768
8
788
786
720
784
780
788
786
784
782
742
758
754
752
756
750
9
760
766
764
762
700

THREE-DIMENSIONAL MEMORY DEVICE INCLUDING CAPPED HOLLOW TUBE-SHAPED DRAIN REGIONS

FIELD

The present disclosure relates generally to the field of semiconductor devices, and particularly to integrated support and contact structures for a three-dimensional memory device including capped hollow tube-shaped drain regions and methods of manufacturing the same.

BACKGROUND

Three-dimensional vertical NAND strings having one bit per cell are disclosed in an article by T. Endoh et al., titled “Novel Ultra High Density Memory With A Stacked-Surrounding Gate Transistor (S-SGT) Structured Cell”, IEDM Proc. (2001) 33-36.

SUMMARY

According to an aspect of the present disclosure, a semiconductor structure is provided, which comprises: an alternating stack of insulating layers and electrically conductive layers; a memory opening vertically extending through the alternating stack; and a memory opening fill structure located in the memory opening and comprising a memory film, a vertical semiconductor channel, a dielectric core laterally surrounded by the vertical semiconductor channel, and a drain region overlying the dielectric core and the vertical semiconductor channel, wherein the drain region comprises an end cap portion and a hollow tubular portion vertically protruding downward from the end cap portion and laterally surrounding a top tip portion of the dielectric core.

According to another aspect of the present disclosure, a method of forming a semiconductor structure is provided, which comprises: forming an alternating stack of insulating layers and spacer material layers over a substrate, wherein the spacer material layers are formed as, or are subsequently replaced with, electrically conductive layers; forming a memory opening through the alternating stack; forming a memory film in the memory opening; forming a semiconductor channel material layer over the memory film; forming a sacrificial cover layer comprising a sacrificial cover material over the semiconductor channel material layer; converting a top portion of the sacrificial cover layer into an etch mask material portion without changing a material composition of a lower portion of the sacrificial cover layer; removing the lower portion of the sacrificial cover layer selective to the etch mask material portion and the semiconductor channel material layer; forming a dielectric core within a cavity that is laterally surrounded by the semiconductor channel material layer; forming a drain cavity by removing the etch mask material portion selective to the dielectric core and the semiconductor channel material layer; and forming a drain region in the drain cavity.

DETAILED DESCRIPTION

Figure 1A:
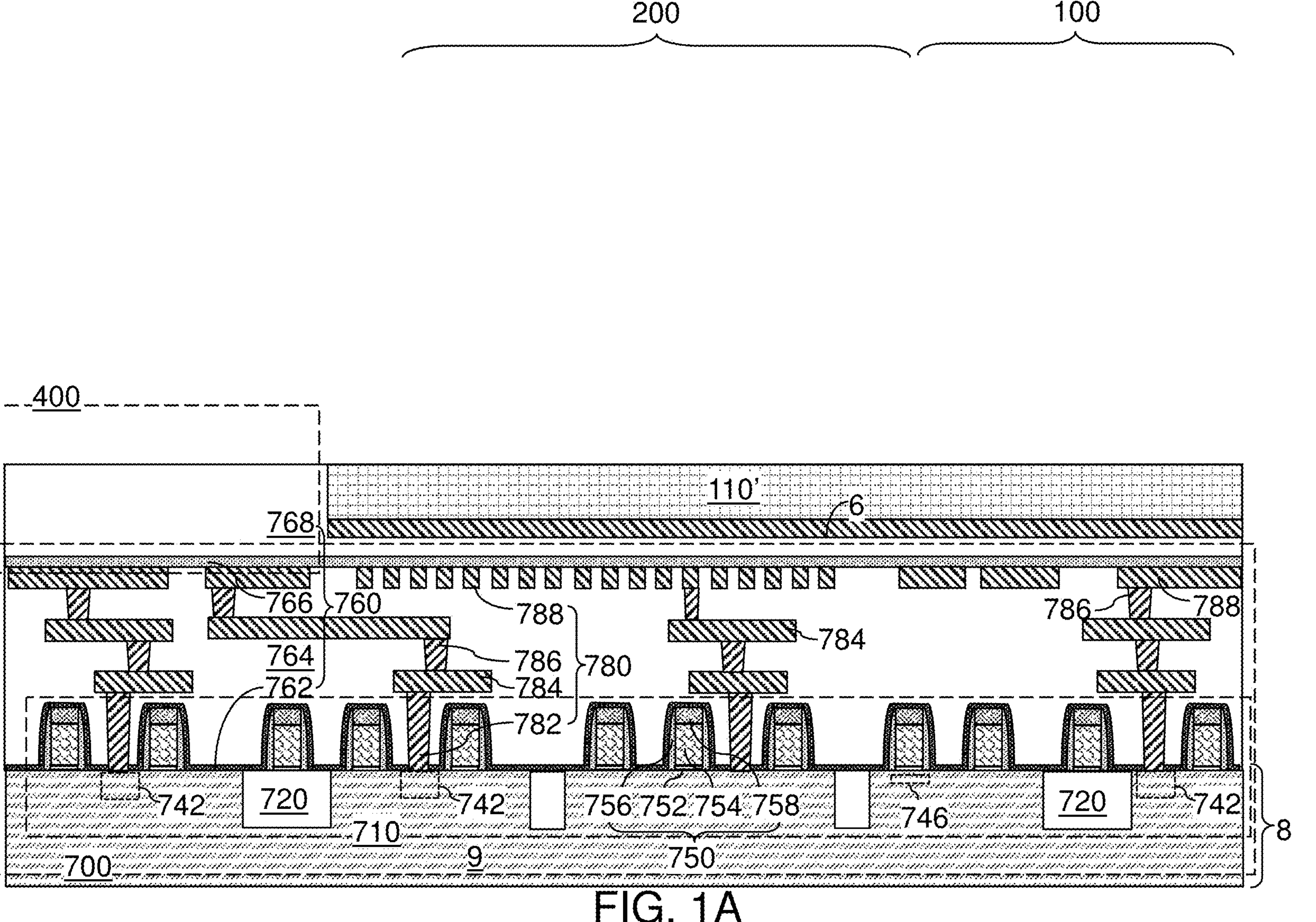
FIG. 1A is a vertical cross-sectional view of an exemplary structure after formation of semiconductor devices, lower-level dielectric layers, lower-level metal interconnect structures, and in-process source-level material layers according to an embodiment of the present disclosure.

The present disclosure is directed to a three-dimensional memory device including capped hollow tube-shape drain regions and methods of manufacturing the same, the various aspects of which are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the element and a surface of the second element. As used herein, a first element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
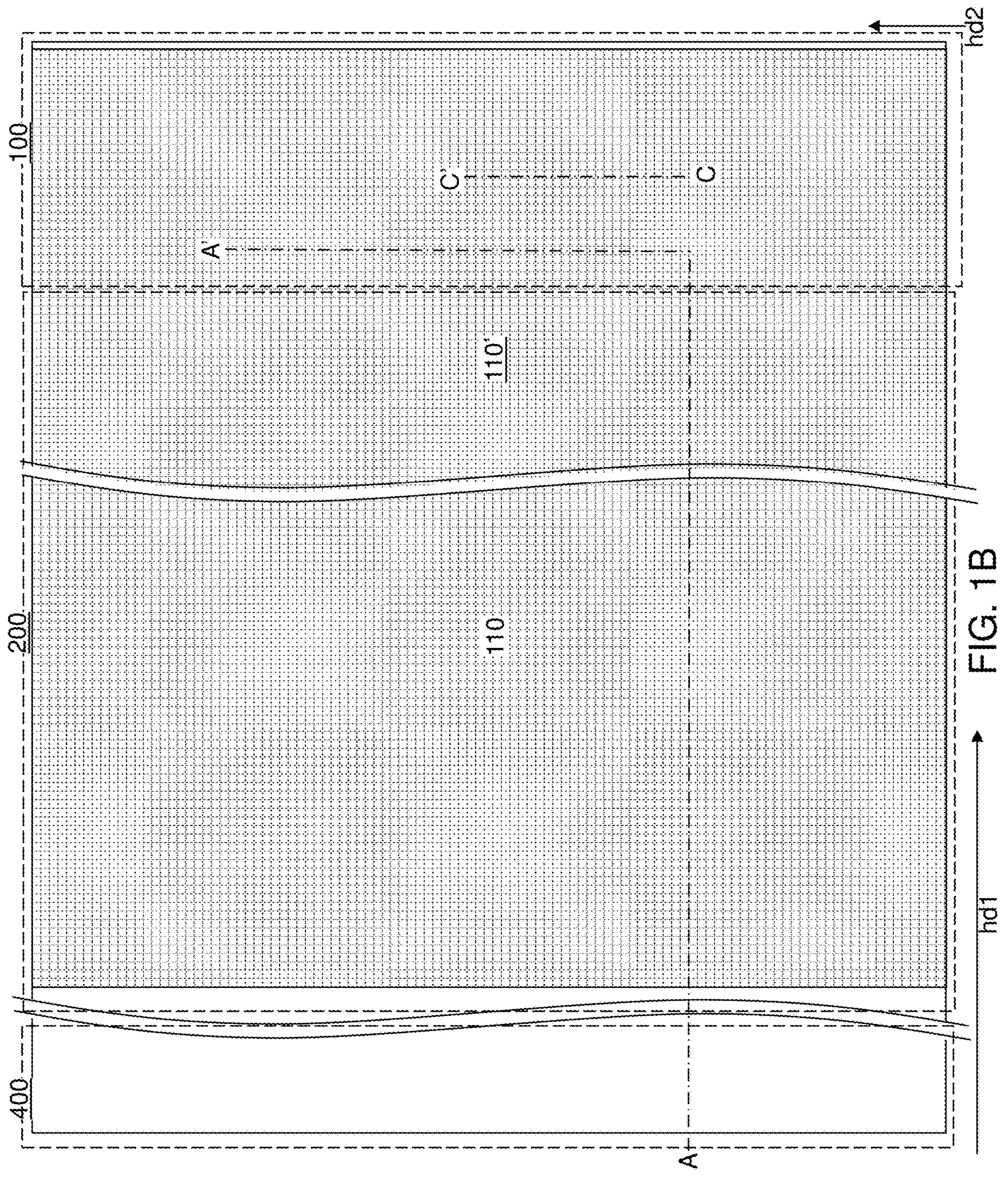
FIG. 1B is a top-down view of the exemplary structure of FIG. 1A. The vertical plane A-A' is the plane of the vertical cross-sectional view of FIG. 1A.
Figure 1C:
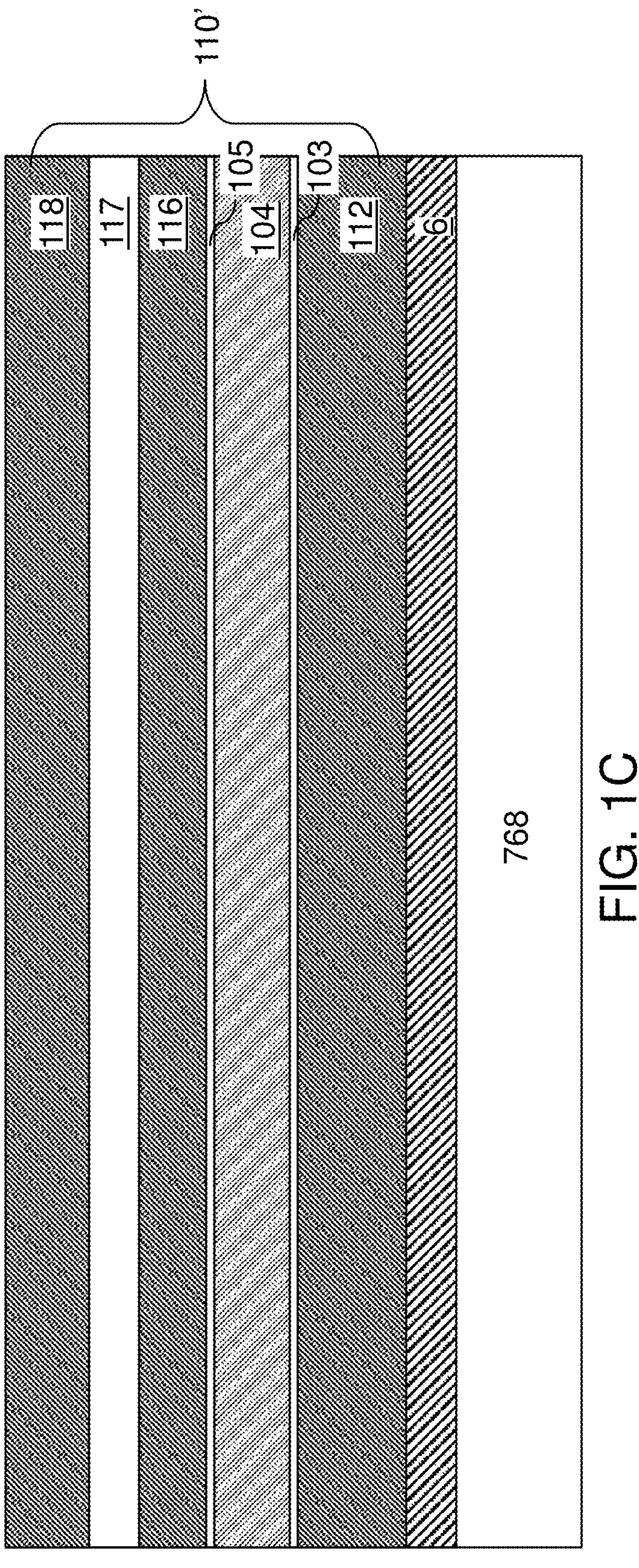
FIG. 1C is a magnified view of the in-process source level material layers along the vertical plane C-C' of FIG. 1B.

Referring to FIGS. 1A-1C, an exemplary structure according to an embodiment of the present disclosure is illustrated. The exemplary structure includes a semiconductor substrate 8 and a peripheral circuitry 710 formed thereupon. The exemplary structure includes a memory array region 100 in which a three-dimensional memory array is to be subsequently formed, a staircase region 200 in which stepped surfaces of electrically conductive layers and contact via structures are to be subsequently formed, and a connection region 400 in which peripheral contact via structures are to be subsequently formed.

The a substrate, such as a semiconductor substrate 8 includes a substrate semiconductor layer 9 at least at an upper portion thereof. The semiconductor substrate may comprise a silicon wafer and the substrate semiconductor layer 9 may comprise an upper portion of the silicon wafer containing various doped wells and/or an epitaxial silicon layer. Shallow trench isolation structures 720 can be formed in an upper portion of the substrate semiconductor layer 9 to provide electrical isolation among the semiconductor devices. The peripheral circuitry 710 includes field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758.

The peripheral circuitry 710 can include additional semiconductor devices in addition to p-type field effect transistors and n-type field effect transistors, which can be employed to support operation of a memory structure to be subsequently formed. The peripheral circuitry 710 includes a driver circuitry, which is also referred to as a peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric material layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786 and landing pads 788 for through-memory-level contact via structures to be subsequently formed.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one second dielectric material layer 768 can comprise, or consist essentially of, dielectric material layers having dielectric constants that do not exceed the dielectric constant of undoped silicate glass (silicon oxide) of 3.9.

The combination of the lower-level dielectric layers 760 and the lower-level metal interconnect structures 780 overlie the peripheral circuitry 710. The lower-level metal interconnect structures 780 can be electrically connected to active nodes (e.g., transistor active regions 742 or gate electrodes 754) of the peripheral circuitry 710 (e.g., CMOS devices), and are located at the level of the lower-level dielectric layers 760. Through-memory-level contact via structures can be subsequently formed directly on the lower-level metal interconnect structures 780 to provide electrical connection to memory devices to be subsequently formed.

In-process source-level material layers 110' including a layer stack of material layers can be formed over lower-level dielectric layers 760. The in-process source-level material layers 110' can include various layers that are subsequently modified to form source-level material layers. The source-level material layers, upon formation, include a source contact layer that functions as a common source region for vertical NAND strings of a three-dimensional memory device. In one embodiment, the in-process source-level material layer 110' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material, such as doped polysilicon or doped amorphous silicon. The doped semiconductor material of the lower source-level material layer 112 is herein referred to as a first doped semiconductor material, and the doped semiconductor material of the upper source-level material layer 116 is herein referred to as a second doped semiconductor material, which may be the same or different from the first doped semiconductor material. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a dielectric material such as silicon nitride, or a semiconductor material such as undoped amorphous silicon or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material, such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a doped semiconductor material such as doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 110' can be formed directly above a subset of the semiconductor devices on the semiconductor substrate 8 (e.g., silicon wafer). As used herein, a first element is located "directly above" a second element if the element is located above a horizontal plane including a topmost surface of the second element and an area of the element and an area of the second element has an areal overlap in a plan view (i.e., along a vertical plane or direction perpendicular to the top surface of the substrate 8.

The in-process source-level material layers 110' may be patterned to provide openings in areas in which through-memory-level contact via structures and through-dielectric contact via structures are to be subsequently formed. Patterned portions of the in-process source-level material layers 110' are present in each memory array region 100 in which three-dimensional memory stack structures are to be subsequently formed. The at least one second dielectric material layer 768 can include a blanket layer portion underlying the in-process source-level material layers 110' and a patterned portion that fills gaps among the patterned portions of the in-process source-level material layers 110'.

The in-process source-level material layers 110' can be patterned such that an opening extends over a staircase region 200 in which contact via structures contacting word line electrically conductive layers are to be subsequently formed. In one embodiment, the staircase region 200 can be laterally spaced from the memory array region 100 along a first horizontal direction hd1. A horizontal direction that is perpendicular to the first horizontal direction hd1 is herein referred to as a second horizontal direction hd2.

Figure 2:
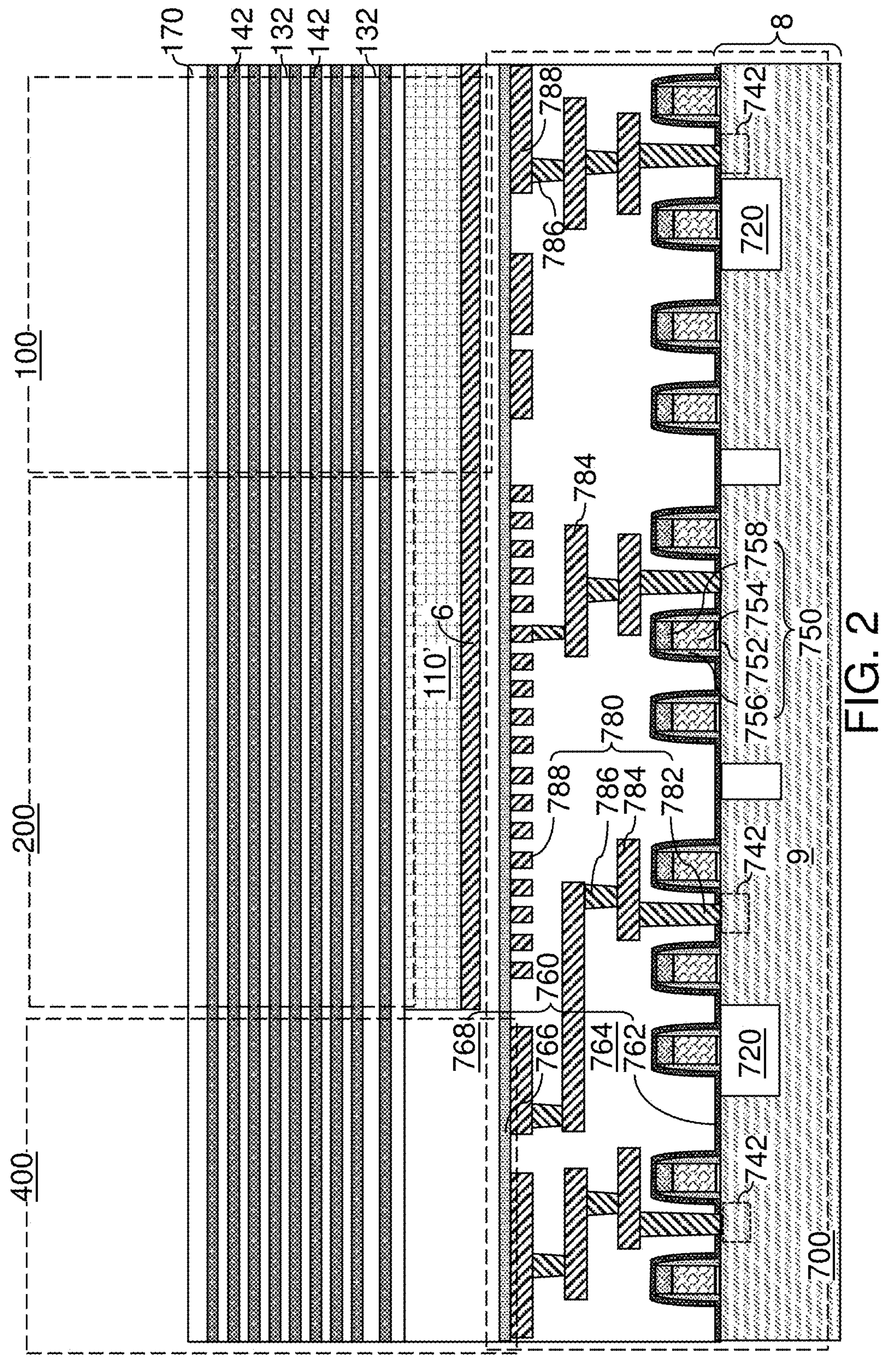
FIG. 2 is a vertical cross-sectional view of the exemplary structure after formation of a first vertically alternating sequence of first insulating layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first vertically alternating sequence. The level of the first vertically alternating sequence is herein referred to as a first-tier level, and the level of the alternating stack to be subsequently formed immediately above the first-tier level is herein referred to as a second-tier level, etc.

The first vertically alternating sequence can include first insulating layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the in-process source-level material layers. As used herein, a "sacrificial material" refers to a material that is removed during a subsequent processing step.

As used herein, an alternating stack of elements and second elements refers to a structure in which instances of the elements and instances of the second elements alternate. Each instance of the elements that is not an end element of the alternating plurality is adjoined by two instances of the second elements on both sides, and each instance of the second elements that is not an end element of the alternating plurality is adjoined by two instances of the elements on both ends. The elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the elements and an instance of the second elements may form a unit that is repeated with periodicity within the alternating plurality.

The first vertically alternating sequence (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first vertically alternating sequence (132, 142) can have a uniform thickness that is substantially invariant within each respective first sacrificial material layer 142.

A first insulating cap layer 170 is subsequently formed over the alternating stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
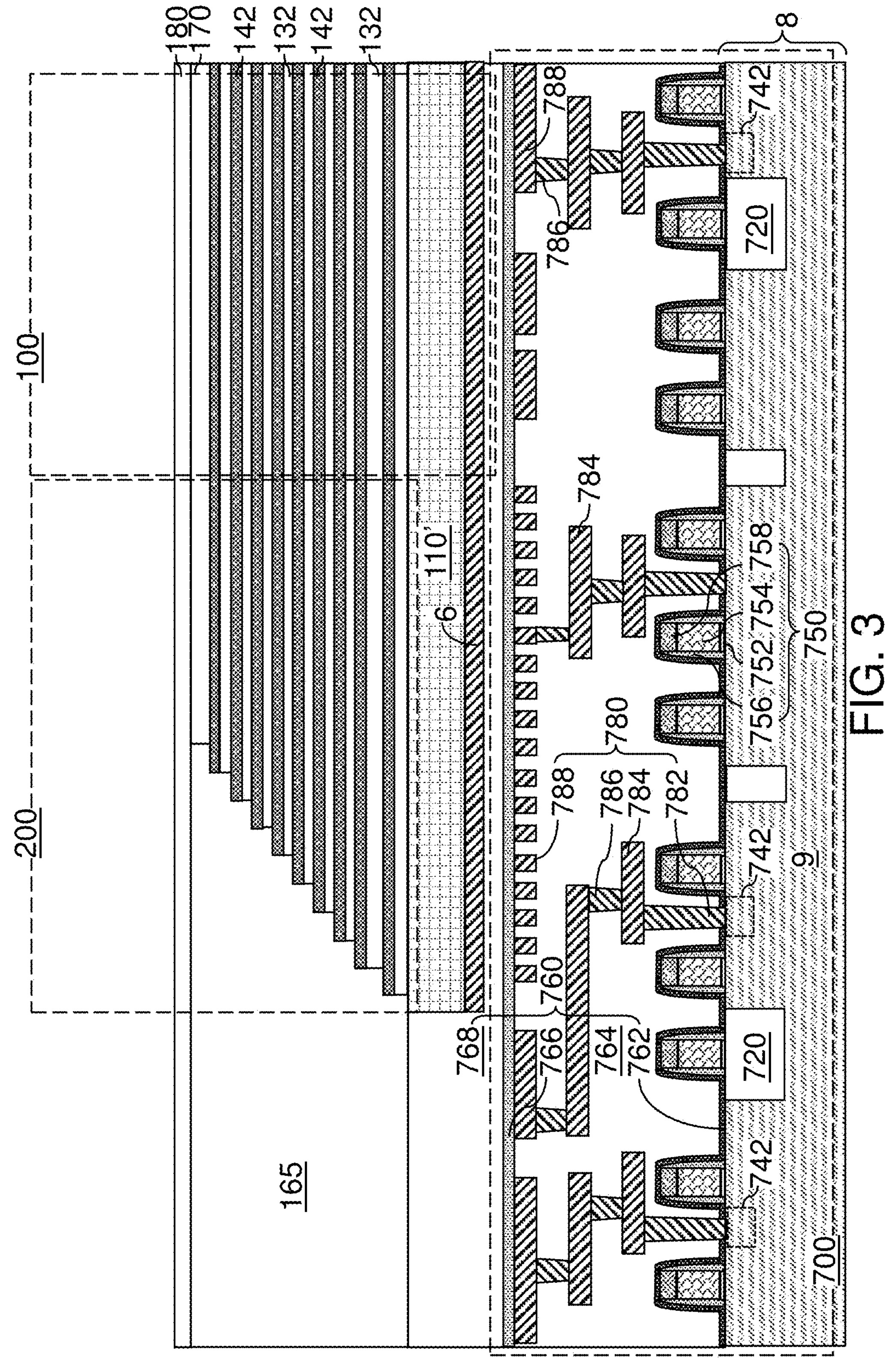
FIG. 3 is a vertical cross-sectional view of the exemplary structure after patterning first stepped surfaces, a first retro-stepped dielectric material portion, and an inter-tier dielectric layer according to an embodiment of the present disclosure.

Referring to FIG. 3, the first insulating cap layer 170 and the first vertically alternating sequence (132, 142) can be patterned to form first stepped surfaces in the staircase region 200. The staircase region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces. The cavity overlying the first stepped surfaces is herein referred to as a first stepped cavity.

A dielectric fill material (such as undoped silicate glass or doped silicate glass) can be deposited to fill the first stepped cavity. Excess portions of the dielectric fill material can be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 can include a doped silicate glass having a greater etch rate than the material of the first insulating layers 132 (which can include an undoped silicate glass). For example, the inter-tier dielectric layer 180 can include phosphosilicate glass. The thickness of the inter-tier dielectric layer 180 can be in a range from 30 nm to 300 nm, although lesser and greater thicknesses can also be employed.

Figure 4A:
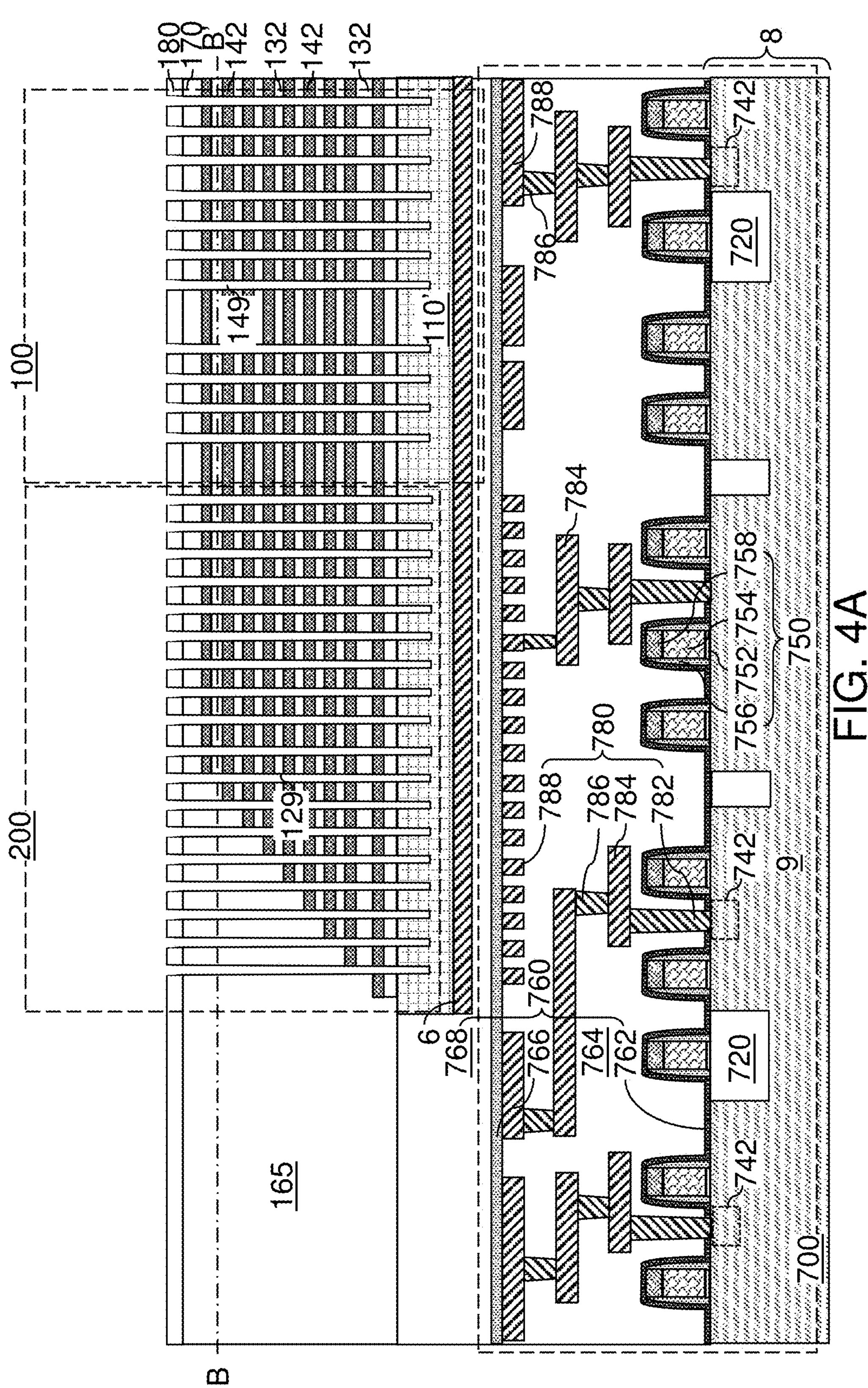
FIG. 4A is a vertical cross-sectional view of the exemplary structure after formation of first-tier memory openings and first-tier support openings according to an embodiment of the present disclosure.
Figure 4B:
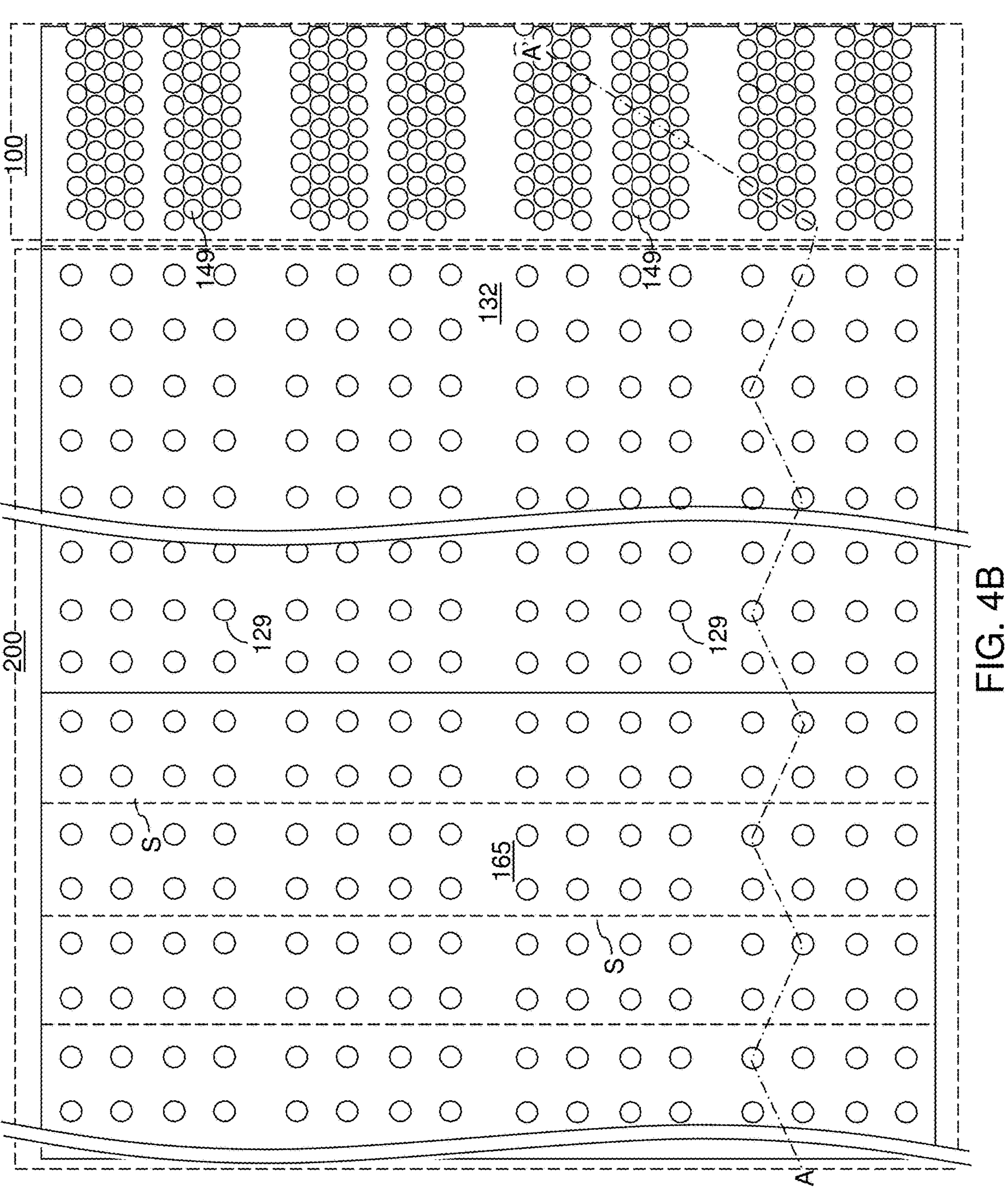
FIG. 4B is a top-down view of the exemplary structure of FIG. 4A. The zig-zag vertical plane A-A' corresponds to the plane of the vertical cross-sectional view of FIG. 4A.

Referring to FIGS. 4A and 4B, first-tier openings (149, 129) can be formed through the inter-tier dielectric layer 180 and the first-tier structure (132, 142, 170, 165) and partly through the in-process source-level material layers 110'. For example, a photoresist layer (not shown) can be applied over the inter-tier dielectric layer 180, and can be lithographically patterned to form various openings therethrough. The pattern of openings in the photoresist layer can be transferred through the inter-tier dielectric layer 180 and the first-tier structure (132, 142, 170, 165) and partly through the in-process source-level material layers 110' by a first anisotropic etch process to form the first-tier openings (149, 129) concurrently, i.e., during the first anisotropic etch process.

The first-tier openings (149, 129) can include first-tier memory openings 149 and first-tier support openings 129. The first-tier memory openings 149 are openings that are formed in the memory array region 100 through each layer within the first alternating stack (132, 142) and are subsequently employed to form memory stack structures therein. The bottom surfaces of the first-tier openings (149, 129) can be a recessed surface of the source-level sacrificial layer 104. Thus, each first-tier opening (149, 129) can have a bottom surface between a horizontal plane including the bottom surface of the source-level sacrificial layer 104 and a horizontal plane including the top surface of the source-level sacrificial layer 104. In one embodiment, bottom surface of the first-tier openings (149, 129) may be formed within the lower source-level material layer 112.

The first-tier support openings 129 are openings that are formed in the staircase region 200 and are subsequently employed to form support structures that are subsequently employed to provide structural support to the exemplary structure during replacement of sacrificial material layers with electrically conductive layers. In case the first spacer materials are formed as electrically conductive layers, the first-tier support openings 129 can be omitted. A subset of the first-tier support openings 129 can be formed through horizontal surfaces of the first stepped surfaces of the first alternating stack (132, 142).

In one embodiment, the first-tier memory openings 149 can be formed as clusters that are laterally spaced among one another along the second horizontal direction hd2. Each cluster of first-tier memory openings 149 can include a respective two-dimensional array of first-tier memory openings 149 having a first pitch along one horizontal direction and a second pitch along another horizontal direction. In one embodiment, the direction of the first memory structure pitch can be the first horizontal direction (e.g., word line direction) hd1 and the direction of the second memory structure pitch can be the second horizontal direction (e.g., bit line direction) hd2, or vice versa.

In one embodiment, the inter-tier dielectric layer 180 can comprise a dielectric material (such as borosilicate glass) having a greater etch rate than the first insulating layers 132 (that can include undoped silicate glass). In one embodiment, the bottom surface of each first-tier memory opening 149 can be formed between the top surface and the bottom surface of the source-level sacrificial layer 104. In this case, surfaces of the source-level sacrificial layer 104 can be exposed at a bottom portion of each first-tier memory opening 149. Locations of steps S in the first vertically alternating sequence (132, 142) are illustrated as dotted lines in FIG. 4B.

Figure 5:
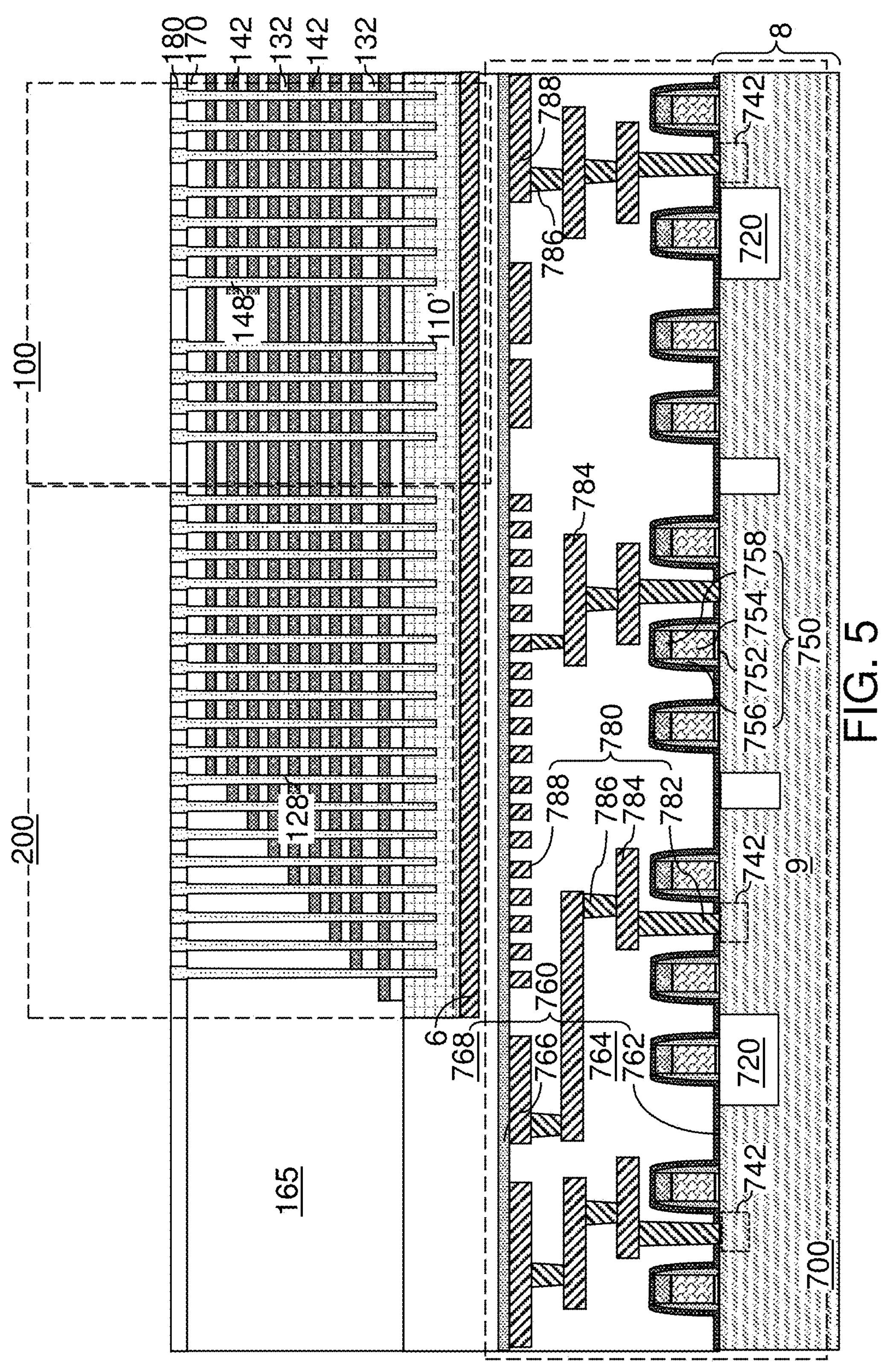
FIG. 5 is a vertical cross-sectional view of the exemplary structure after formation of sacrificial memory opening fill portions and first-tier support opening fill portions according to an embodiment of the present disclosure.

Referring to FIG. 5, sacrificial first-tier opening fill portions (148, 128) can be formed in the first-tier openings (149, 129). For example, a sacrificial fill material is deposited concurrently deposited in each of the first-tier openings (149, 129). The sacrificial fill material includes a material that can be subsequently removed selective to the materials of the first insulating layers 132 and the first sacrificial material layers 142.

In one embodiment, the sacrificial fill material can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer or a silicon nitride layer having a thickness in a range from 1 nm to 3 nm) may be employed prior to depositing the sacrificial first-tier fill material. The sacrificial fill material may be formed by a non-conformal deposition or a conformal deposition method.

In another embodiment, the sacrificial fill material can include a silicon oxide material having a higher etch rate than the materials of the first insulating layers 132, the first insulating cap layer 170, and the inter-tier insulating layer 180. For example, the sacrificial fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop layer (such as a silicon nitride layer having a thickness in a range from 1 nm to 3 nm) may be employed prior to depositing the sacrificial first-tier fill material. The sacrificial fill material may be formed by a non-conformal deposition or a conformal deposition method.

In yet another embodiment, the sacrificial fill material can include a carbon-containing material (such as amorphous carbon or diamond-like carbon) that can be subsequently removed by ashing, or a silicon-based polymer that can be subsequently removed selective to the materials of the first alternating stack (132, 142).

Portions of the deposited sacrificial fill material can be removed from above the topmost layer of the first vertically alternating sequence (132, 142), such as from above the inter-tier dielectric layer 180. For example, the sacrificial fill material can be recessed to a top surface of the inter-tier dielectric layer 180 employing a planarization process. The planarization process can include a recess etch, chemical mechanical planarization (CMP), or a combination thereof. The top surface of the inter-tier dielectric layer 180 can be employed as an etch stop layer or a planarization stop layer.

Remaining portions of the sacrificial fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The top surfaces of the sacrificial first-tier opening fill portions (148, 128) can be coplanar with the top surface of the inter-tier dielectric layer 180. Each of the sacrificial first-tier opening fill portions (148, 128) may, or may not, include cavities therein.

Figure 6:
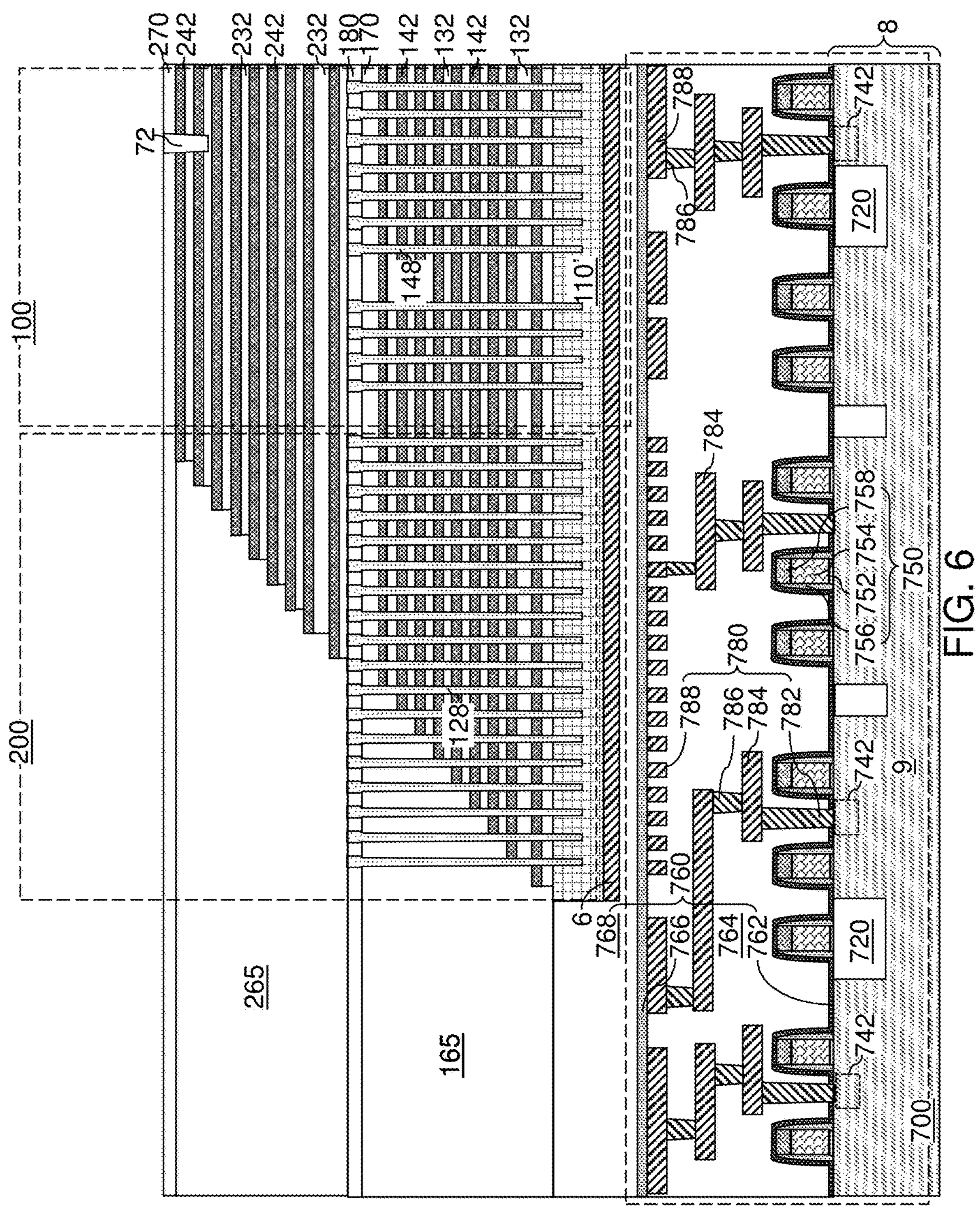
FIG. 6 is a vertical cross-sectional view of the exemplary structure after formation of a second vertically alternating sequence of second insulating layers and second spacer material layers, second stepped surfaces, a second retro-stepped dielectric material portion, and drain-select-level isolation structures according to an embodiment of the present disclosure.

Referring to FIG. 6, a second-tier structure can be formed over the first-tier structure (132, 142, 170, 165, 148, 128). The second-tier structure can include an additional vertically alternating sequence of additional insulating layers and additional spacer material layers, which can be additional sacrificial material layers. The second vertically alternating sequence is also referred to as a second alternating stack. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

Second stepped surfaces can be formed in the second stepped area of the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

A second insulating cap layer 270 can be subsequently formed over the second alternating stack (232, 242) and the second retro-stepped dielectric material portion 265. The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Optionally, drain-select-level isolation structures 72 can be formed through the second insulating cap layer 270 and through a subset of layers in an upper portion of the second vertically alternating sequence (232, 242). The second sacrificial material layers 242 that are cut by the select-drain-level shallow trench isolation structures 72 correspond to the levels in which drain-select-level electrically conductive layers are subsequently formed. The drain-select-level isolation structures 72 include a dielectric material such as silicon oxide. The drain-select-level isolation structures 72 can laterally extend along a first horizontal direction hd1, and can be laterally spaced apart along a second horizontal direction hd2 that is perpendicular to the first horizontal direction hd1.

Generally speaking, at least one vertically alternating sequence of insulating layers (132, 232) and spacer material layers (such as sacrificial material layers (142, 242)) can be formed over the in-process source-level material layers 110', and at least one retro-stepped dielectric material portion (165, 265) can be formed over the staircase regions on the at least one alternating stack (132, 142, 232, 242). Each of the insulating layers (132, 232) and spacer material layers (such as sacrificial material layers (142, 242) can be formed as a respective single continuous material layer. In this case, the insulating layers (132, 232) may be referred to as continuous insulating layers, and the spacer material layers may be referred to as continuous spacer material layers (such as continuous sacrificial material layers).

Figure 7A:
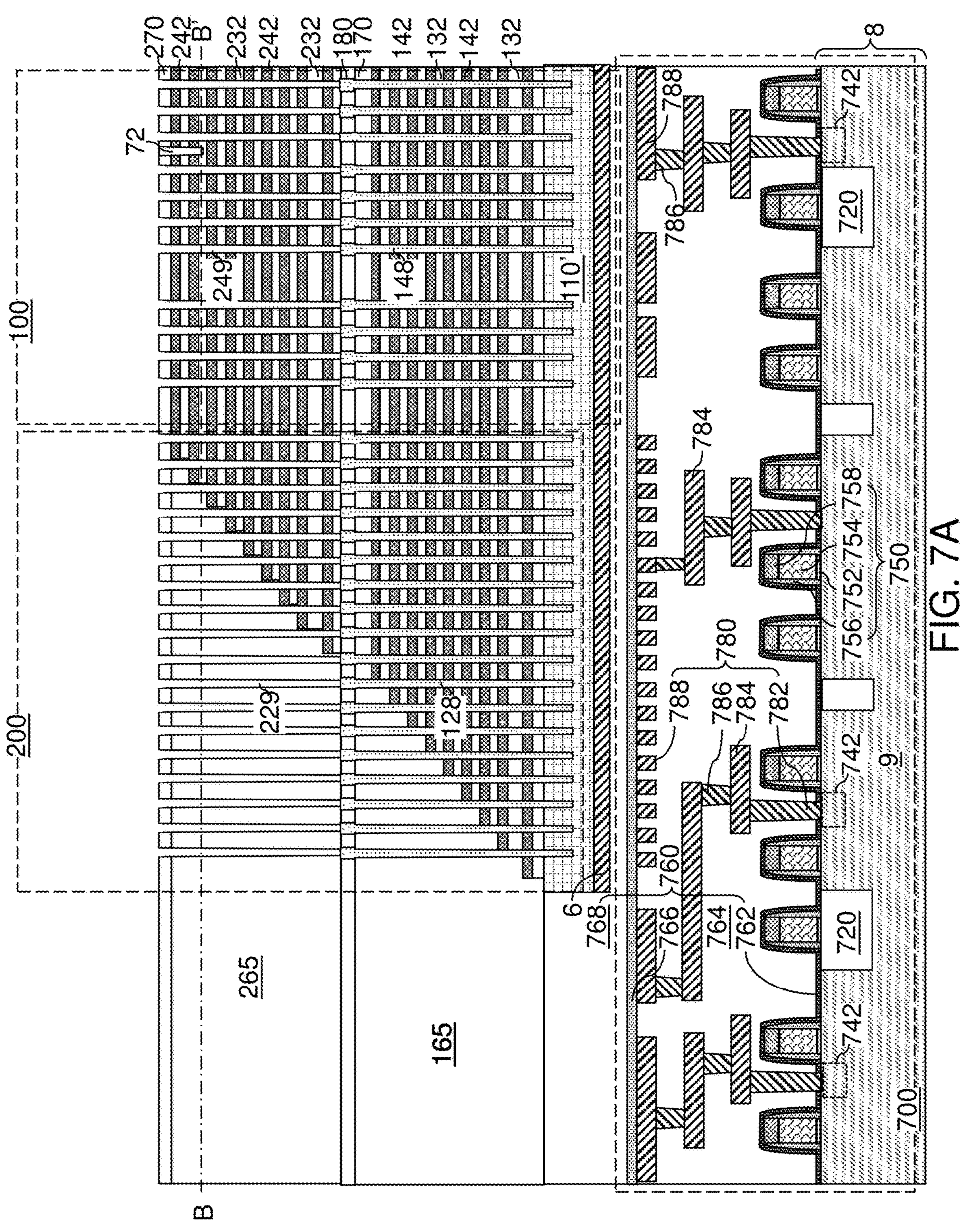
FIG. 7A is a vertical cross-sectional view of the exemplary structure after formation of second-tier memory openings and second-tier support openings according to an embodiment of the present disclosure.
Figure 7B:
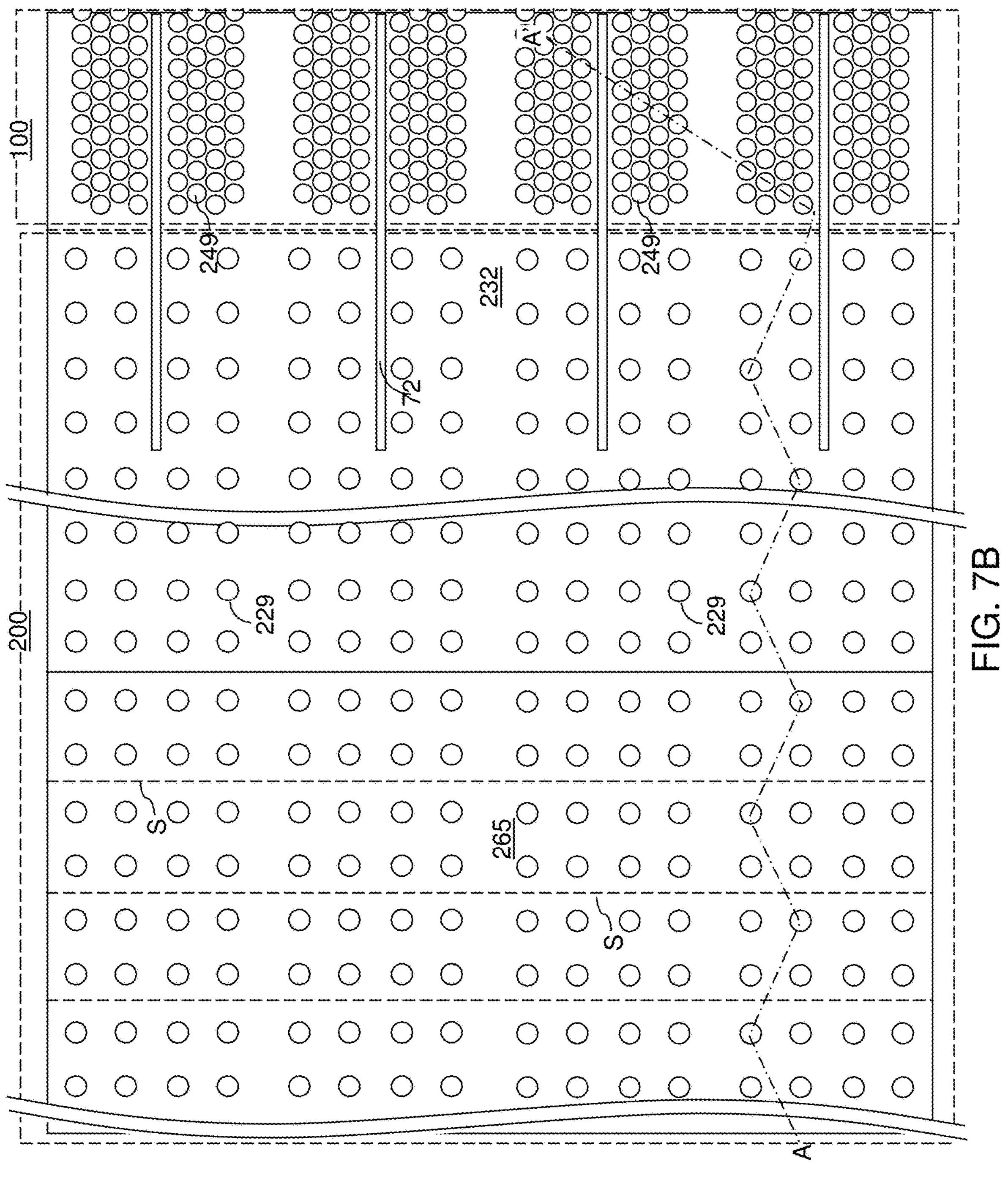
FIG. 7B is a horizontal cross-sectional view of the exemplary structure along the horizontal plane B-B' of FIG. 7A. The zig-zag vertical plane A-A' corresponds to the plane of the vertical cross-sectional view of FIG. 7A.

Referring to FIGS. 7A and 7B, second-tier openings (249, 229) can be formed through the second-tier structure (232, 242, 265, 270, 72). A photoresist layer (not shown) can be applied over the second insulating cap layer 270, and can be lithographically patterned to form various openings therethrough. The pattern of the openings can be the same as the pattern of the various first-tier openings (149, 129), which is the same as the sacrificial first-tier opening fill portions (148, 128). Thus, the lithographic mask employed to pattern the first-tier openings (149, 129) can be employed to pattern the photoresist layer.

The pattern of openings in the photoresist layer can be transferred through the second-tier structure (232, 242, 265, 270, 72) by a second anisotropic etch process to form second-tier openings (249, 229) concurrently, i.e., during the second anisotropic etch process. The second-tier openings (249, 229) can include second-tier memory openings 249 and second-tier support openings.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Locations of steps S in the first vertically alternating sequence (132, 142) and the second vertically alternating sequence (232, 242) are illustrated as dotted lines in FIG. 7B.

Figure 8:
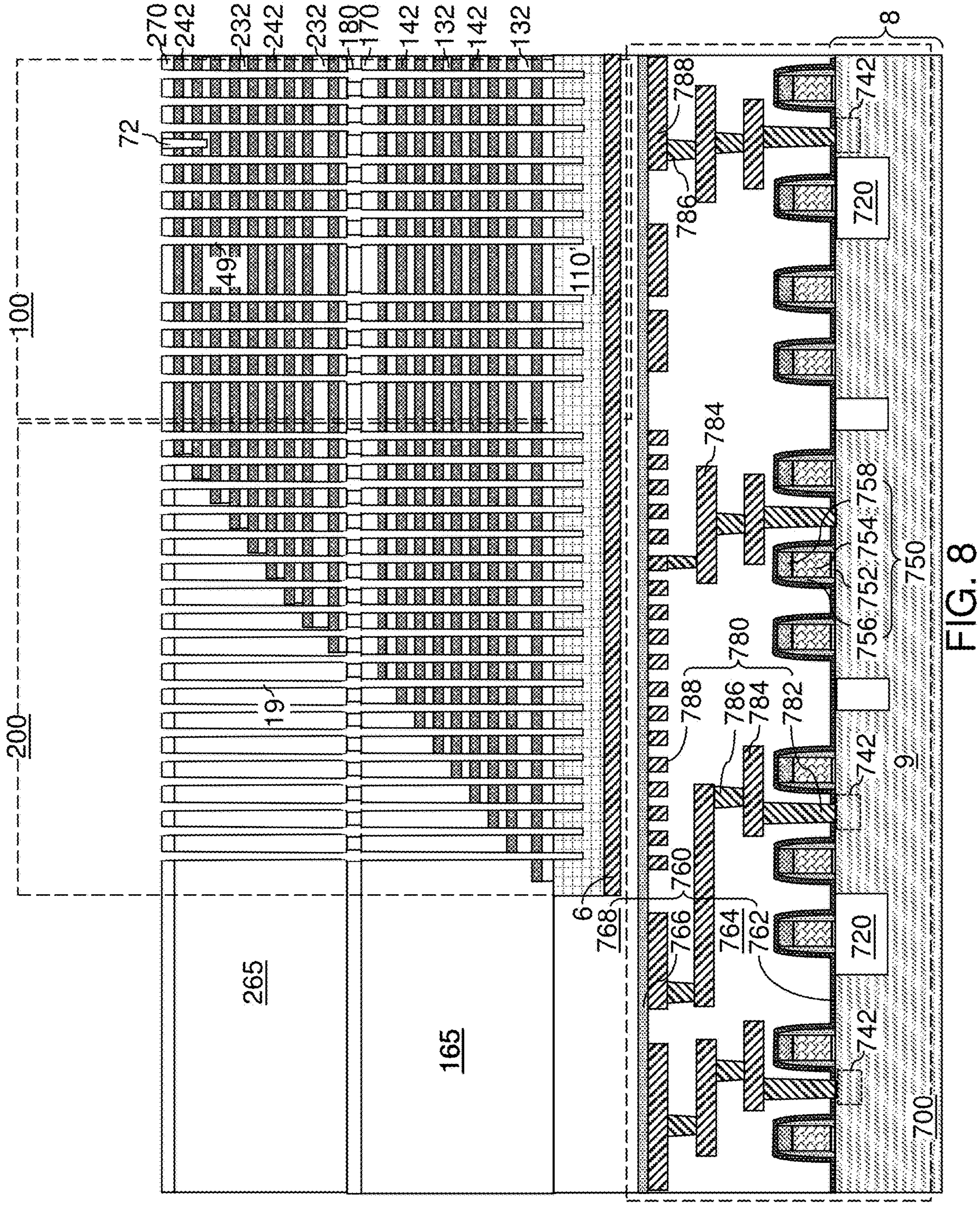
FIG. 8 is a vertical cross-sectional view of the exemplary structure after formation of inter-tier memory openings and inter-tier support openings according to an embodiment of the present disclosure.

Referring to FIG. 8, the sacrificial fill material can be removed from underneath the second-tier memory openings 249 and the second-tier support openings 229 employing an etch process that etches the sacrificial fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each volume from which a sacrificial first-tier memory opening fill portion 148 is removed. A support opening 19, which is also referred to as an inter-tier support opening 19, is formed in each volume from which a sacrificial first-tier support opening fill portion 128 is removed.

Figures 9A, 9B:
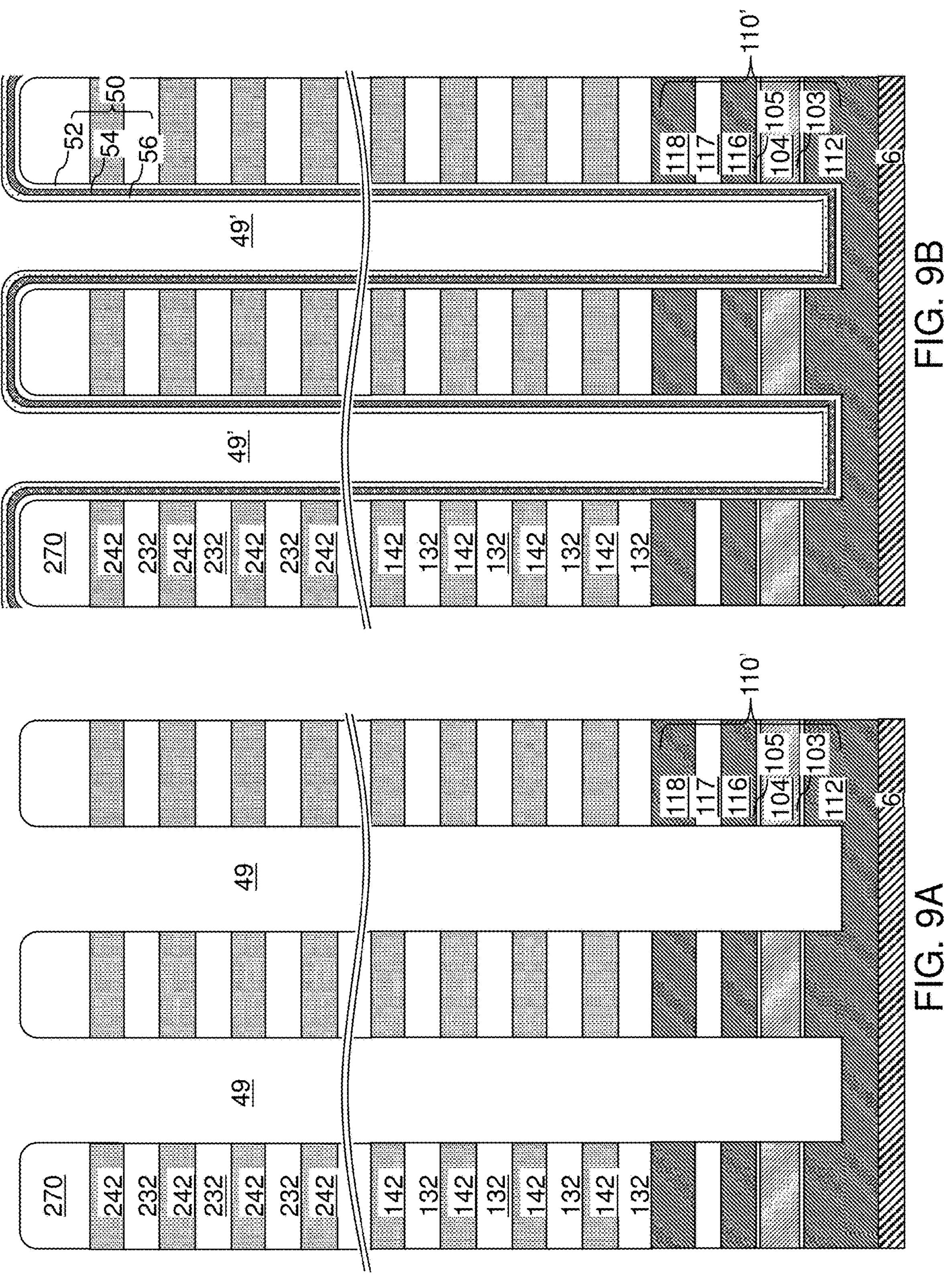
FIGS. 9A-9P are sequential vertical cross-sectional views of a pair of inter-tier memory openings during formation of a pair of memory opening fill structures according to an embodiment of the present disclosure.
Figures 9C, 9D:
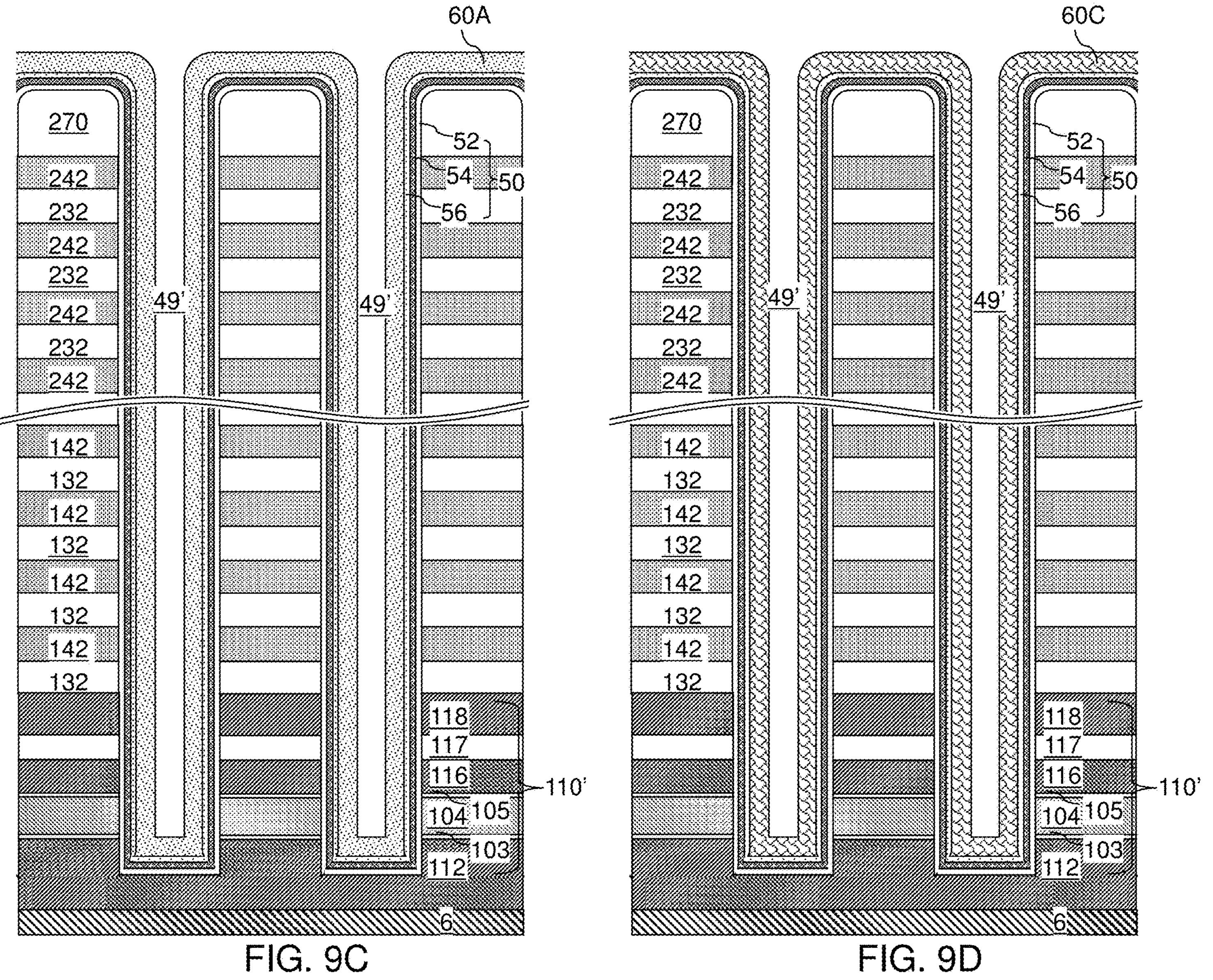
Figures 9E, 9F:
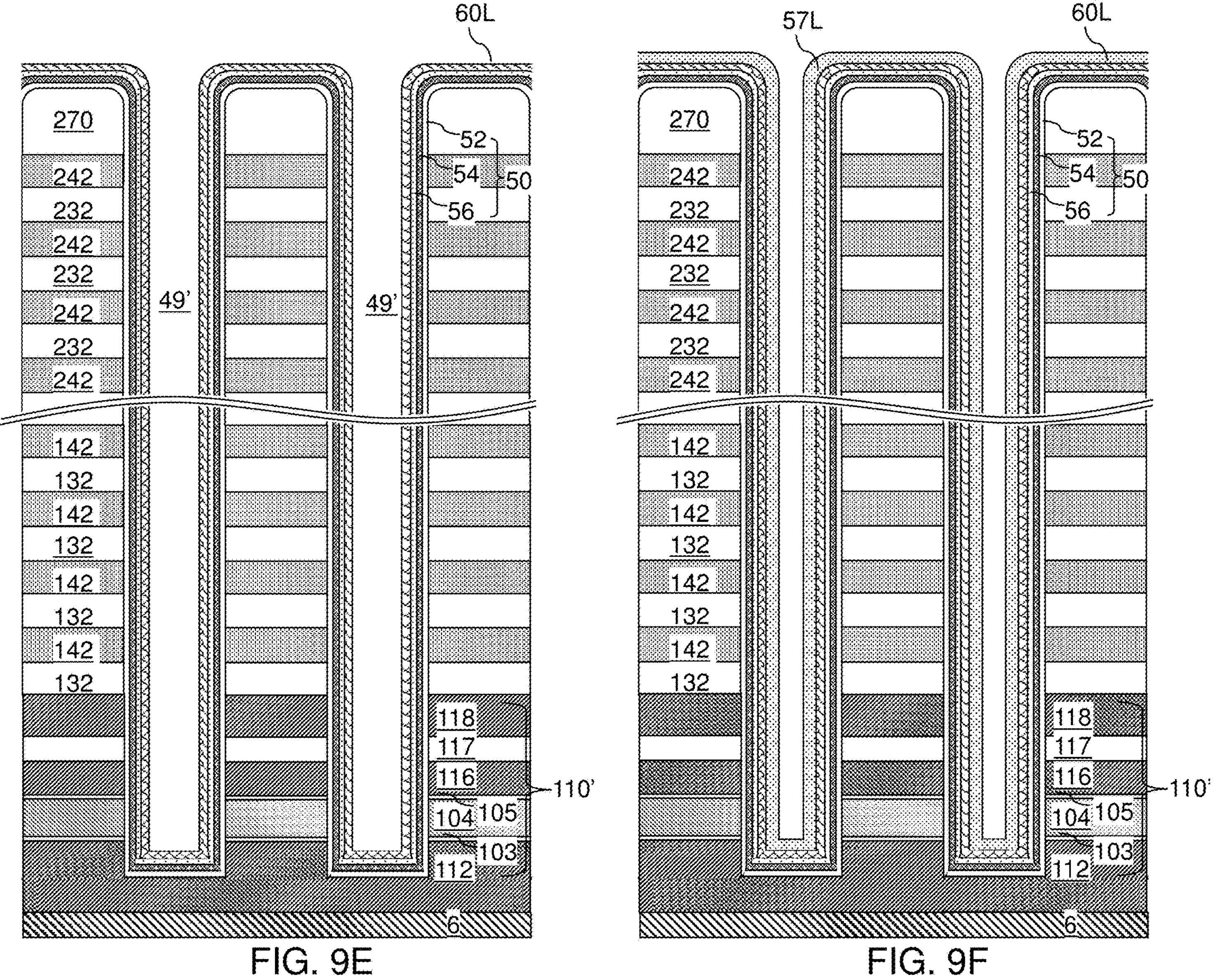
Figures 9G, 9H:
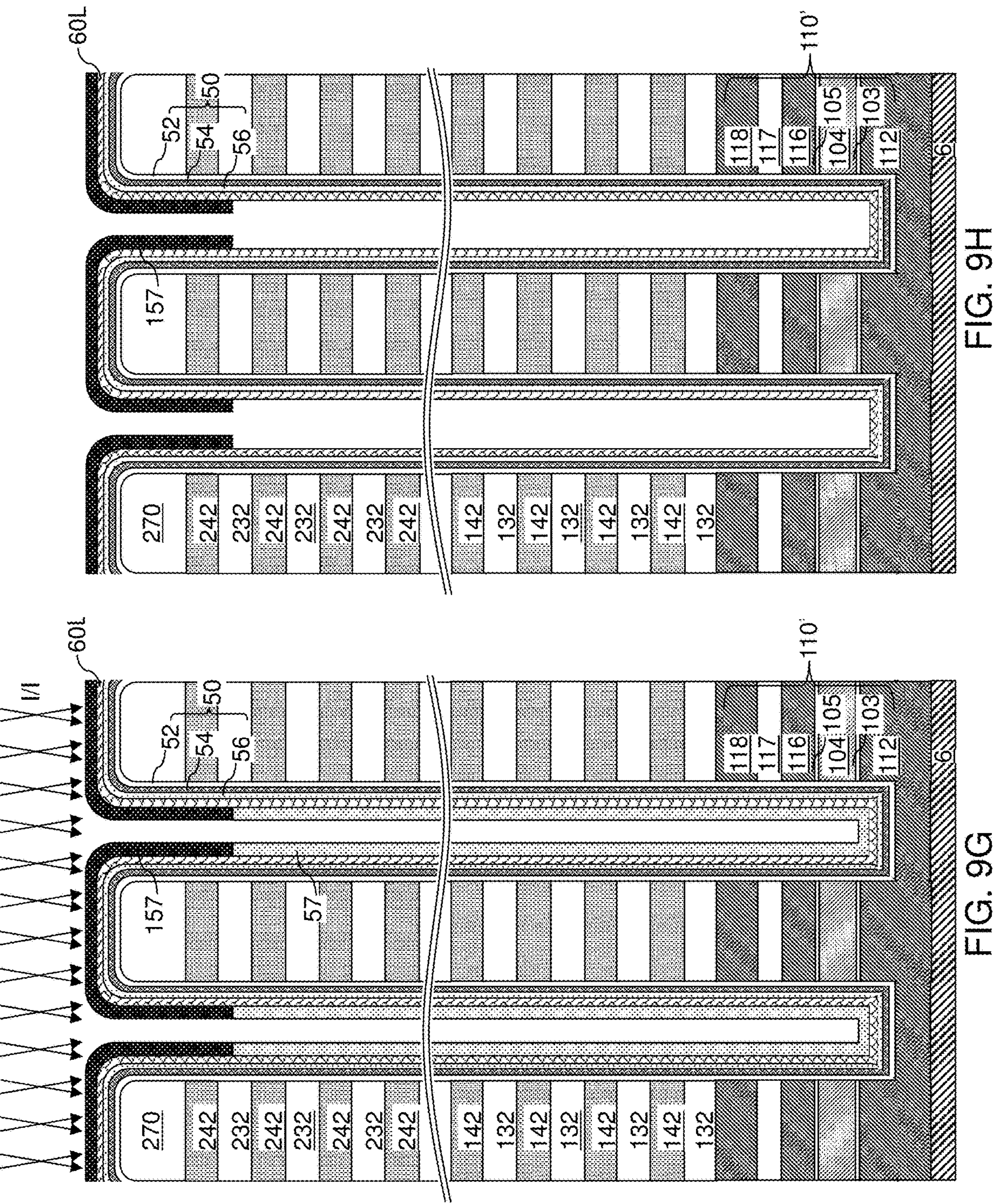
Figures 9I, 9J:
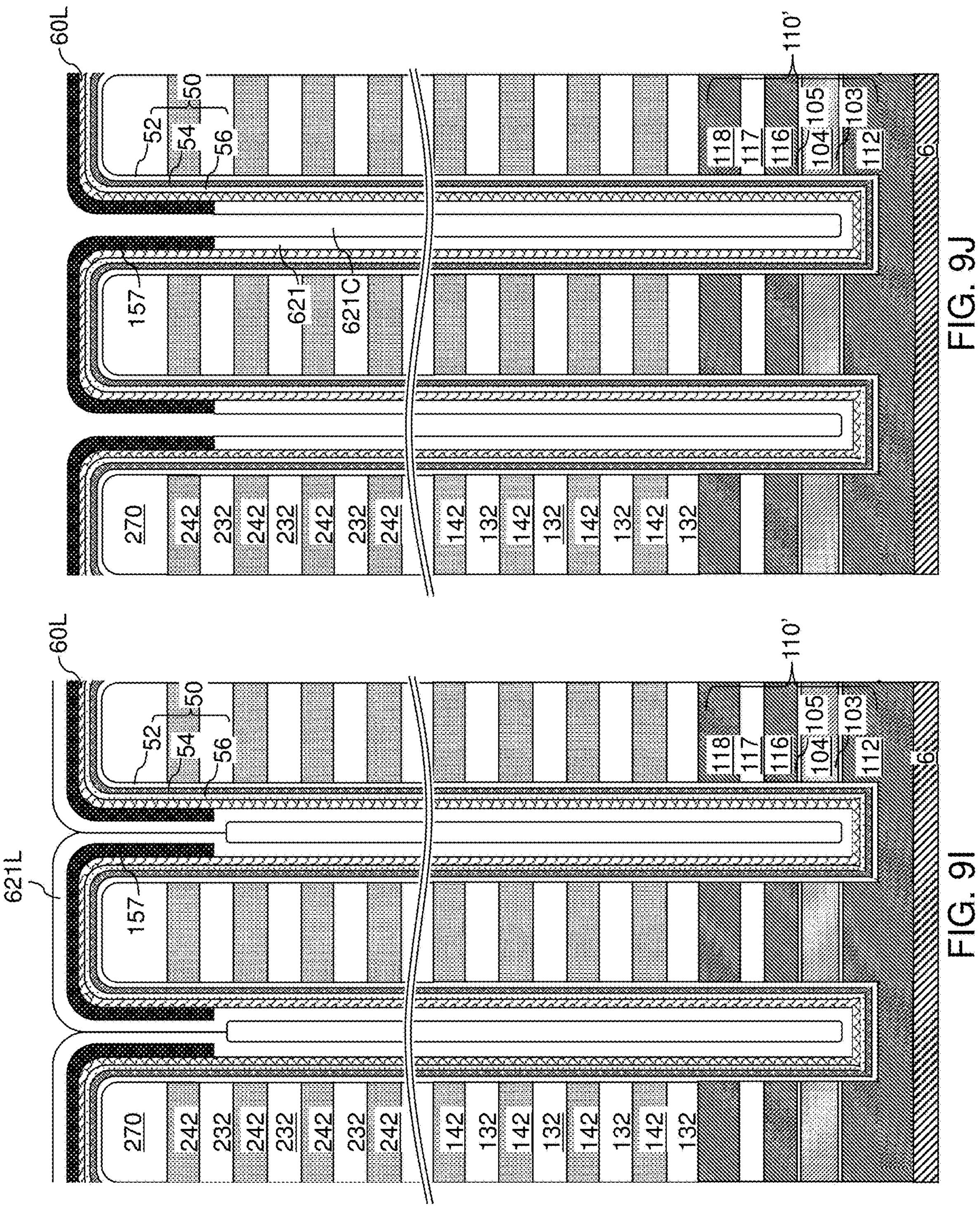
Figures 9K, 9L:
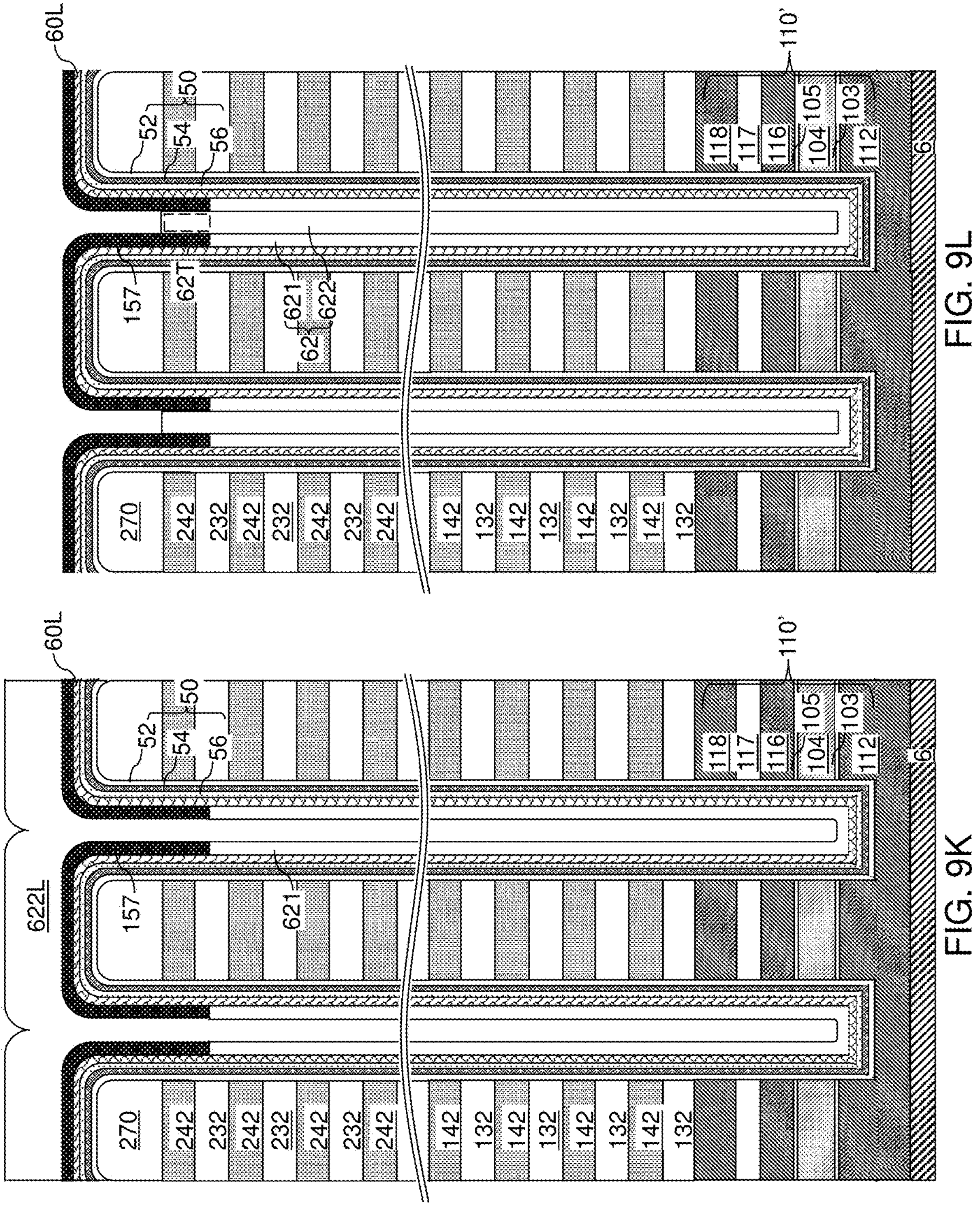
Figures 9M, 9N:
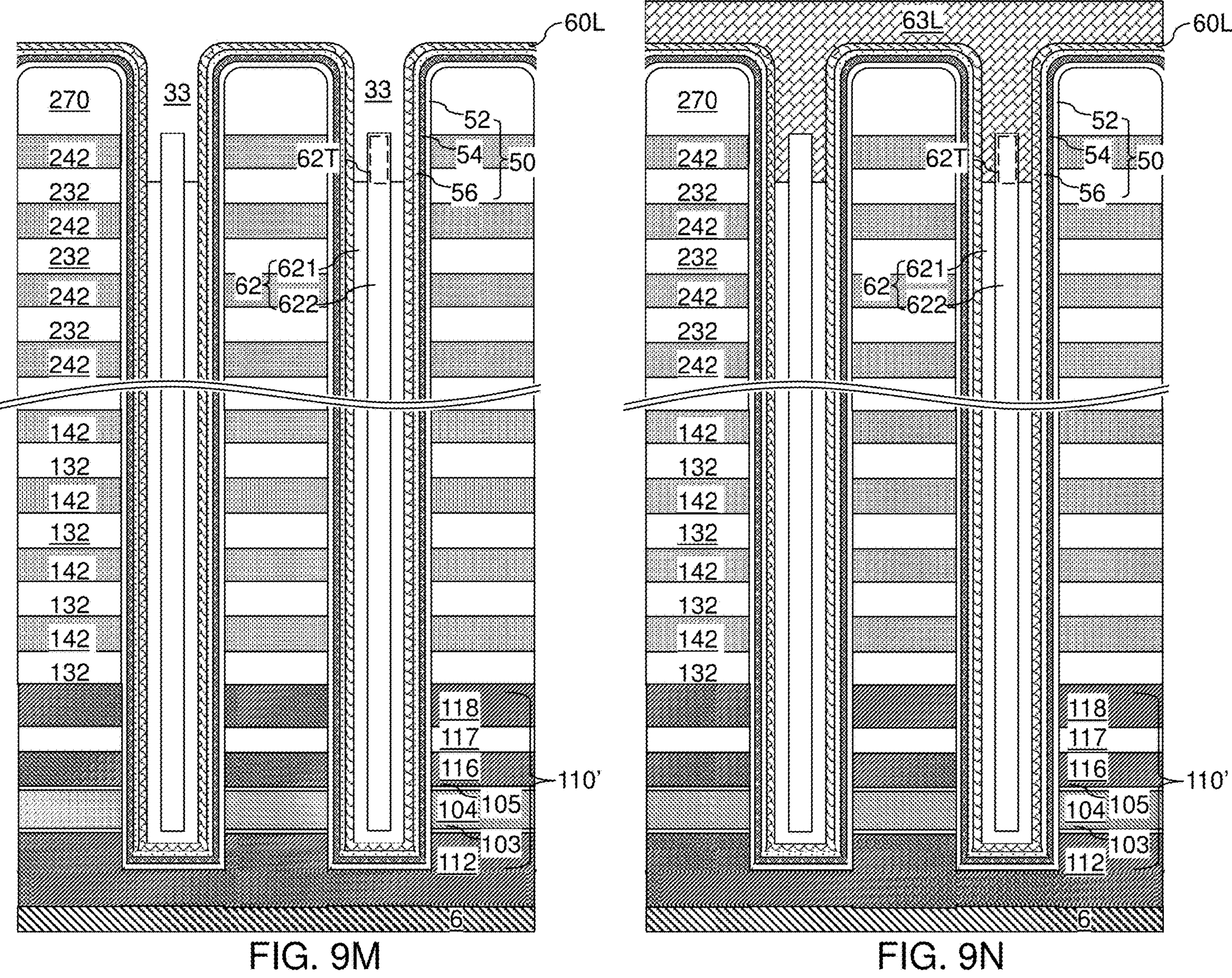
Figures 9O, 9P:
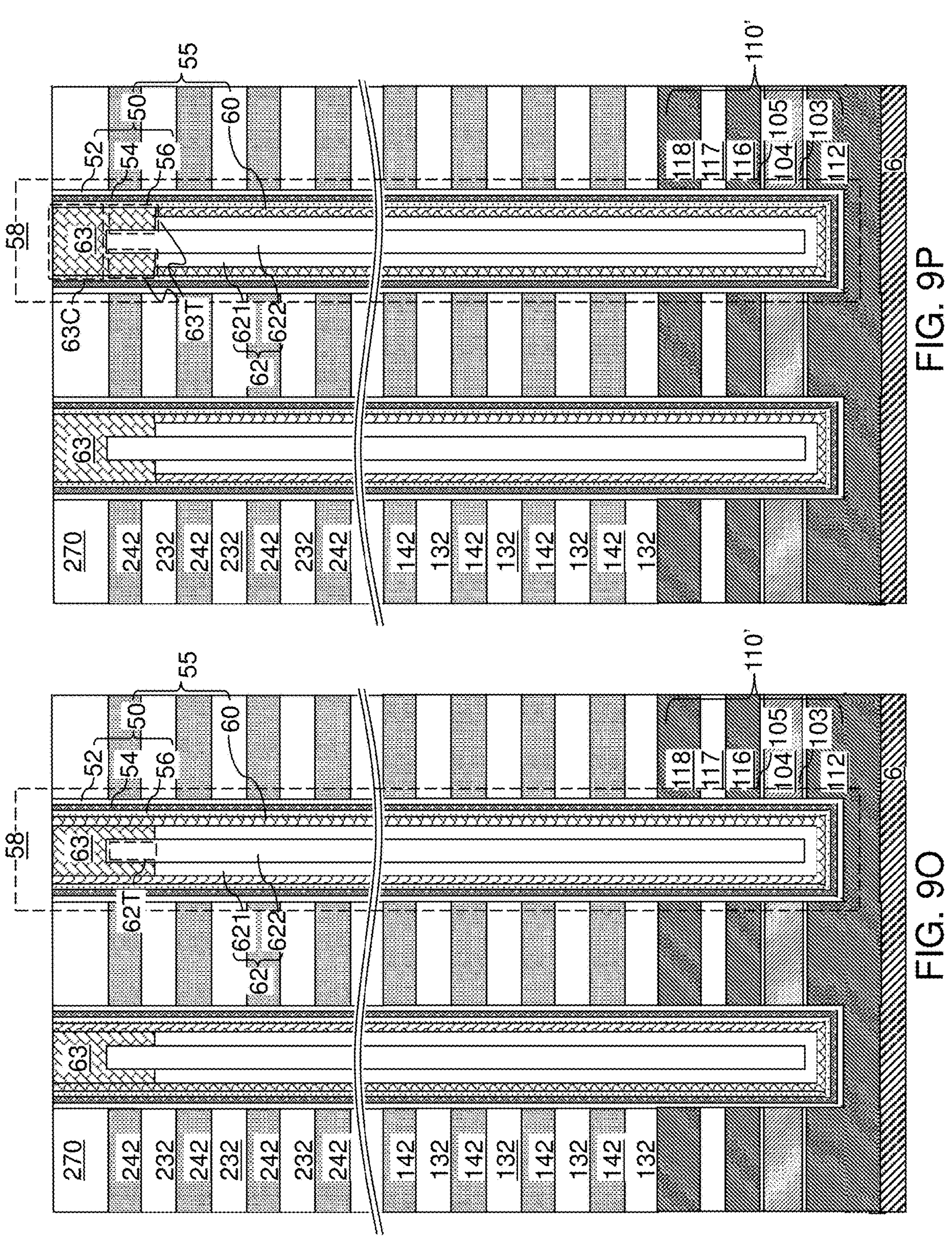

FIGS. 9A-9P are sequential vertical cross-sectional views of a pair of inter-tier memory openings 49 during formation of a pair of memory opening fill structures 58 according to an embodiment of the present disclosure. The same structural change occurs in each memory opening 49, and may occur in each support opening 19.

Referring to FIG. 9A, a pair of memory openings 49 in the exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, and a tunneling dielectric layer 56 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. As used herein, a first surface and a second surface are "vertically coincident" if there exists the second surface that overlies or underlies the first surface and if there exists a vertical plane that intersects both the first surface and the second surface. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

Referring to FIG. 9C, an amorphous semiconductor channel material layer 60A can be conformally deposited over the memory film 50. The amorphous semiconductor channel material layer 60A includes an amorphous semiconductor material, such as at least one amorphous elemental semiconductor material, at least one amorphous III-V compound semiconductor material, at least one amorphous II-VI compound semiconductor material, or other amorphous semiconductor materials known in the art. In one embodiment, the amorphous semiconductor channel material layer 60A includes amorphous silicon. The amorphous semiconductor channel material layer 60A can be formed by a conformal deposition method such as low pressure chemical vapor deposition (LPCVD). The amorphous semiconductor channel material layer 60A may comprise electrical dopants of the first conductivity type, which is the opposite of the second conductivity type. The atomic concentration of the dopants of the first conductivity type in the amorphous semiconductor channel material layer 60A may be in a range from in a range from $1.0\times10^{15}/cm^3$ to $1.0\times10^{18}/cm^3$, such as from $1.0\times10^{16}/cm^3$ to $1.0\times10^{17}/cm^3$, although lesser and greater dopant concentrations can also be employed. The thickness of the amorphous semiconductor channel material layer 60A can be in a range from 10 nm to 100 nm, such as from 20 nm to 60 nm, although lesser and greater thicknesses can also be employed. A cavity 49' is present in the volume of each memory opening 49 that is not filled with the deposited material layers (52, 54, 56, 60A).

Referring to FIG. 9D, an anneal process can be performed to crystallize the amorphous semiconductor material of the amorphous semiconductor channel material layer 60A into a crystalline semiconductor material. The amorphous semiconductor channel material layer 60A can be converted into a crystalline semiconductor channel material layer 60C, which may comprise a polycrystalline doped semiconductor material, such as polysilicon, having a doping of the first conductivity type. Generally, the lateral dimension of each grain within the crystalline semiconductor channel material layer 60C may be on the order of the thickness of the crystalline semiconductor channel material layer 60C. Thus, the greater the thickness of the crystalline semiconductor channel material layer 60C, the greater the average grain size within the crystalline semiconductor channel material layer 60C, and the less the charge carrier scattering at the grain boundaries in the crystalline semiconductor channel material layer 60C during current flow through in semiconductor channels of NAND memory cells to be subsequently formed.

In an alternative embodiment, the deposition of the amorphous semiconductor channel material layer 60A can be omitted, and the channel material can be deposited in a polycrystalline state. For example, the crystalline semiconductor channel material layer 60C can comprise an as-deposited polysilicon layer.

Referring to FIG. 9E, an isotropic recess etch process can be performed to etch back surface portions of the crystalline semiconductor channel material layer 60C. The crystalline semiconductor channel material layer 60C can be thinned to provide a semiconductor channel material layer 60L having a lesser thickness than the crystalline semiconductor channel material layer 60C. In one embodiment, the thickness of the semiconductor channel material layer 60L may be in a range from 2 nm to 20 nm, such as from 4 nm to 10 nm, although lesser and greater thicknesses can also be employed. The dimensions of grains along directions that are perpendicular to most proximal surface segments of the semiconductor channel material layer 60L may be greater than the thickness of the semiconductor channel material layer 60L by a factor in a range from 2 to 20, such as from 3 to 10. The material of the semiconductor channel material layer 60L is herein referred to as a first semiconductor material, and has a doping of the first conductivity type.

Referring to FIG. 9F, a sacrificial cover layer 57L comprising a sacrificial cover material can be conformally over the semiconductor channel material layer 60L. In one embodiment, the sacrificial cover layer 57L comprises a carbon-based material comprising carbon atoms at an atomic concentration of at least 50%. For example, the sacrificial cover layer 57L may comprise and/or may consist essentially of amorphous carbon, diamond-like carbon (DLC), boron-doped carbon, phosphorous doped carbon, boron and nitrogen doped carbon, phosphorus and nitrogen doped carbon, or any other carbon-based material that is undoped or doped with one or more dopants. The atomic concentration of the carbon atoms in the sacrificial cover layer 57L may be greater than 50%, and/or greater than 60%, and/or greater than 70%, and/or greater than 80%, and/or greater than 90%, such as 50% to 100%. Alternatively, the sacrificial cover layer 57 may comprise a bilayer of boron nitride and carbon sublayers. The boron nitride sublayer may be 1 to 5 nm thick, and the carbon sublayer may be 5 to 15 nm thick. Alternatively, the sacrificial cover layer 57 may comprise organosilicate glass comprising Si, C, O, and H atoms. In this case, the atomic percentage of carbon atoms may be in a range from 20% to 40%. The sacrificial cover layer 57L may be deposited by a conformal deposition process, such as a chemical vapor deposition process. The thickness of the sacrificial cover layer 57L, as measured over a planar top surface of the second insulating cap layer 270, may be in a range from 4 nm to 60 nm, such as from 6 nm to 40 nm, although lesser and greater thicknesses may also be employed.

Referring to FIG. 9G, an angled ion implantation process can be performed to implant dopant atoms into portions of the sacrificial cover layer 57L that overlie the horizontal plane including the topmost surface of the second insulating cap layer 270 and into portions of the sacrificial cover layer 57L that are proximal to the second insulating cap layer 270. The dopant atoms are implanted into a top portion of the sacrificial cover layer 57L, and are not implanted into bottom portions of the sacrificial cover layer 57L. The implanted top portion of the sacrificial cover layer 57L can be converted into a doped carbon-based material that provides a higher etch resistance to an isotropic etchant than unimplanted portions of the sacrificial cover layer 57L. Thus, the implanted top portion of the sacrificial cover layer 57L can be converted into an etch mask material portion 157 without changing the material composition of a lower portion of the sacrificial cover layer 57L.

Generally, the top portion of the sacrificial cover layer 57L can be converted into the etch mask material portion 157 by implantation of dopant atoms. The dopant atoms may be selected from transition metals, aluminum, nitrogen, oxygen, fluorine, argon, sulfur, or chlorine. In one embodiment, the dopant atoms may comprise nitrogen atoms. The atomic percentage of the implanted dopant atoms in the etch mask material portion 157 may be in a range from 3% to 40%, such as from 6% to 20%. The unimplanted lower portion of the sacrificial cover layer 57L is herein referred to as an unimplanted sacrificial cover layer 57.

In one embodiment, the tilt angle of the angled ion implantation process may be selected such that the interface between the etch mask material portion 157 and the unimplanted sacrificial cover layer 57 is formed below at least the topmost sacrificial material layer 242. For example, the interface may be located between the horizontal plane including the top surface of the topmost second insulating layer 232 and the horizontal plane including the bottom surface of the topmost second insulating layer 232. Thus, the interface between the etch mask material portion 157 and the unimplanted sacrificial cover layer 57 may be formed below the horizontal plane including the bottom surface of the second insulating cap layer 270. In an illustrative example, the tilt angle of the direction of the implanted ions during the angled ion implantation process (as measured relative to the vertical direction) may be in a range from 3 degree to 45 degrees, such as from 6 degrees to 15 degrees, although lesser and greater tilt angles may also be employed.

Referring to FIG. 9H, a selective material removal process can be performed to remove the material of the unimplanted sacrificial cover layer 57 selective to the material of the etch mask material portion 157. The selective material removal process may comprise, for example, a wet etch process. In this case, the chemistry of the wet etch process can be selected based on the combination of the materials of the unimplanted sacrificial cover layer 57 and the etch mask material portion 157 such that the implanted atoms in the etch mask material portion 157 reduce or prevent etching of the etch mask material portion 157 relative to the unimplanted sacrificial cover layer 57. Generally, the chemistry of the selective material removal process may be employed such that the implanted ions in the etch mask material portion 157 increase the etch resistance of the material in the etch mask material portion 157 relative to the material of the unimplanted sacrificial cover layer 57 at least by a factor of 2, and preferably by a factor of 5 or more, and more preferably by a factor of 10 or more. In an illustrative example, the unimplanted sacrificial cover layer 57 may comprise amorphous carbon, the etch mask material portion 157 may comprise nitrogen-doped carbon, and the wet etch process may comprise any wet etch chemistry that etches undoped carbon selective to nitrogen-doped carbon. Generally, the lower unimplanted portions of the sacrificial cover layer 57L are removed selective to the etch mask material portion 157 and the semiconductor channel material layer 60L.

Referring to FIG. 9I, a dielectric material liner 621L comprising a first dielectric material can be conformally deposited over an inner sidewall of the semiconductor channel material layer 60L and an inner sidewall of the etch mask material portion 157. The first dielectric material may comprise, for example, undoped silicate glass, a doped silicate glass, and/or a dielectric metal oxide. In one embodiment, the dielectric material liner 621L may be deposited by a chemical vapor deposition process or an atomic layer deposition process. The thickness of the dielectric material liner 621L may be in a range from 50% to 200%, such as from 80% to 150%, of the thickness of the etch mask material portion 157.

Referring to FIG. 9J, an anisotropic etch process may be performed to remove portions of the dielectric material liner 621L that overlie the etch mask material portion 157. For example, portions of the dielectric material liner 621L may be removed from above the horizontal plane including a bottom surface of the etch mask material portion 157. Each remaining portion of the first dielectric material of the dielectric material liner 621L located within a respective one of the memory openings 49 constitutes a peripheral dielectric core portion 621. Each peripheral dielectric core portion 621 may comprise a hollow tubular portion vertically extending through each layer of the alternating stack {(132, 142), (232, 242)} other than the topmost second sacrificial material layer 242. Each peripheral dielectric core portion 621 may surround a cavity 621C. In one embodiment, the topmost surface of each peripheral dielectric core portion 621 may contact a respective annular bottom surface of the etch mask material portion 157 between the horizontal plane including the top surface of the topmost second insulating layer 232 and the horizontal plane including the bottom surface of the topmost second insulating layer 232.

Referring to FIG. 9K, a second dielectric material can be conformally deposited within each cavity 621C laterally surrounded by a respective peripheral dielectric core portion 621 and by a vertically-extending portion of the etch mask material portion 157. The second dielectric material may be the same as or may be different from the first dielectric material. A dielectric fill material layer 622L can be formed over the horizontally-extending portion of the etch mask material portion 157. The second dielectric material may comprise undoped silicate glass, a doped silicate glass, and/or a dielectric metal oxide material. In one embodiment, the second dielectric material may be a silicon oxide material such as undoped silicate glass or a doped silicate glass. Optionally, a reflow process may be performed to enhance the gap fill properties of the second dielectric material.

Referring to FIG. 9L, a recess etch process may be performed to vertically recess the second dielectric material of the dielectric fill material layer 622L. The recess etch process may comprise a wet etch process or a dry etch process. The duration of the recess etch process may be selected such that each remaining portion of the second dielectric material is located entirely within the volume of a respective memory opening 49. Each remaining portion of the second dielectric material is herein referred to as a central dielectric core portion 622. Each contiguous combination of a peripheral dielectric core portion 621 and a central dielectric core portion 622 constitutes a dielectric core 62. In one embodiment, each central dielectric core portion 622 may have a respective top surface located above the horizontal plane including the bottom surfaces of the etch mask material portion 157, and above the horizontal plane including the top surface of the peripheral dielectric core portion 621. Each central dielectric core portion 622 may have a respective top surface located below the horizontal plane including the top surface of the second insulating cap layer 270. In one embodiment, the top surfaces of the central dielectric core portions 622 may be formed at or about the horizontal plane including the top surface of the topmost sacrificial material layer 242.

During the recess etch steps of FIGS. 9J and 9L during which the respective peripheral dielectric core portion 621 and central dielectric core portion 622 are formed, the etch mask material portion 157 protects the upper portion of the semiconductor channel layer 60L. Thus, the upper portion of the semiconductor channel layer 60L is protected from being cut through during the recess etch steps. This also allows the use of a thinner semiconductor channel layer 60L since extra layer 60L thickness is no longer required to avoid complete cut through of the upper portion of the semiconductor channel layer 60L during the etching steps. A thinner semiconductor channel layer improves the cell current and GIDL erase properties of the memory device. Furthermore, the space occupied by the etch mask material portion 157 permits a reduction of the amount of etching central dielectric core portion 622 and improves the uniformity of the heights of the dielectric cores 62 located in different memory openings 49.

According to an aspect of the present disclosure, each dielectric core 62 may comprise a peripheral dielectric core portion 621 comprising a first dielectric material, and a central dielectric core portion 622 comprising a second dielectric material and laterally surrounded by the peripheral dielectric core portion 621. In one embodiment, a top tip portion 62T of the dielectric core 62 comprises a segment of the central dielectric core portion 622 that protrudes above a horizontal plane including a topmost surface of the peripheral dielectric core portion 621. A top surface of each dielectric core 62 can be formed above the horizontal plane including the bottommost surfaces of the etch mask material portion 157. Each dielectric core 62 can be formed within a respective cavity that is laterally surrounded by the semiconductor channel material layer 60L.

Referring to FIG. 9M, a selective etch process can be performed to etch the etch mask material portion 157 selective to the semiconductor channel material layer 60L and the dielectric cores 62. A drain cavity 33 can be formed in each volume underlying the horizontal plane including the topmost surface of the semiconductor channel material layer 60 and overlying a respective dielectric core 62. Each drain cavity 33 overlies a central protrusion of a dielectric core 62, i.e., the top tip portion 62T of the dielectric core 62.

Referring to FIG. 9N, a doped semiconductor material having a doping of the second conductivity type can be deposited in the drain cavities 33 and over the semiconductor channel material layer 60L to form a semiconductor drain material layer 63L. The doped semiconductor material may comprise at least one elemental semiconductor material such as silicon, germanium, or a silicon-germanium alloy, a III-V compound semiconductor material, a II-VI compound semiconductor material, or any other heavily doped semiconductor material. The dopant concentration in the semiconductor drain material layer 63L can be in a range from $5.0\times10^{18}/cm^3$ to $2.0\times10^{21}/cm^3$, although lesser and greater dopant concentrations can also be employed. The doped semiconductor material of the semiconductor drain material layer 63L can be, for example, doped polysilicon or doped amorphous silicon.

Referring to FIG. 9O, portions of the semiconductor drain material layer 63L, the semiconductor channel material layer 60L, the tunneling dielectric layer 56, the charge storage layer 54, and the blocking dielectric layer 52 that overlie the horizontal plane including the top surface of the second insulating cap layer 270 can be removed by a planarization process such as a chemical mechanical planarization (CMP) process. Each remaining portion of the semiconductor drain material layer 63L constitutes a drain region 63. Each remaining portion of the semiconductor channel material layer 60L constitutes a vertical semiconductor channel 60. The tunneling dielectric layer 56 is divided into multiple tunneling dielectric layers 56. The charge storage layer 54 is divided into multiple charge storage layers 54. The blocking dielectric layer 52 is divided into multiple blocking dielectric layer 52. Thus, each memory film 50 is divided into a plurality of memory films 50, each being located within a respective one of the memory openings 49 and the support openings 19.

Each combination of a memory film 50 and a vertical semiconductor channel 60 within a memory opening 49 constitutes a memory stack structure 55. Thus, the memory stack structure 55 is a combination of a vertical semiconductor channel 60, a tunneling dielectric layer 56, a plurality of memory elements comprises portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

Referring to FIG. 9P, an anneal process can be performed to electrically activate the dopants in the vertical semiconductor channels 60 and the drain regions 63. In one embodiment, the elevated temperature and the duration of the anneal process can be performed to induce outdiffusion of electrical dopants of the second conductivity type from the drain regions 63 into proximal upper portions of the vertical semiconductor channels 60. In this case, upper end portions of the vertical semiconductor channels 60 that are proximal to the drain regions 63 may be converted into portions of the drain regions 63. For example, the vertical semiconductor channels 60 may comprise boron doped polysilicon, while the drain regions 63 may comprise phosphorus doped polysilicon. The phosphorus diffuses out of the drain regions 63 into the adjacent upper portions of the vertical semiconductor channels 60. The p-n junctions between the vertical semiconductor channels 60 and the drain regions 63 may shift downward such that the entirety of each p-n junction is formed below the horizontal plane including the top surface of the topmost second sacrificial material layer 242. In one embodiment, the p-n junctions between the vertical semiconductor channels 60 and the drain regions 63 may shift downward such that the entirety of each p-n junction is formed below the horizontal plane including the bottom surface of the topmost second sacrificial material layer 242.

Each drain region 63 overlies and contacts a respective dielectric core 62 and a respective vertical semiconductor channel 60. In one embodiment, each drain region 63 comprises an end cap portion 63C and a hollow tubular portion 63T vertically protruding downward from the end cap portion 63C and laterally surrounding a top tip portion 62T of the dielectric core 62. In one embodiment, the top tip portion 62T of the dielectric core 62 may comprise a planar top surface and a cylindrical sidewall that contact a respective surface segment (63C and 63T, respectively) of the drain region 63.

Figure 10A:
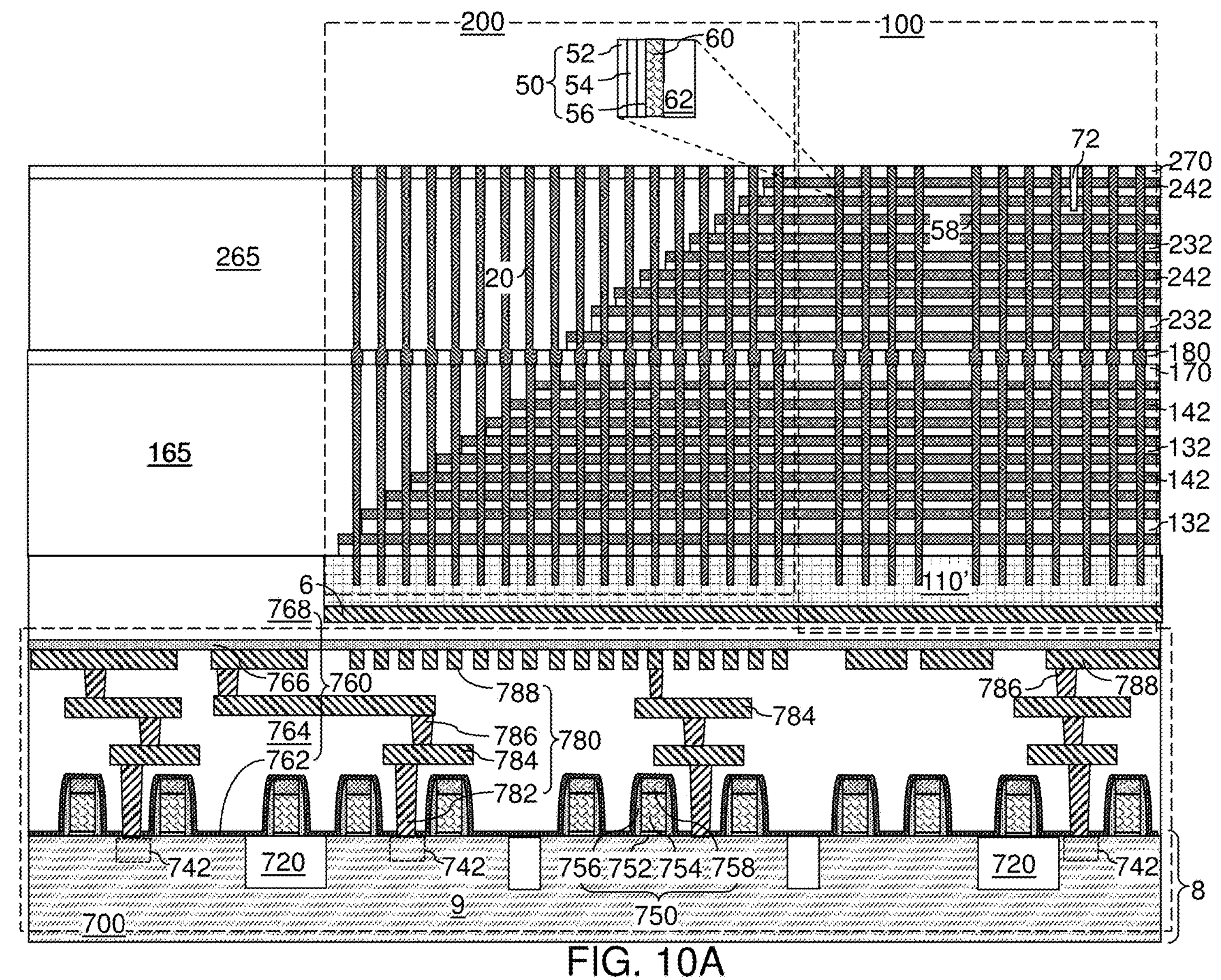
FIG. 10A is a vertical cross-sectional view of the exemplary structure after formation of memory opening fill structures and support pillar structures according to an embodiment of the present disclosure.
Figure 10B:
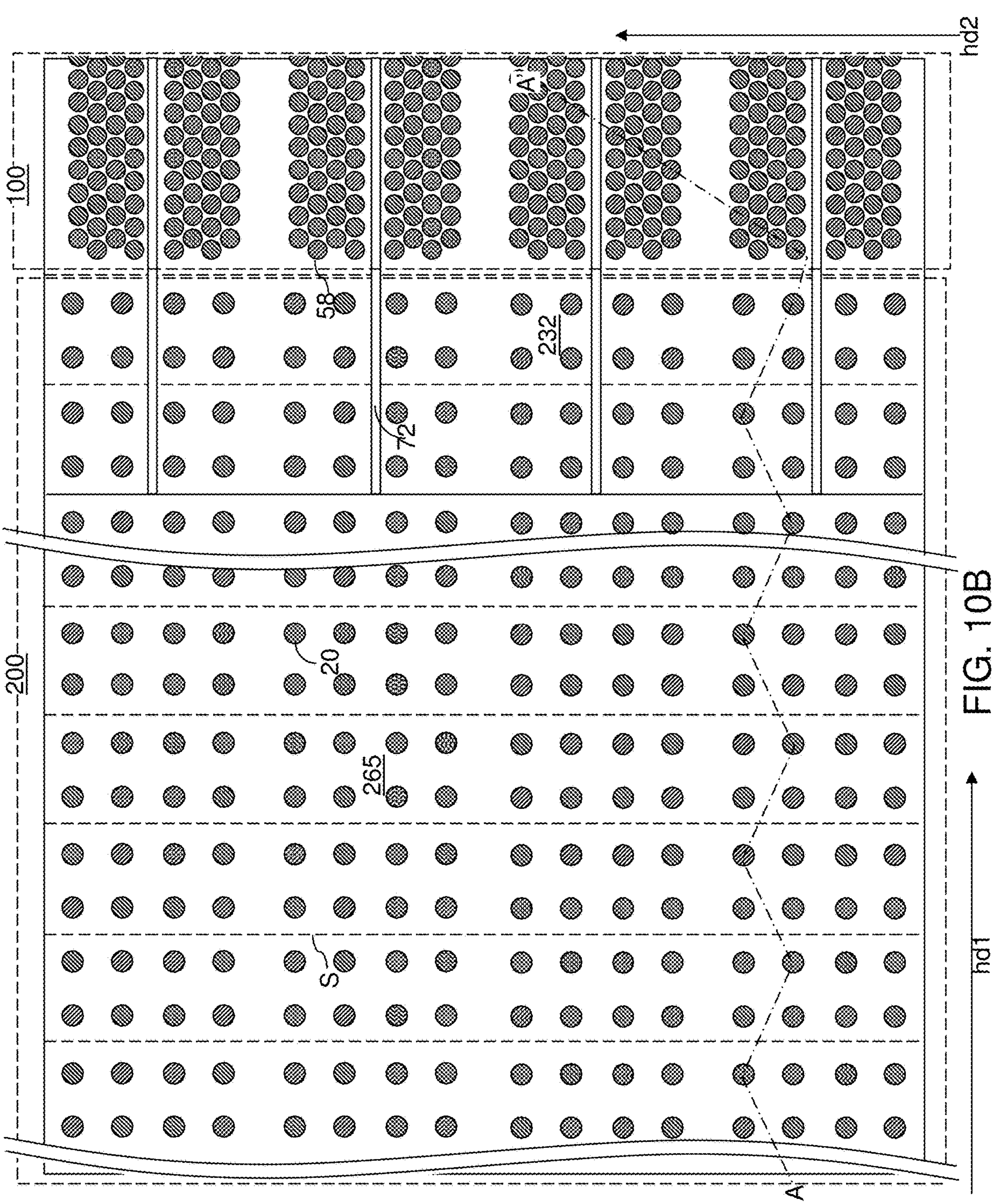
FIG. 10B is a horizontal cross-sectional of the exemplary structure along the horizontal plane B-B' of FIG. 10A. The zig-zag vertical plane A-A' corresponds to the plane of the vertical cross-sectional view of FIG. 10A.

Referring to FIGS. 10A and 10B, the exemplary structure is shown after formation of memory opening fill structures 58 in the memory openings 49 and support pillar structures 20 in the support openings 19. Each of the support openings 19 is filled with a respective support pillar structure 20 concurrently with formation of the memory opening fill structures 58. Each support pillar structure 20 can have the same structural elements as a memory opening fill structure 58. Each support pillar structure 20 is a dummy structure, i.e., an electrically inactive structure, and as such, is not subsequently contacted by any contact via structure.

Figure 11A:
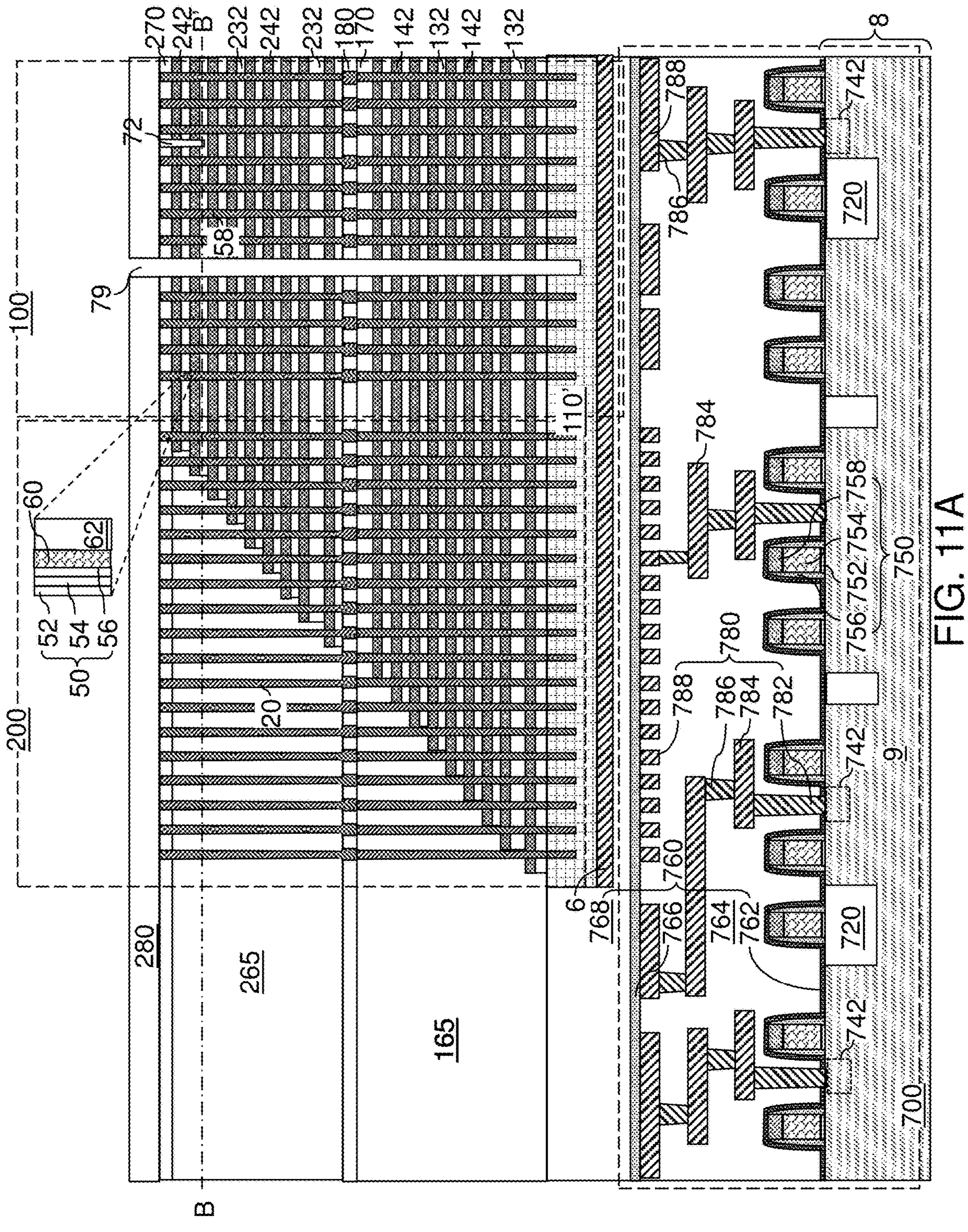
FIG. 11A is a vertical cross-sectional view of the exemplary structure after formation of backside trenches according to an embodiment of the present disclosure.
Figure 11B:
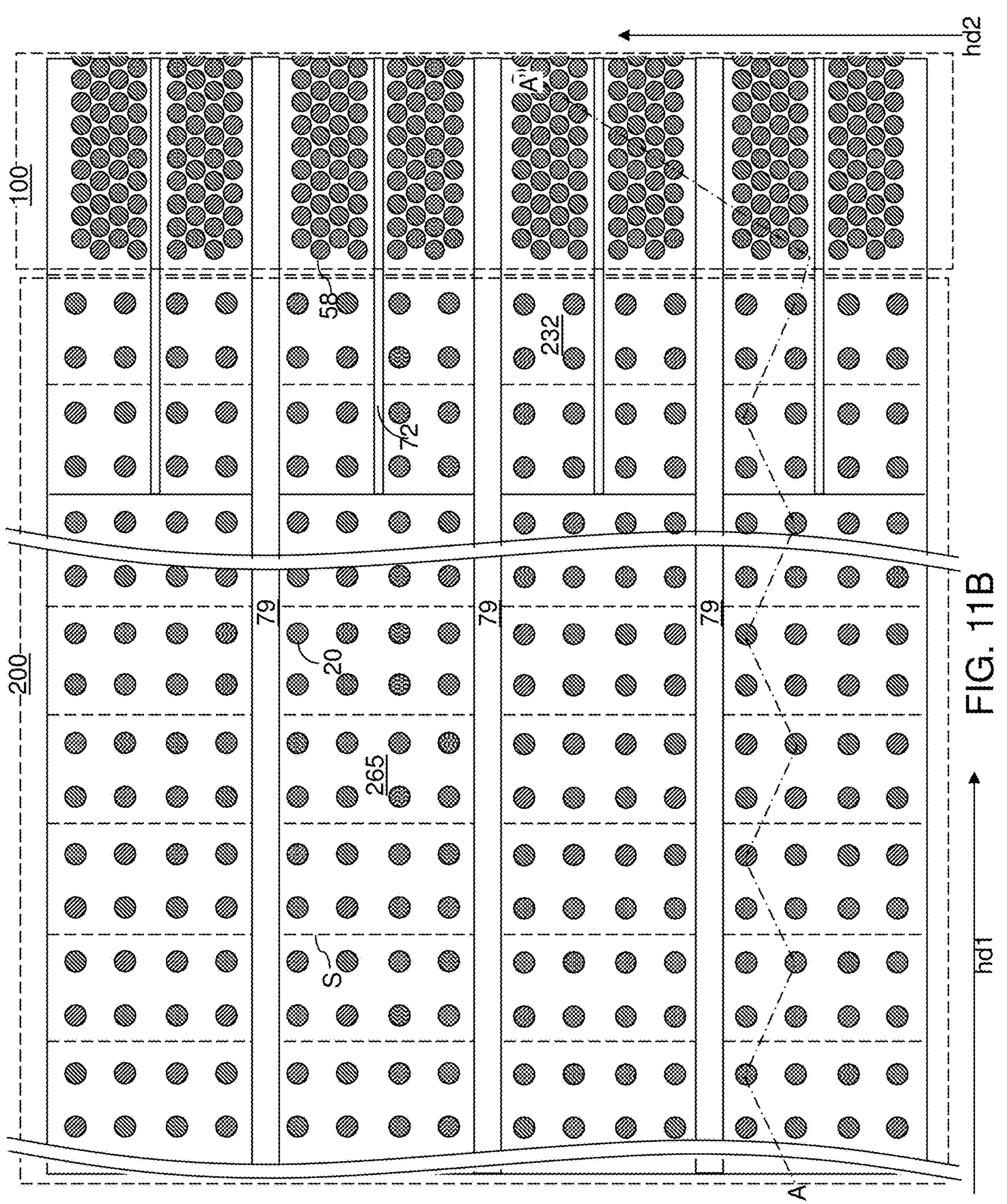
FIG. 11B is a horizontal cross-sectional view of the exemplary structure along the horizontal plane B-B' of FIG. 11A. The zig-zag vertical plane A-A' corresponds to the plane of the vertical cross-sectional view of FIG. 11A.

Referring to FIGS. 11A and 11B, a contact-level dielectric layer 280 can be formed over the second-tier structure (232, 242, 270, 265, 72). The contact-level dielectric layer 280 includes a dielectric material such as silicon oxide, and can be formed by a conformal or non-conformal deposition process. For example, the contact-level dielectric layer 280 can include undoped silicate glass and can have a thickness in a range from 100 nm to 600 nm, although lesser and greater thicknesses can also be employed.

A photoresist layer (not shown) can be applied over the contact-level dielectric layer 280 and can be lithographically patterned to form openings within areas extending across the memory array region 100 and the staircase region 200. The openings in the photoresist layer can laterally extend along the first horizontal direction hd1 between each neighboring cluster of memory opening fill structures 58. Backside trenches 79 can be formed by transferring the pattern in the photoresist layer through the contact-level dielectric layer 280, the second alternating stack (232, 242, 270, 265, 72), the first alternating stack (132, 142, 170, 165), and the in-process source-level material layers 110'. Portions of the contact-level dielectric layer 280, the second alternating stack (232, 242, 270, 265, 72), the first alternating stack (132, 142, 170, 165), and the in-process source-level material layers 110' that underlie the openings in the photoresist layer can be removed to form backside trenches 79. In one embodiment, the backside trenches 79 can be formed between clusters of memory opening fill structures 58. The clusters of the memory opening fill structures 58 can be laterally spaced apart along the second horizontal direction hd2 by the backside trenches 79.

Generally, at least one vertically alternating sequence of continuous insulating layers (132, 232) and continuous spacer material layers (such as the continuous sacrificial material layers (142, 242)) can be divided into alternating stacks {(132, 142), (232, 242)} of insulating layers (132, 232) and spacer material layers (such as sacrificial material layers (142, 242)) by forming backside trenches 79 that laterally extend along a first horizontal direction hd1 and laterally spaced apart along a second horizontal direction hd2. The contact-level dielectric layer 280 is divided into a plurality of contact-level dielectric layers 280 by the backside trenches 79. Each contact-level dielectric layer 280 of the plurality of contact-level dielectric layers 280 overlies a respective alternating stack of insulating layers (132, 232) and spacer material layers (such as sacrificial material layers (142, 242)), and overlies a respective array of memory opening fill structures 58.

Figure 12:
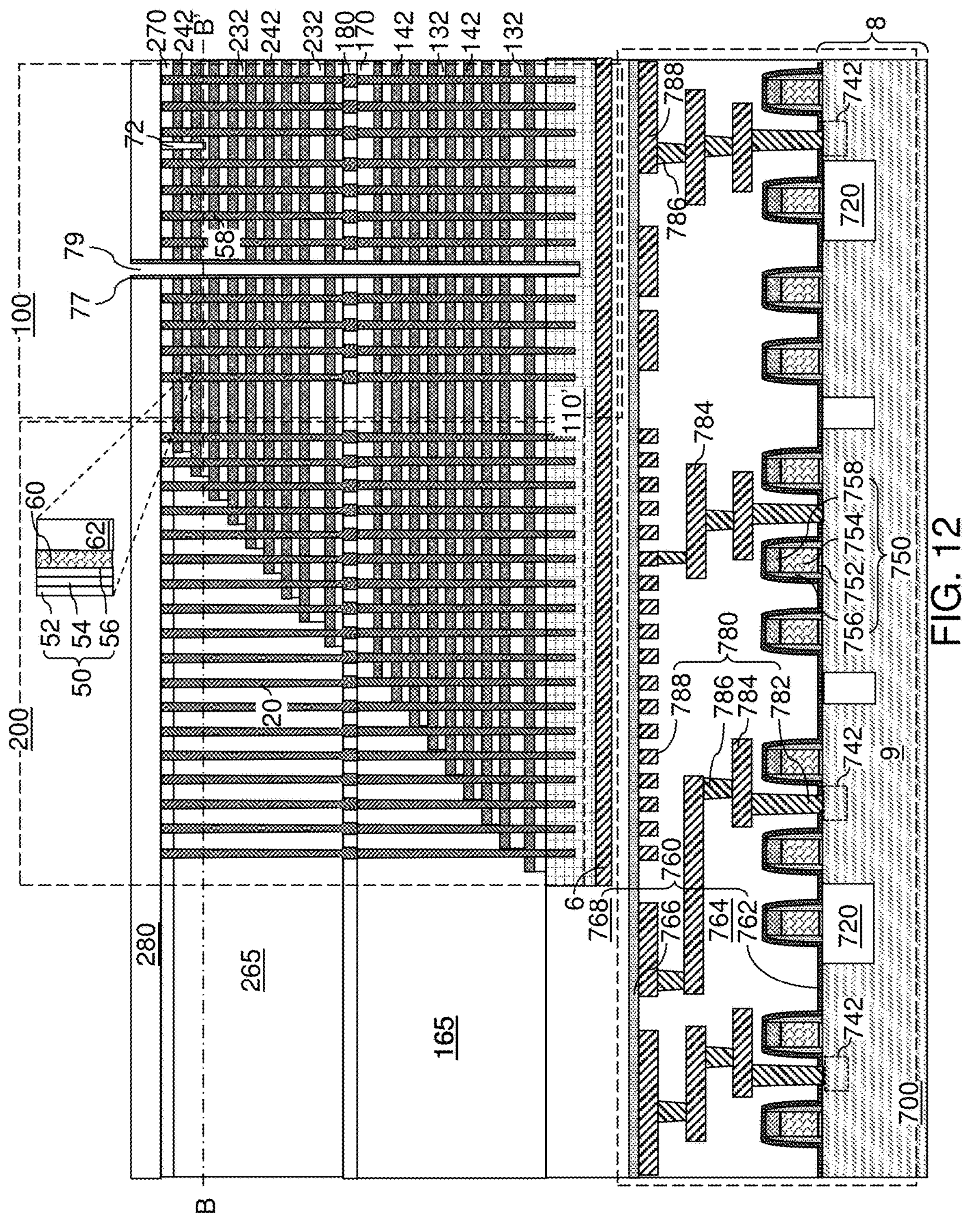
FIG. 12 is a vertical cross-sectional view of the exemplary structure after formation of backside trench spacers in the backside trenches according to an embodiment of the present disclosure.
Figure 13A:
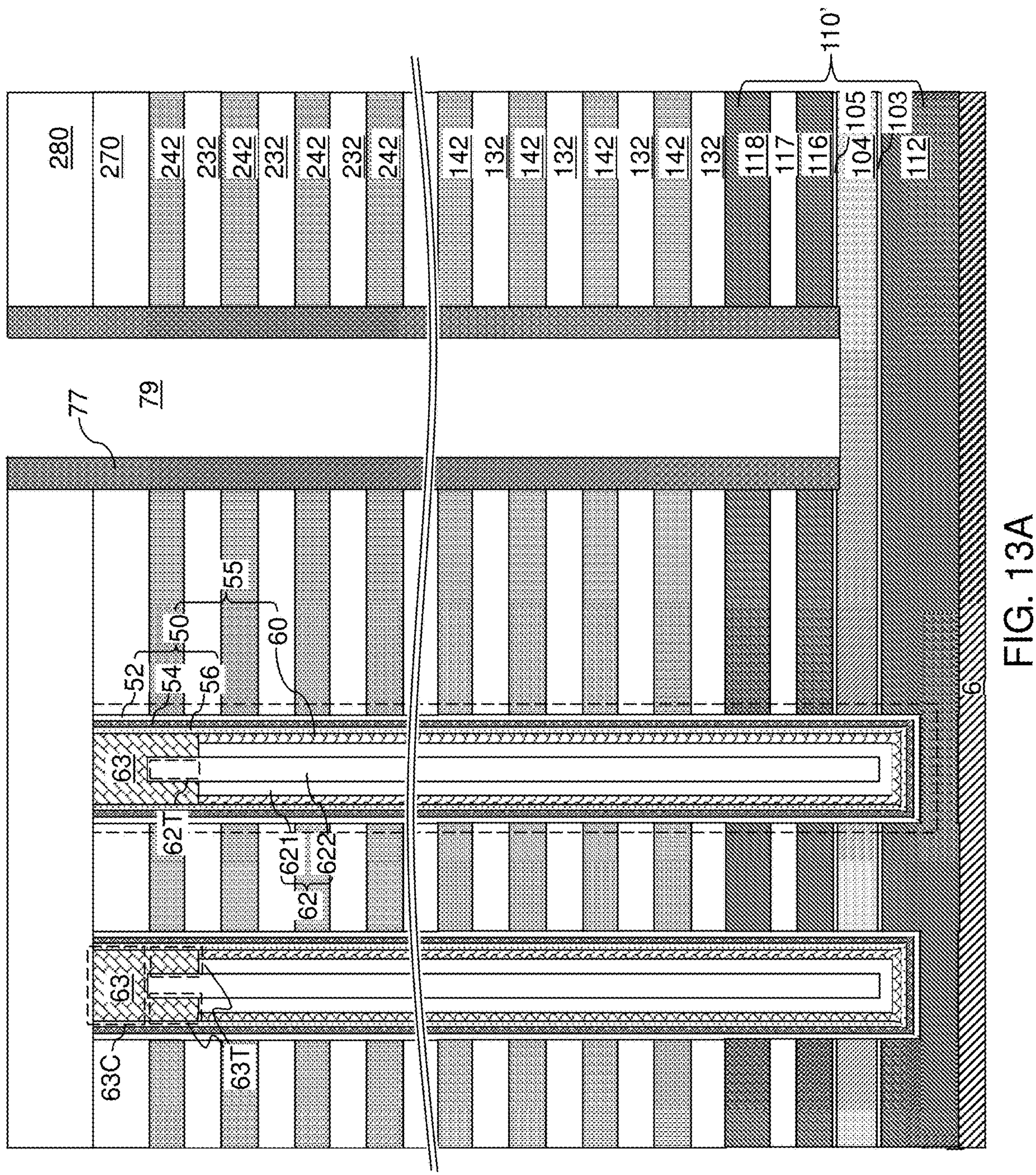
FIGS. 13A-13E illustrate sequential vertical cross-sectional views of a region of the exemplary structure during formation of a source-level material layers according to an embodiment of the present disclosure.

Referring to FIGS. 12 and 13A, a backside trench spacer 77 can be formed on sidewalls of each backside trench 79. For example, a conformal spacer material layer can be deposited in the backside trenches 79 and over the contact-level dielectric layer 280, and can be anisotropically etched to form the backside trench spacers 77. The backside trench spacers 77 include a material that is different from the material of the source-level sacrificial layer 104. For example, the backside trench spacers 77 can include silicon oxide, a dielectric metal oxide, or silicon nitride.

Figure 13B:
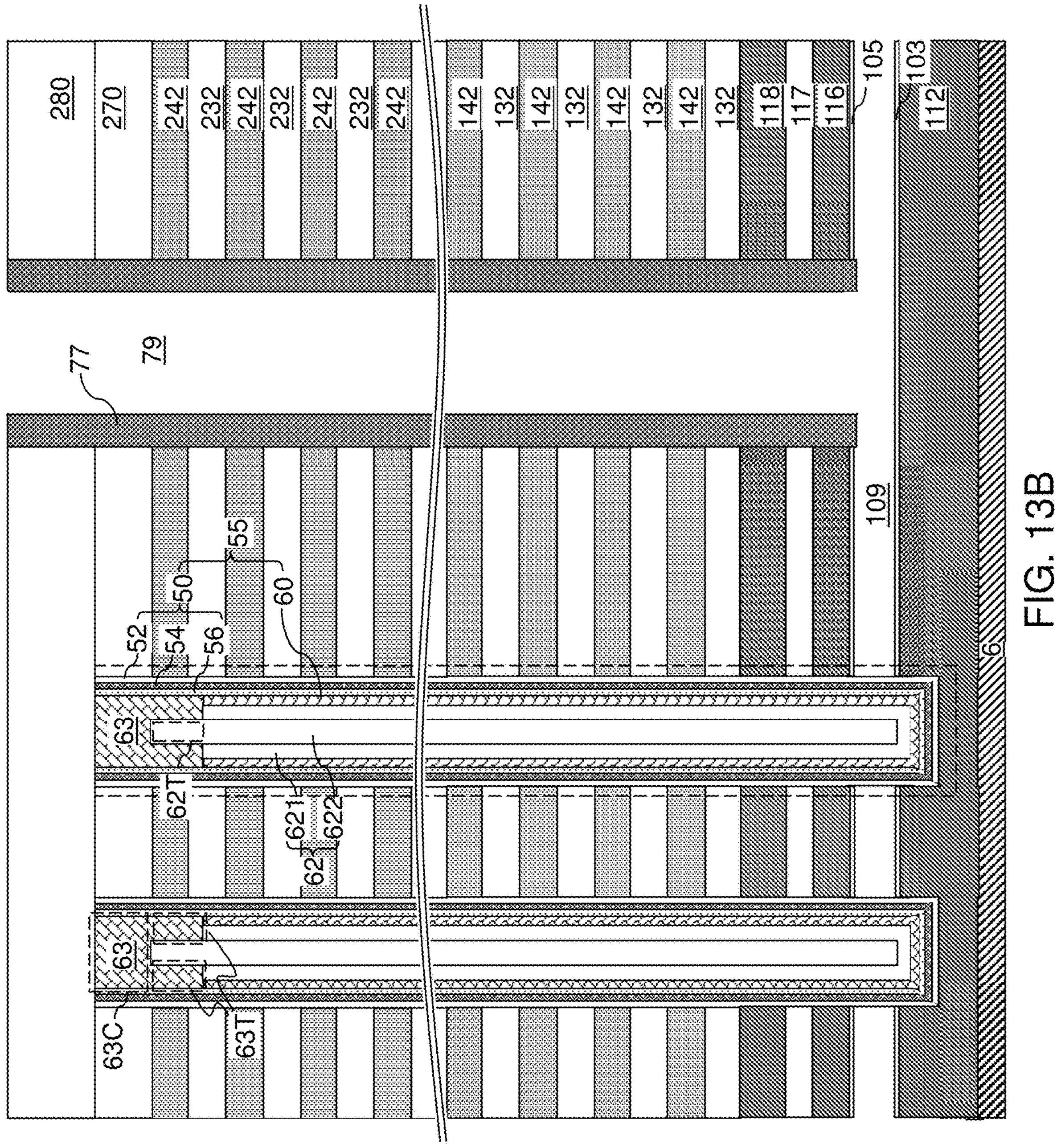

Referring to FIG. 13B, an etchant that etches the material of the source-level sacrificial layer 104 selective to the materials of the first alternating stack (132, 142), the second alternating stack (232, 242), the first and second insulating cap layers (170, 270), the upper sacrificial liner 105, and the lower sacrificial liner layer 103 can be introduced into the backside trenches 79 in an isotropic etch process. For example, if the source-level sacrificial layer 104 includes undoped amorphous silicon or polysilicon, the backside trench spacers 77 include silicon nitride, and the upper and lower sacrificial liner layers (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 77 and the upper and lower sacrificial liner layers (105, 103). Alternatively, if the source-level sacrificial material layer 104 includes silicon nitride, the backside trench spacers 77 include silicon oxide or a dielectric metal oxide, and the upper and lower sacrificial liner layers (105, 103) include silicon oxide, a wet etch process employing hot phosphoric acid can be employed to remove the source-level sacrificial layer 104 selective to the backside trench spacers 77 and the upper and lower sacrificial liner layers (105, 103). A source cavity 109 is formed in the volume from which the source-level sacrificial layer 104 is removed.

Figure 13C:
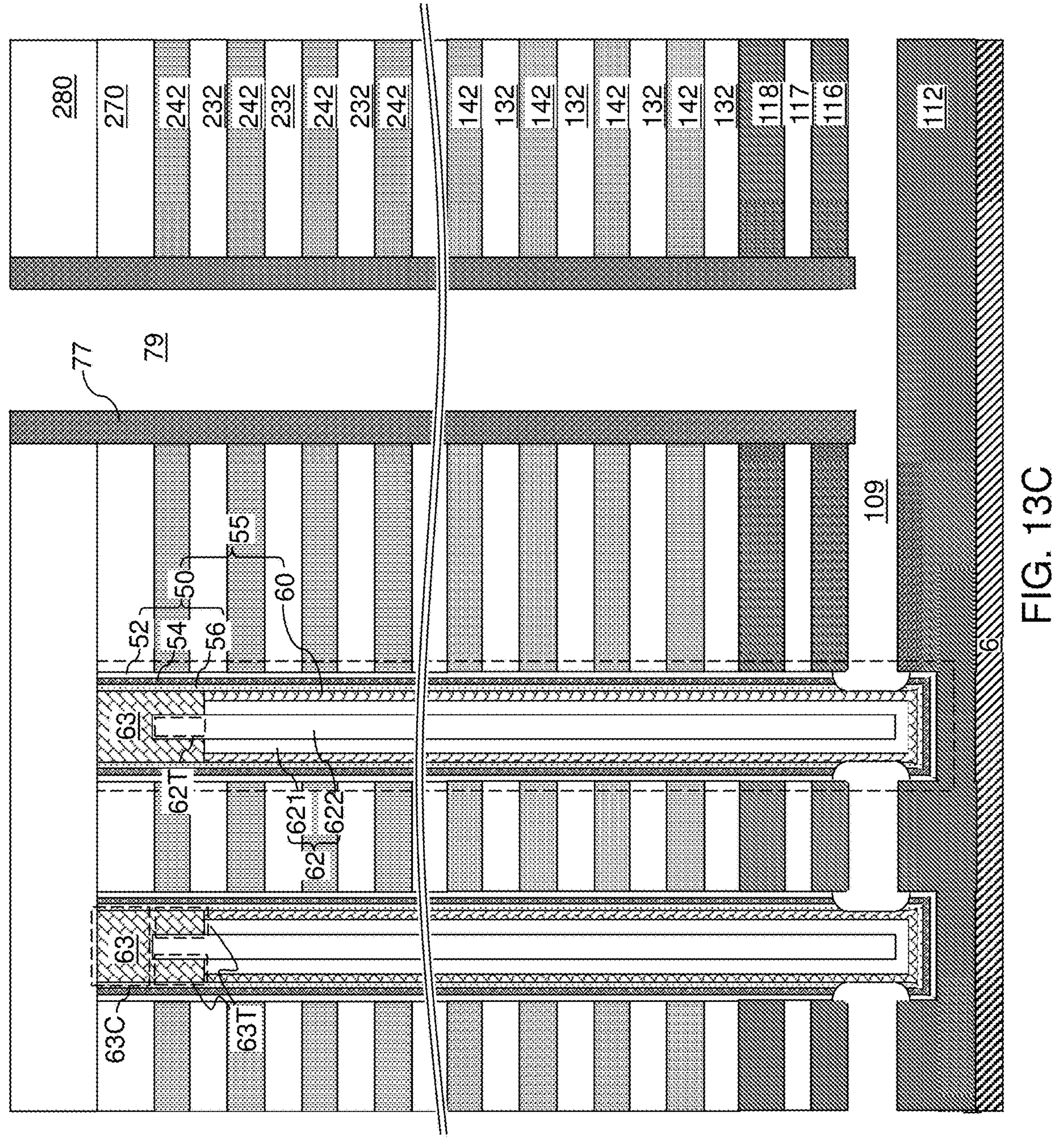

Referring to FIG. 13C, a sequence of isotropic etchants, such as wet etchants, can be applied through the backside trenches 79 and the source cavity 109 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 109. The upper and lower sacrificial liner layers (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liner layers (105, 103). A top surface of the lower source-level material layer 112 and a bottom surface of the upper source-level material layer 116 can be physically exposed to the source cavity 109. An outer sidewall of each vertical semiconductor channel 60 is physically exposed to the source cavity 109 after removing the physically exposed portions of the memory films 50. A dielectric material stack 150 is formed underneath each physically exposed cylindrical surface of the vertical semiconductor channels 60. Each dielectric material stack 150 is a remaining portion of the memory films 50, and includes the same dielectric material stack as the memory films 50.

Thus, the upper source-level material layer 116 can act as an etch stop during the selective etching of the memory film 50 through the source cavity 109 and can prevent lateral expansion of the source cavity 109. This prevents a short circuit between the source-select-level conductive layer 118 and a source contact layer that is subsequently formed in the source cavity 109 during a subsequent step.

Figure 13D:
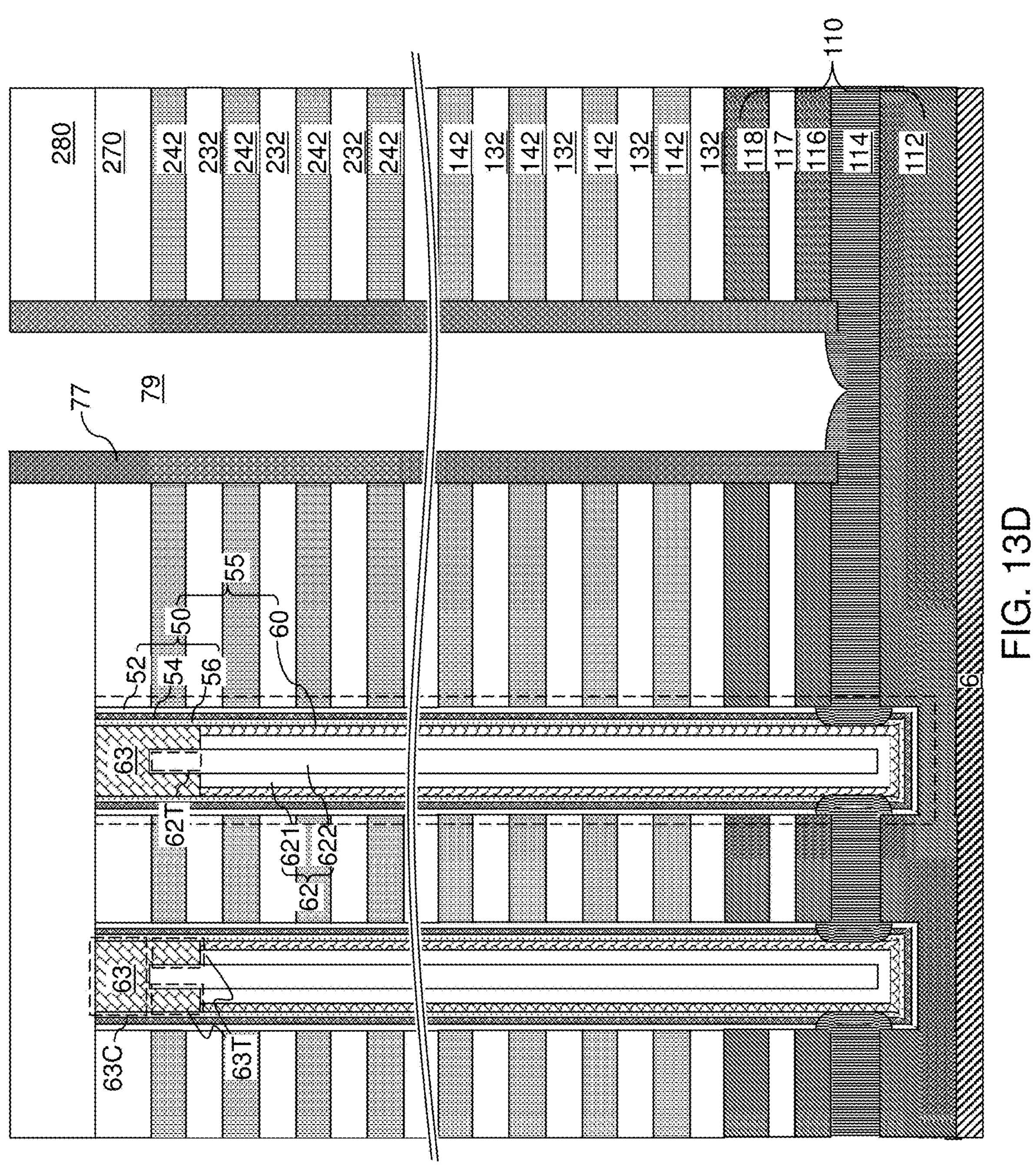

Referring to FIG. 13D, a source contact layer 114 can be formed by a selective deposition process that deposits a doped semiconductor material having a doping of the second conductivity type, which is herein referred to as a third doped semiconductor material. The doped semiconductor material can include amorphous silicon, polysilicon, or a silicon-germanium alloy. The third doped semiconductor material of the source contact layer 114 can grow from physically exposed semiconductor surfaces around the source cavity 109. The average atomic concentration of dopants of the second conductivity type in the source contact layer 114 can be in a range from $5.0\times10^{19}/cm^3$ to $2.0\times10^{21}/cm^3$, although lesser and greater dopant concentrations can also be employed.

The in-process source-level material layers 110' are replaced with source-level material layers 110. The source-level material layers 110 include a layer stack including, from bottom to top, the lower source-level material layer 112, the source contact layer 114, the upper source-level material layer 116, the source-level insulating layer 117, and the optional source-select-level conductive layer 118. The combination of the lower source-level material layer 112, the source contact layer 114, the upper source-level material layer 116 constitutes a source layer (112, 114, 116). Upon replacement of the source-level sacrificial layer 104 with a source contact layer 114, the in-process source-level material layers 110' are converted into source-level material layers 110 including a source layer (112, 114, 116).

Figure 13E:
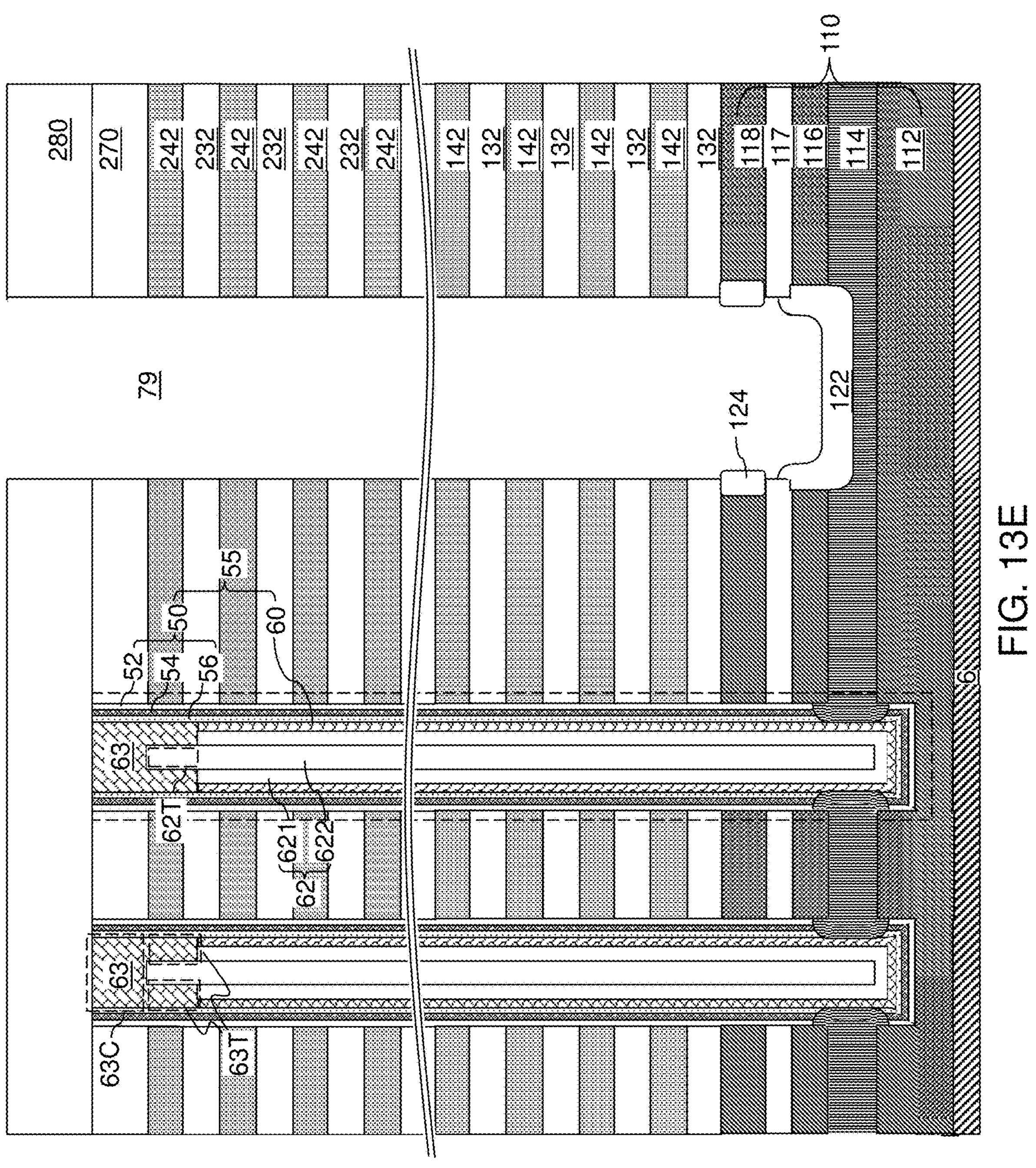
Figure 14:
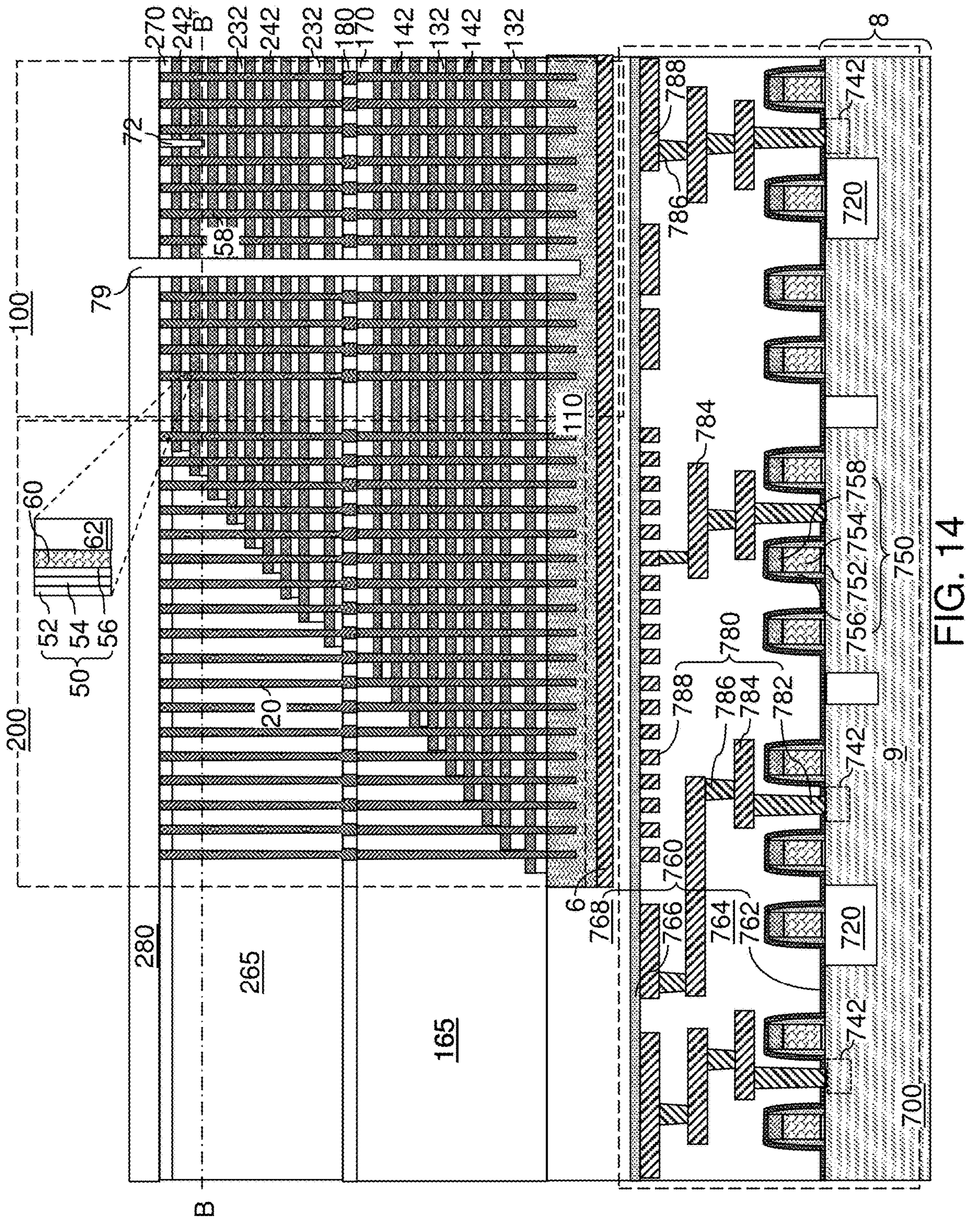
FIG. 14 is a vertical cross-sectional view of the exemplary structure after formation of the source-level material layers according to an embodiment of the present disclosure.

Referring to FIGS. 13E and 14, the backside trench spacers 77 can be removed selective to the semiconductor materials of the source contact layer 114. For example, if the backside trench spacers 77 include silicon nitride, a wet etch process employing hot phosphoric acid can be employed to remove the backside trench spacers 77. If the backside trench spacers 77 include silicon oxide, a wet etch process employing dilute hydrofluoric acid can be employed to remove the backside trench spacers 77. Sidewalls of the first and second alternating stacks (132, 142, 232, 242), the upper source-level material layer 116, the source-level insulating layer 117, and the optional source-select-level conductive layer 118 can be physically exposed after removal of the backside trench spacers 77.

A thermal oxidation process can be performed to convert physically exposed surface portions of various semiconductor materials into semiconductor oxide portions. Specifically, physically exposed surface portions of the source contact layer 114, the upper source-level material layer 116, and the source-select-level conductive layer 118 (if present) are converted into thermal semiconductor oxide material portions. As used herein, a "thermal semiconductor oxide" refers to a material that is formed by thermal oxidation of a semiconductor material. Unlike a semiconductor oxide material formed by chemical vapor deposition, thermal semiconductor oxide materials do not include carbon or hydrogen above a trace level unless the semiconductor material from which the semiconductor oxide material is derived includes carbon prior to a thermal oxidation process.

The thermal oxidation process forms a semiconductor oxide plate 122 at the bottom of each backside trench 79 and semiconductor oxide rails 124 on sidewalls of the source-select-level conductive layer 118. The semiconductor oxide rails 124 are not illustrated in FIG. 14 for clarity. The semiconductor oxide plate 122 includes various thermal semiconductor oxide material portions formed by thermal conversion of surface portions of the source contact layer 114 and the upper source-level material layer 116.

The layer stack including the lower source-level material layer 112, the source contact layer 114, and the upper source-level material layer 116 constitutes a source layer (112, 114, 116), which is a buried source layer that functions as a common source region that is connected each of the vertical semiconductor channels 60 and has a doping of the second conductivity type. The average dopant concentration in the buried source layer (112, 114, 116) can be in a range from $5.0\times10^{19}/cm^3$ to $2.0\times10^{21}/cm^3$, although lesser and greater dopant concentrations can also be employed.

Figure 15:
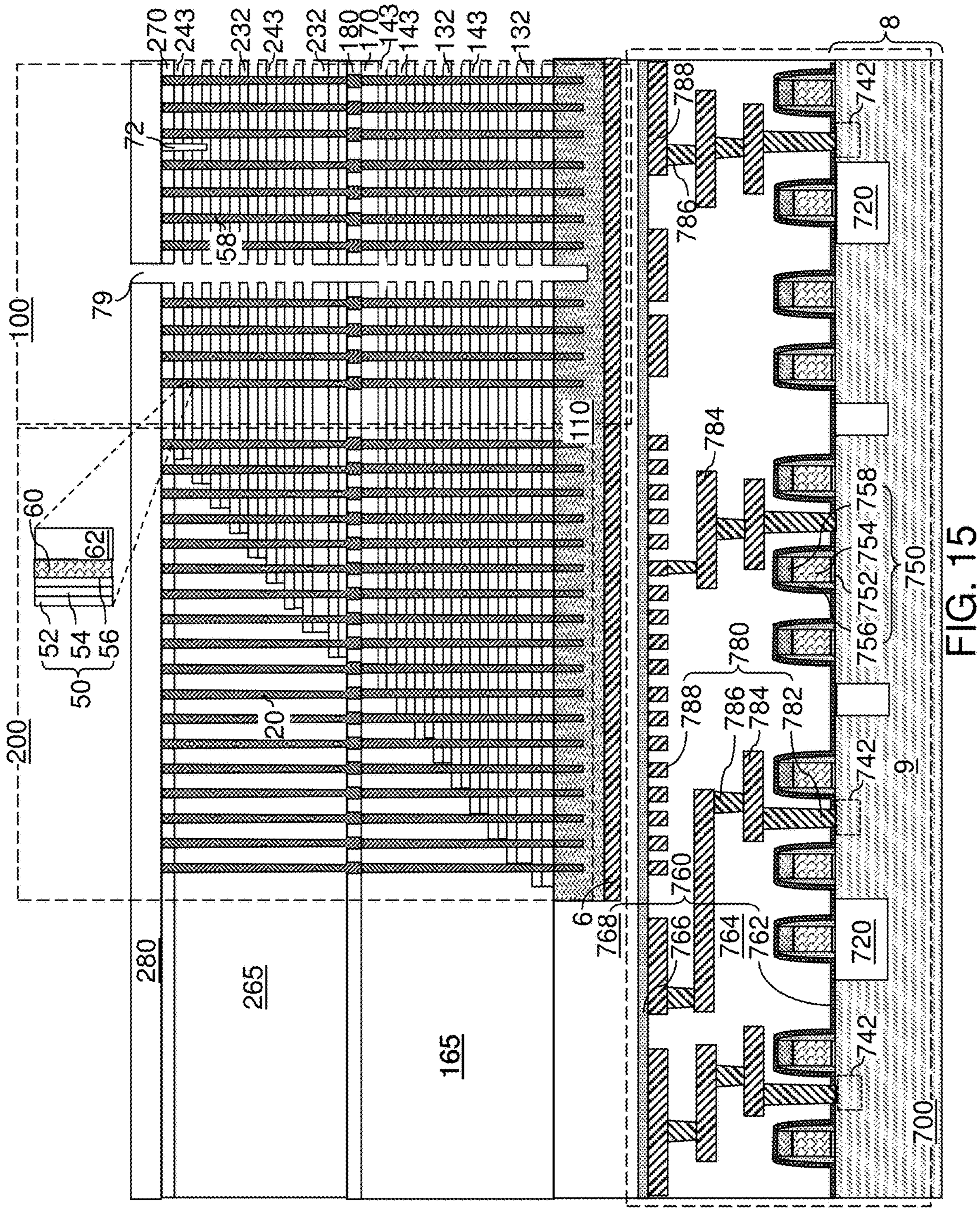
FIG. 15 is a vertical cross-sectional view of the exemplary structure after formation of backside recesses according to an embodiment of the present disclosure.

Referring to FIG. 15, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (170, 270), the first and second retro-stepped dielectric material portions (165, 265), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess (143, 243). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. Each of the first and second backside recesses (143, 243) can extend substantially parallel to the top surface of the substrate 8. A backside recess (143, 243) can be vertically bounded by a top surface of an underlying insulating layer (132 or 232) and a bottom surface of an overlying insulating layer (132 or 232). In one embodiment, each of the first and second backside recesses (243, 243) can have a uniform height throughout.

Figure 16A:
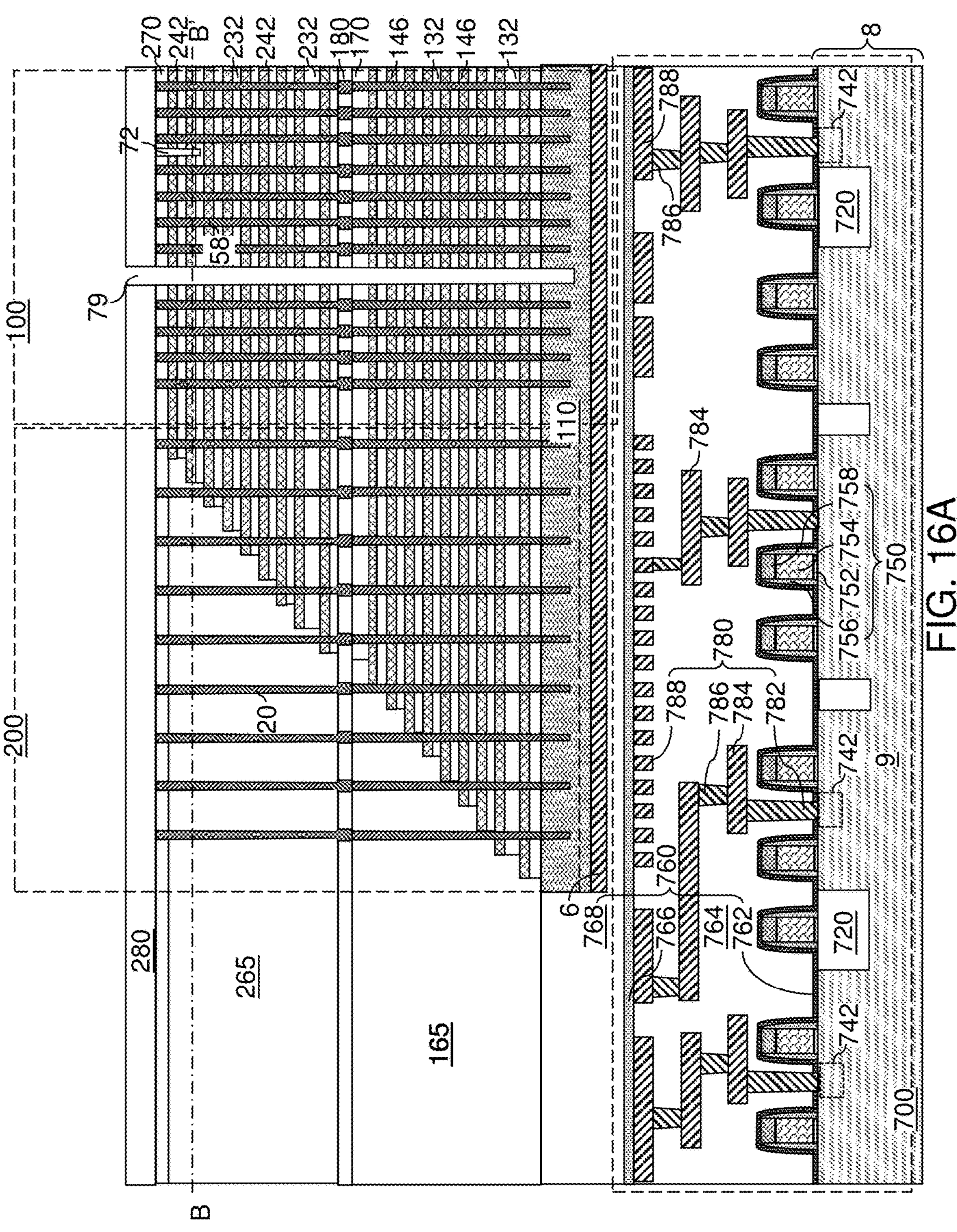
FIG. 16A is a vertical cross-sectional view of the exemplary structure after formation of electrically conductive layers in the backside recesses according to an embodiment of the present disclosure.
Figure 16B:
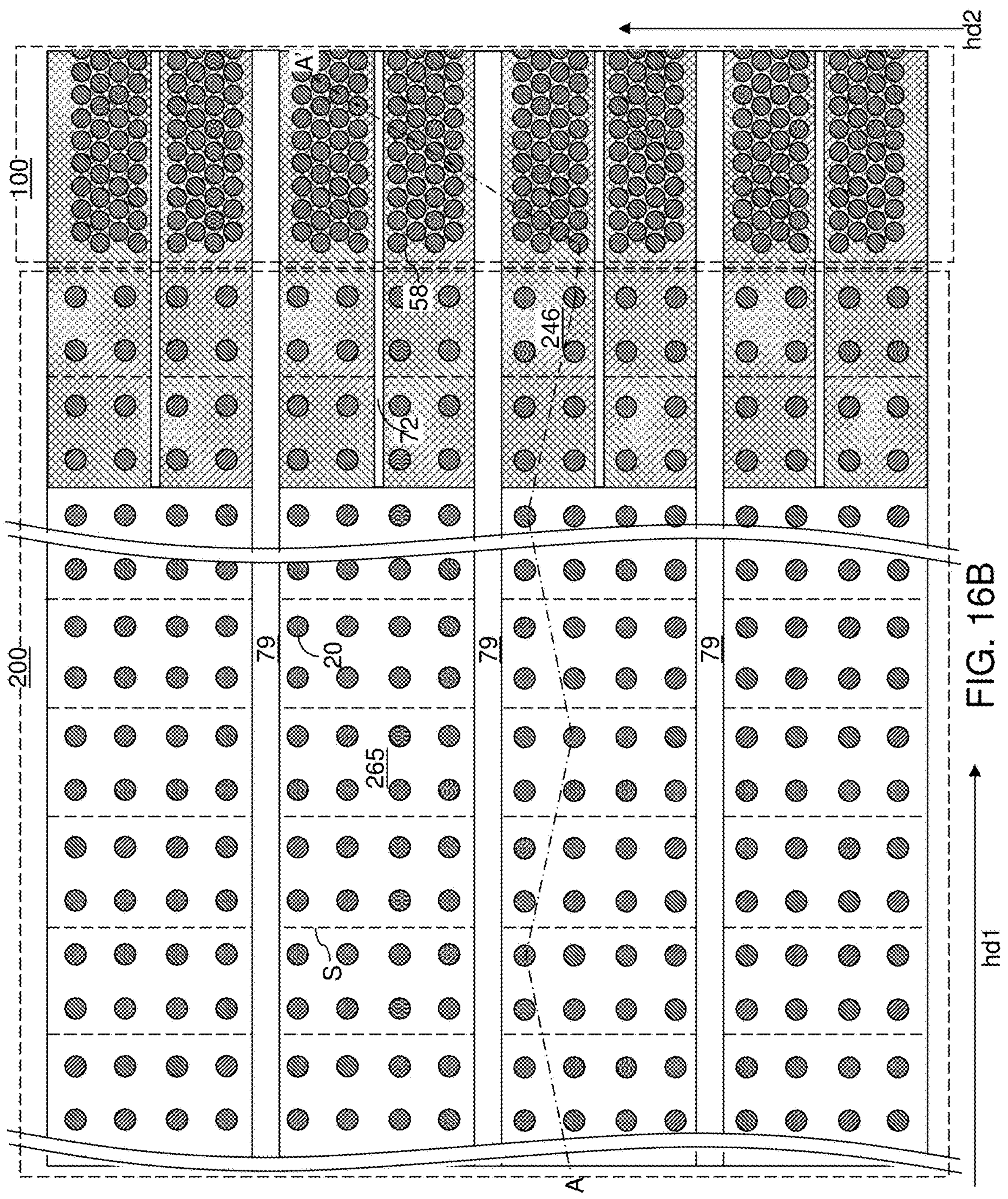
FIG. 16B is a horizontal cross-sectional view of the exemplary structure along the horizontal plane B-B' of FIG. 16A. The zig-zag vertical plane A-A' corresponds to the plane of the vertical cross-sectional view of FIG. 16A.

Referring to FIGS. 16A and 16B, a backside blocking dielectric layer (not shown) can be optionally deposited in the backside recesses and the backside trenches 79 and over the contact-level dielectric layer 280. At least one conductive material can be deposited in the plurality of backside recesses (243, 243), on the sidewalls of the backside trench 79, and over the contact-level dielectric layer 280. The at least one conductive material can include at least one metallic material, i.e., an electrically conductive material that includes at least one metallic element.

A plurality of electrically conductive layers 146 can be formed in the plurality of first backside recesses 143, a plurality of second electrically conductive layers 246 can be formed in the plurality of second backside recesses 243, and a continuous metallic material layer (not shown) can be formed on the sidewalls of each backside trench 79 and over the contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and an electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each backside trench 79 and from above the contact-level dielectric layers 280, for example, by an anisotropic or isotropic etch. Each remaining portion of the deposited metallic material in the first backside recesses constitutes an electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55. The source-select-level conductive layer 118 functions as a source select gate electrode.

Each of the memory opening fill structures 58 (which contains a respective memory stack structures 55) comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack (132, 146, 232, 246) and memory stack structures 55 vertically extending through the at least one alternating stack (132, 146, 232, 246). Each alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Alternating stacks {(132, 146), (232, 246)} of insulating layers (132, 232) and electrically conductive layers (146, 246) are formed, which are laterally spaced apart from each other by the backside trenches 79 along the second horizontal direction hd2. The source layer (112, 114, 116) comprises a lower source-level material layer 112 comprising a first doped semiconductor material, an upper source-level material layer 116 comprising a second doped semiconductor material, and a source contact layer 114 comprising a third doped semiconductor material located between the upper source-level material layer 116 and the lower source-level material layer 112. In one embodiment, each of the vertical semiconductor channels 60 is in contact with the source contact layer 114. In one embodiment, each of the memory opening fill structures 58 comprises a respective memory film 50 that laterally surrounds the respective vertical semiconductor channel 60, has a respective annular concave bottom surface contacting the source contact layer 114, and has a respective cylindrical outer surface contacting the upper source-level material layer 116 and each insulating layer within a respective one of the alternating stacks {(132, 146), (232, 246)}.

Figure 17A:
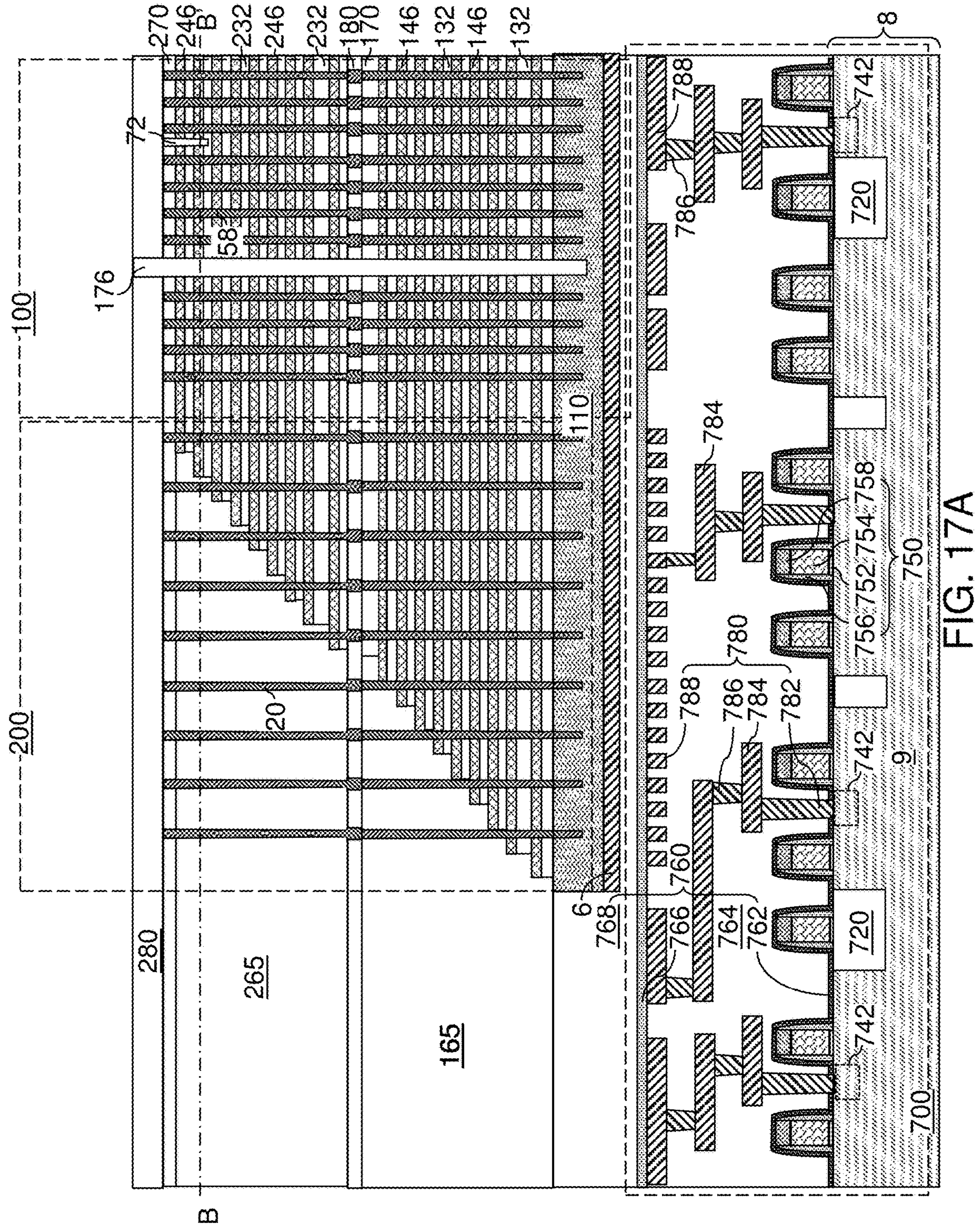
FIG. 17A is a vertical cross-sectional view of the exemplary structure after formation of dielectric trench fill structures in a second subset of the backside trenches and removal of the patterned etch mask layer according to an embodiment of the present disclosure.
Figure 17B:
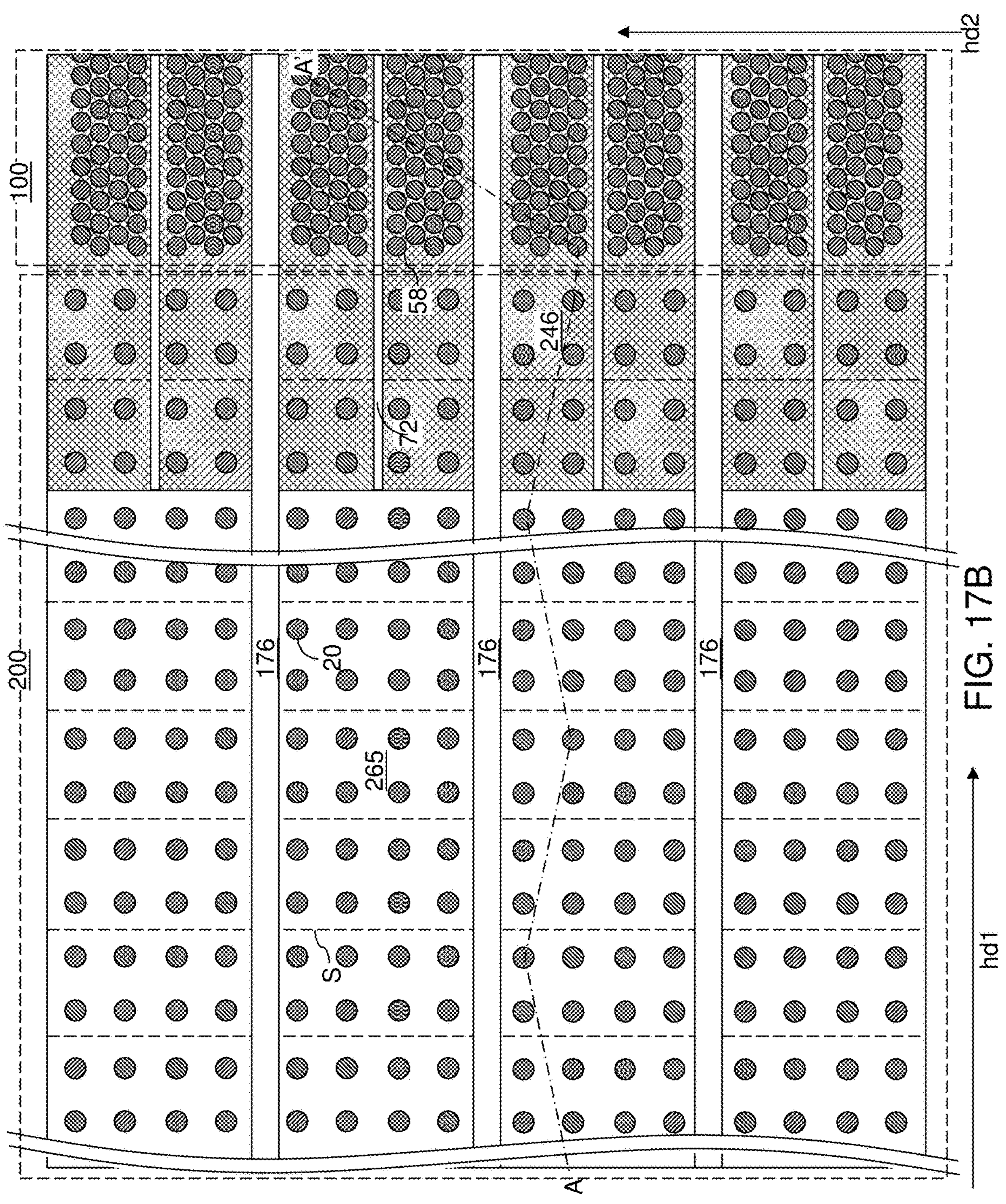
FIG. 17B is a top-down view of the exemplary structure of FIG. 17A. The zig-zag vertical plane A-A' corresponds to the plane of the vertical cross-sectional view of FIG. 17A.

Referring to FIGS. 17A and 17B, a dielectric fill material, such as silicon oxide can be conformally deposited in the backside trenches 79. The dielectric fill material may be deposited by a conformal deposition process such as a low pressure chemical vapor deposition (LPCVD) process. The duration of the deposition process employed to deposit the dielectric fill material may be selected such that the dielectric fill material fills the backside trenches 79. A recess etch process may be optionally performed to remove portions of the dielectric fill material that are deposited over the contact-level dielectric layer 280. Each remaining portion of the dielectric fill material that fills the backside trenches 79 constitutes a dielectric trench fill structure 176.

Figure 18A:
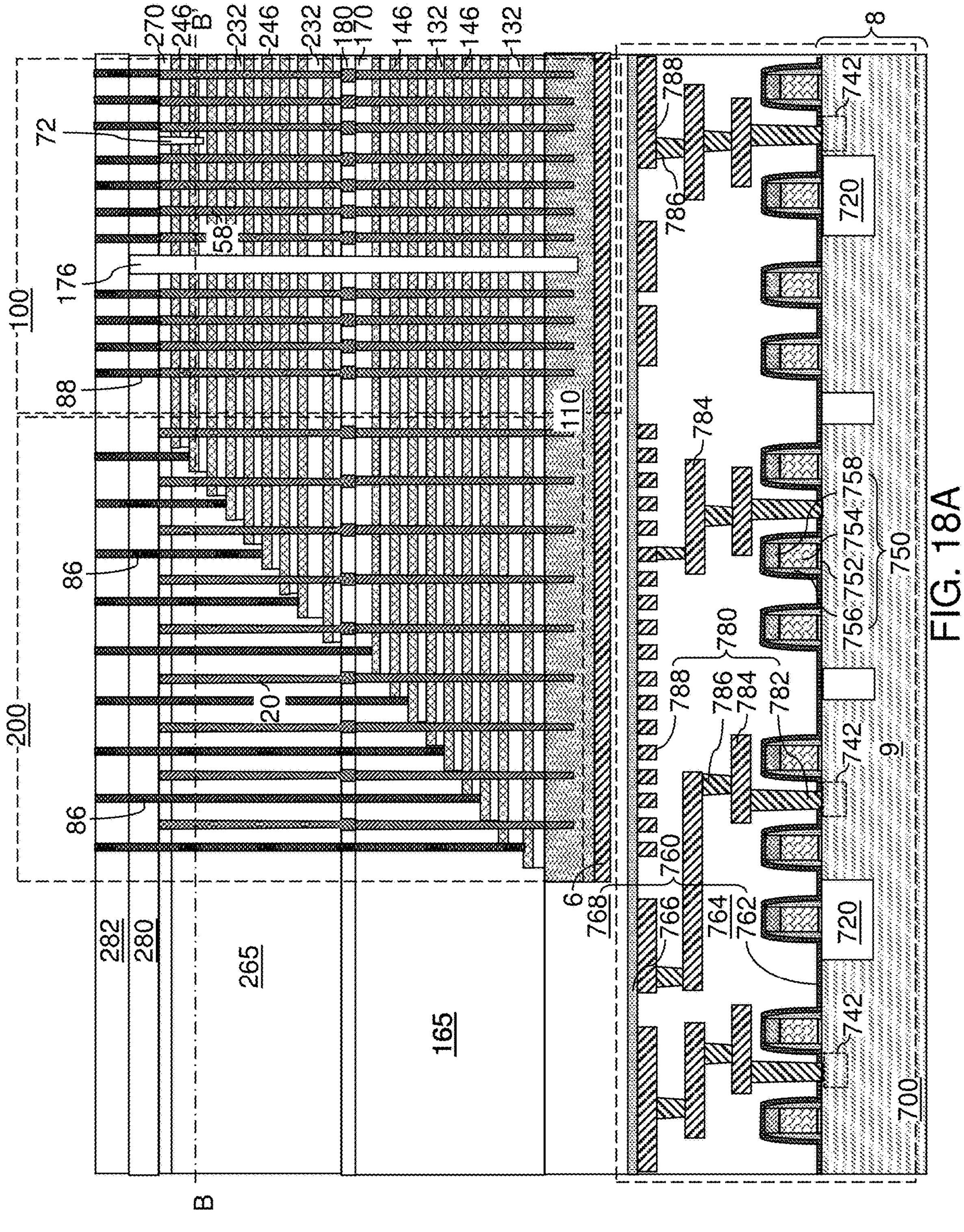
FIG. 18A is a vertical cross-sectional view of the exemplary structure after formation of drain contact via structures and layer contact via structures according to an embodiment of the present disclosure.
Figure 18B:
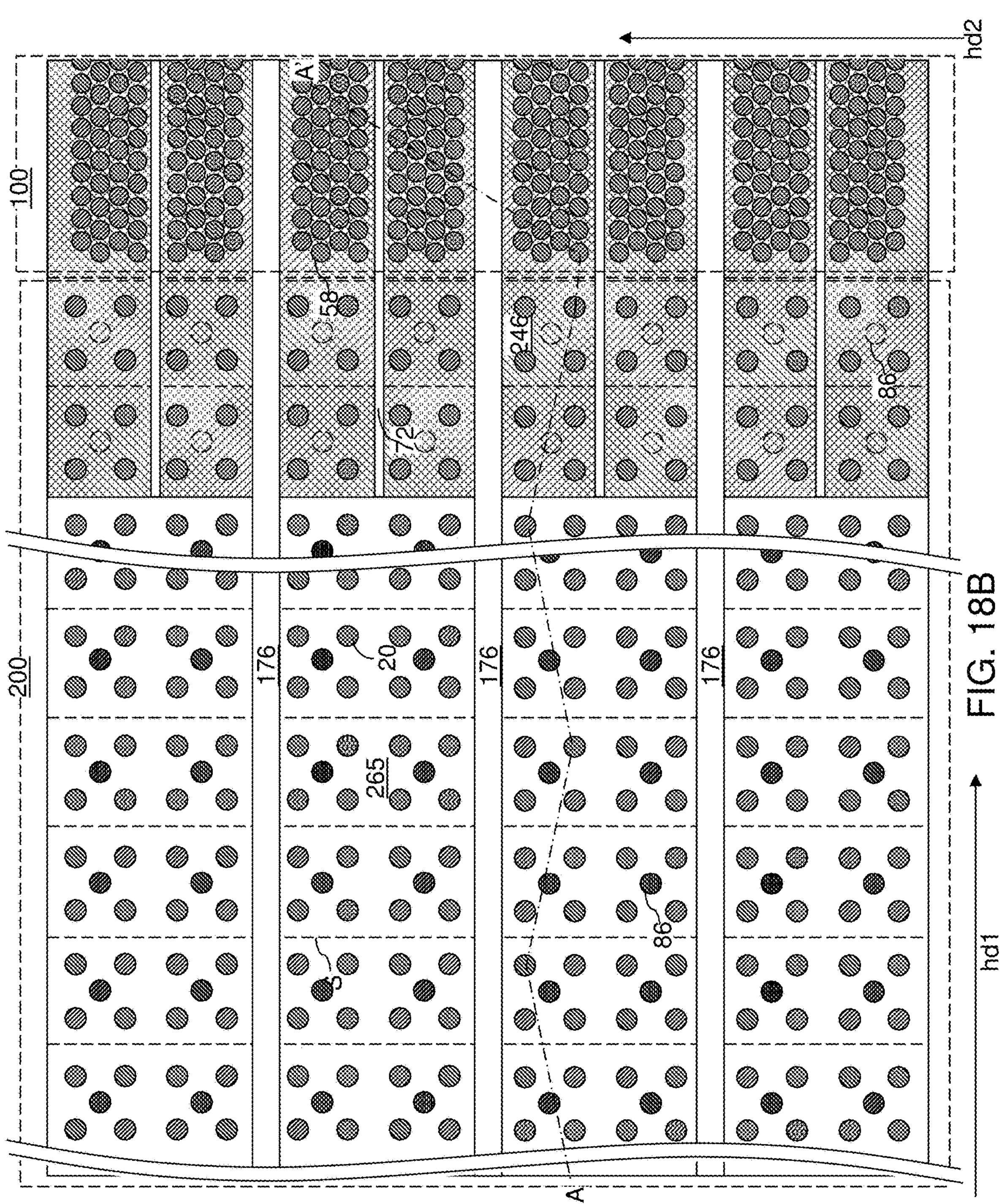
FIG. 18B is a horizontal cross-sectional view of the exemplary structure along the horizontal plane B-B' of FIG. 18A. The zig-zag vertical plane A-A' corresponds to the plane of the vertical cross-sectional view of FIG. 18A.

Referring to FIGS. 18A and 18B, a via-level dielectric layer 282 can be formed over the contact-level dielectric layers 280. A photoresist layer (not shown) can be applied over the via-level dielectric layers 282, and can be lithographically patterned to form various contact via openings. For example, openings for forming drain contact via structures can be formed through the via-level dielectric layer 282 and the contact-level dielectric layer in the memory array region 100, and openings for forming layer contact via structures can be formed through the via-level dielectric layer 282, the contact-level dielectric layer 280, and the retro-stepped dielectric material portions (165, 265) in the staircase region 200. An anisotropic etch process is performed to transfer the pattern in the photoresist layer through the via-level dielectric layer 282, the contact-level dielectric layer 280, and underlying dielectric material portions. The drain regions 63 and the electrically conductive layers (146, 246) can be employed as etch stop structures. Drain contact via cavities can be formed over each drain region 63, and layer contact via cavities can be formed over each electrically conductive layer (146, 246) at the stepped surfaces underlying the first and second retro-stepped dielectric material portions (165, 265). The photoresist layer can be subsequently removed, for example, by ashing.

At least one conductive material can be deposited in the layer contact via cavities and the drain contact via cavities. The at least one conductive material can include at least one metallic material. Excess portions of the at least one conductive material can be removed from above the horizontal plane including the top surface of the via-level dielectric layer 282 by a planarization process. The planarization process can employ a recess etch process and/or a chemical mechanical planarization process. Remaining portions of the at least one conductive material in the drain contact via cavities constitute drain contact via structures 88. Remaining portions of the at least one conductive material in the layer contact via cavities constitute layer contact via structures 86.

Figure 19A:
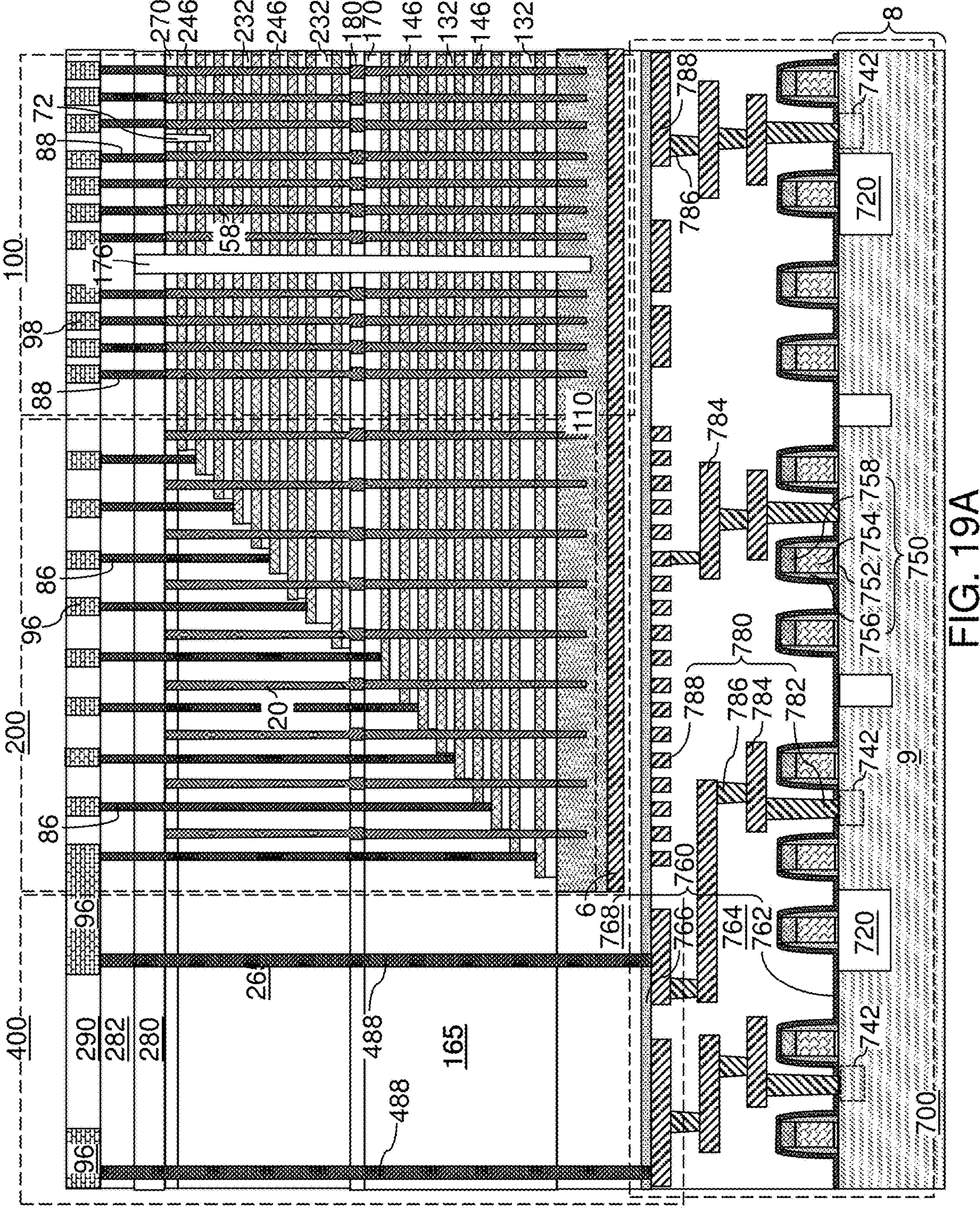
FIG. 19A is a vertical cross-sectional view of the exemplary structure after formation of through-memory-level connection via structures and upper-level metal interconnect structures according to an embodiment of the present disclosure.
Figure 19B:
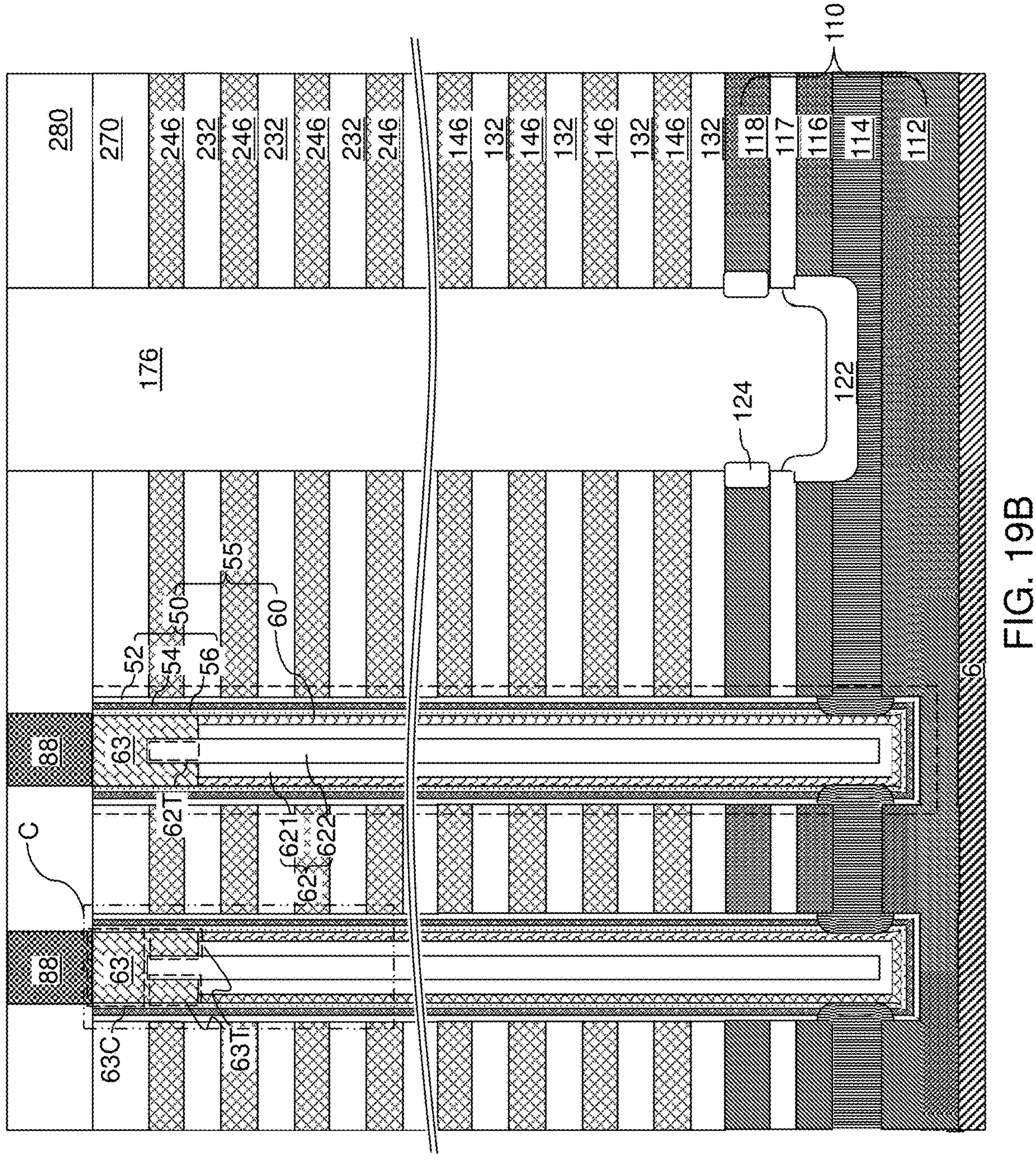
FIG. 19B is a magnified view of a region around a memory opening fill structure of FIG. 19A.
Figure 19C:
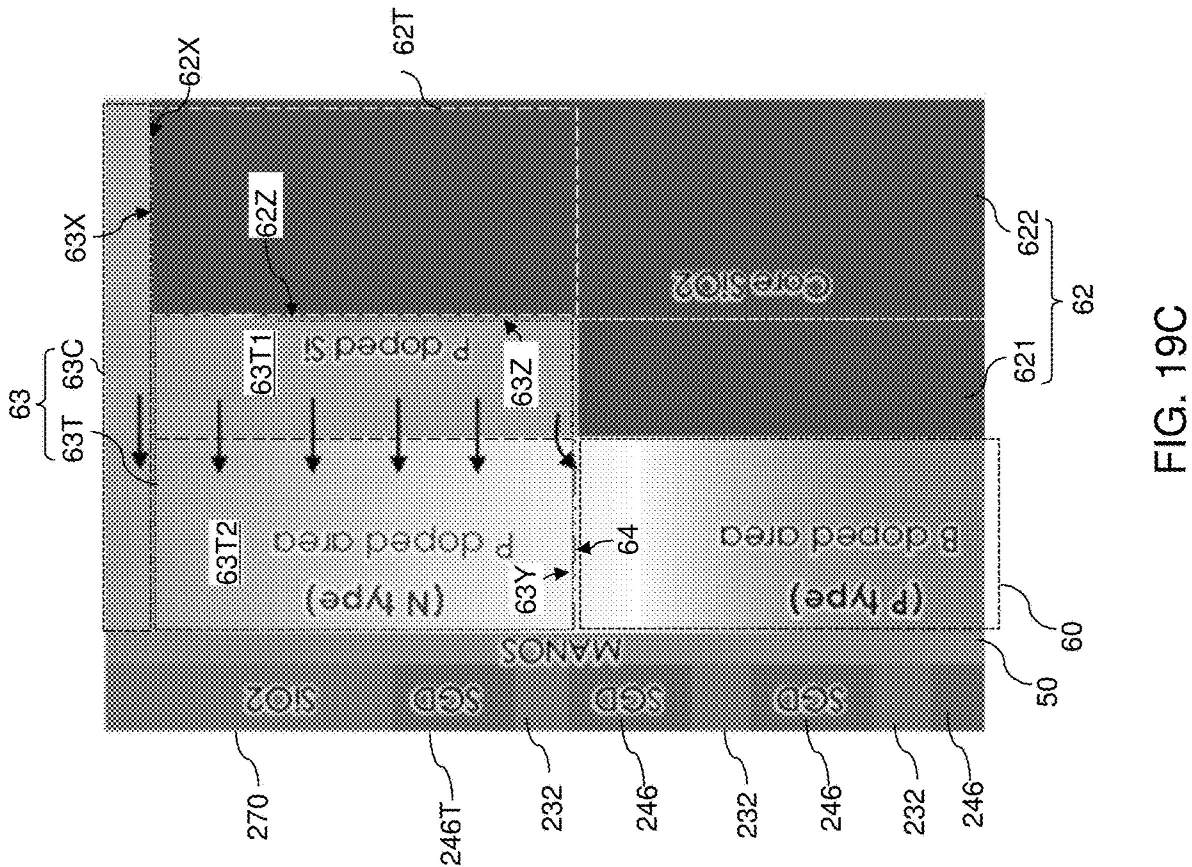
FIG. 19C is a magnified view of region "C" in FIG. 19B.

Referring to FIGS. 19A-19C, connection via structures (which are herein referred to as through-memory-level connection via structures 488) can be formed through the retro-stepped dielectric material portions (165, 265) on a respective one of the lower-level metal interconnect structures 780. Upper-level metal interconnect structures (96, 98) and upper-level dielectric material layers can be formed over the via-level dielectric layer 282. For example, the upper-level dielectric material layers may comprise a bit-line-level dielectric layer 290 and additional dielectric material layers (not shown). The upper-level metal interconnect structures (96, 98) may comprise bit lines 98, bit-line-level metal lines 96, and additional metal lines and via structures (not shown) that are formed above the bit lines 98 and the bit-line-level metal lines 96.

Referring collectively to FIGS. 1A-19C and according to various embodiments of the present disclosure, a semiconductor structure is provided, which comprises: an alternating stack {(132, 146), (232, 246)} of insulating layers (132, 232) and electrically conductive layers (146, 246); a memory opening 49 vertically extending through the alternating stack {(132, 146), (232, 246)}; and a memory opening fill structure 58 located in the memory opening 49 and comprising a memory film 50, a vertical semiconductor channel 60, a dielectric core 62 laterally surrounded by the vertical semiconductor channel 60, and a drain region 63 overlying the dielectric core 62 and the vertical semiconductor channel 60, wherein the drain region 63 comprises an end cap portion 63C and a hollow tubular portion 63T vertically protruding downward from the end cap portion 63C and laterally surrounding a top tip portion 62T of the dielectric core 62.

In one embodiment shown in FIG. 19C, the vertical semiconductor channel 60 comprises a first semiconductor material having a doping of a first conductivity type; the drain region 63 comprises a second semiconductor material having a doping of a second conductivity type that is an opposite of the first conductivity type; and a p-n junction 64 between the vertical semiconductor channel 60 and the drain region 63 is located entirely below a horizontal plane including a bottom surface 63X of the end cap portion 63C of the drain region. In one embodiment, the p-n junction 64 is located within a horizontal plane including a bottom surface 63Y of the hollow tubular portion 63T of the drain region 63.

In one embodiment shown in FIG. 19C, the bottom surface 63Y the hollow tubular portion 63T of the drain region 63 is located below a horizontal plane including a top surface of a topmost electrically conductive layer 246T within the alternating stack {(132, 146), (232, 246)}. In one embodiment, the bottom surface of the hollow tubular portion of the drain region 63 is located below a horizontal plane including a bottom surface of the topmost electrically conductive layer 246T within the alternating stack {(132, 146), (232, 246)}. In one embodiment, the topmost electrically conductive layer 246T comprises a drain side select gate electrode of a vertical NAND string. In one embodiment, two or more, such as three to six of the topmost electrically conductive layers 246 may comprise drain side select gate electrodes.

In one embodiment shown in FIG. 19C, the hollow tubular portion 63T of the drain region 63 comprises an inner portion 63T1 and an outer portion 63T2 surrounding the inner portion 63T1. As shown in FIG. 9N, the inner portion 63T1 is formed as part of the heavily doped semiconductor drain material layer 63L, such as a heavily phosphorous doped, n-type silicon layer 63L. As shown in FIG. 9P, the outer portion 63T2 is formed by outdiffusion of dopants of the second conductivity type (e.g., phosphorus) from layer 63L into the upper portion of the vertical semiconductor channel 60 which is lightly doped with dopants of the first conductivity type (e.g., boron). This is illustrated by the arrows in FIG. 19C. Therefore, in one embodiment, the inner portion 63T1 contains a higher concentration of dopants of the second conductivity type (e.g., phosphorus) than the outer portion 63T2. Furthermore, in another embodiment, the outer portion 63T2 also contains dopants of the first conductivity type (e.g., boron) in a lower concentration than the dopants of the second conductivity type (e.g., phosphorus). The inner portion 63T1 contains no dopants of the first conductivity type or a lower concentration of the dopants of the first conductivity type than the outer portion 63T2.

In one embodiment, the dielectric core 62 comprises: a peripheral dielectric core portion 621 comprising a first dielectric material; and a central dielectric core portion 622 comprising a second dielectric material and laterally surrounded by the peripheral dielectric core portion 621. In one embodiment, the top tip portion 62T of the dielectric core 62 comprises a segment of the central dielectric core portion 622 that protrudes above a horizontal plane including a topmost surface of the peripheral dielectric core portion 621.

In one embodiment shown in FIG. 19C, the top tip portion 62T of the dielectric core 62 comprises a planar top surface 62X that contacts a bottom surface 63X of the end cap portion 63C and a cylindrical sidewall 62Z that contacts an inner sidewall 63Z of the hollow tubular portion 63T (e.g., the sidewall of the inner portion 63T1) of the drain region 63.

In one embodiment, an outer portion of a bottom surface 63Y of the hollow tubular portion 63T contacts a topmost annular surface of the vertical semiconductor channel 60, and an inner portion of the bottom surface 63Y of the hollow tubular portion 63T contacts a top surface of the peripheral dielectric core portion 621. The outer portion of the bottom surface 63Y comprises the bottom surface of the outer portion 63T2 of the hollow tubular portion 63T of the drain region 63, and the inner portion of the bottom surface 63Y comprises the bottom surface of the inner portion 63T1 of the hollow tubular portion 63T of the drain region 63.

In one embodiment, the memory film 50 comprises a layer stack including a tunneling dielectric layer 56, a charge storage layer 54, and a blocking dielectric layer 52.

The embodiments of the present disclosure provide a combination of a thin vertical semiconductor channel 60 and a drain-side p-n junction 64 located below at least the topmost drain side select gate electrode 246T that provides enhanced gate-induced drain leakage (GIDL) current. Generally, the GIDL current above a threshold level is preferred to provide a fast erase operation. Embodiments of the present disclosure employ an etch mask material portion 157 having a vertical extent that may be determined by a tilted ion implantation process. Thus, the height control of the etch mask material portion 157, and the height control of the bottom of the drain regions 63 can be enhanced compared to prior art NAND strings that do not employ a self-aligned depth control mechanism. Thus, embodiments of the present disclosure can provide NAND strings having thin vertical semiconductor channels 60 and downward-protruding drain regions 63 that advantageously increase the GIDL current for erase operations.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising:

an alternating stack of insulating layers and electrically conductive layers;

a memory opening vertically extending through the alternating stack; and a memory opening fill structure located in the memory opening and comprising a memory film, a vertical semiconductor channel, a dielectric core laterally surrounded by the vertical semiconductor channel, and a drain region overlying the dielectric core and the vertical semiconductor channel, wherein the drain region comprises an end cap portion and a hollow tubular portion vertically protruding downward from the end cap portion and laterally surrounding a top tip portion of the dielectric core;

wherein:

the vertical semiconductor channel comprises a first semiconductor material having a doping of a first conductivity type;

the drain region comprises a second semiconductor material having a doping of a second conductivity type that is an opposite of the first conductivity type;

a p-n junction between the vertical semiconductor channel and the drain region is located entirely below a horizontal plane including a bottom surface of the end cap portion of the drain region;

the p-n junction is located within a horizontal plane including a bottom surface of the hollow tubular portion of the drain region;

the bottom surface of the hollow tubular portion of the drain region is located below a horizontal plane including a top surface of a topmost electrically conductive layer within the alternating stack;

the topmost electrically conductive layer comprises a drain side select gate electrode; and the bottom surface of the hollow tubular portion of the drain region is located below a horizontal plane including a bottom surface of the topmost electrically conductive layer.

2. A semiconductor structure comprising:

an alternating stack of insulating layers and electrically conductive layers;

a memory opening vertically extending through the alternating stack; and a memory opening fill structure located in the memory opening and comprising a memory film, a vertical semiconductor channel, a dielectric core laterally surrounded by the vertical semiconductor channel, and a drain region overlying the dielectric core and the vertical semiconductor channel, wherein the drain region comprises an end cap portion and a hollow tubular portion vertically protruding downward from the end cap portion and laterally surrounding a top tip portion of the dielectric core;

wherein:

the vertical semiconductor channel comprises a first semiconductor material having a doping of a first conductivity type;

the drain region comprises a second semiconductor material having a doping of a second conductivity type that is an opposite of the first conductivity type;

a p-n junction between the vertical semiconductor channel and the drain region is located entirely below a horizontal plane including a bottom surface of the end cap portion of the drain region;

the hollow tubular portion of the drain region comprises an inner portion and an outer portion surrounding the inner portion; and the inner portion of the hollow tubular portion of the drain region contains a higher concentration of dopants of the second conductivity type than the outer portion of the hollow tubular portion of the drain region.

3. The semiconductor structure of claim 2, wherein the outer portion of the hollow tubular portion of the drain region further comprises dopants of the first conductivity type in a lower concentration than the dopants of the second conductivity type.

4. The semiconductor structure of claim 3, wherein the inner portion of the hollow tubular portion of the drain region contains no dopants of the first conductivity type or a lower concentration of the dopants of the first conductivity type than the outer portion of the hollow tubular portion of the drain region.

5. A semiconductor structure comprising:

an alternating stack of insulating layers and electrically conductive layers;

a memory opening vertically extending through the alternating stack; and a memory opening fill structure located in the memory opening and comprising a memory film, a vertical semiconductor channel, a dielectric core laterally surrounded by the vertical semiconductor channel, and a drain region overlying the dielectric core and the vertical semiconductor channel, wherein the drain region comprises an end cap portion and a hollow tubular portion vertically protruding downward from the end cap portion and laterally surrounding a top tip portion of the dielectric core;

wherein:

the vertical semiconductor channel comprises a first semiconductor material having a doping of a first conductivity type;

the drain region comprises a second semiconductor material having a doping of a second conductivity type that is an opposite of the first conductivity type;

a p-n junction between the vertical semiconductor channel and the drain region is located entirely below a horizontal plane including a bottom surface of the end cap portion of the drain region;

the hollow tubular portion of the drain region comprises an inner portion and an outer portion surrounding the inner portion;

the dielectric core comprises a peripheral dielectric core portion comprising a first dielectric material, and a central dielectric core portion comprising a second dielectric material and laterally surrounded by the peripheral dielectric core portion;

the top tip portion of the dielectric core comprises a segment of the central dielectric core portion that protrudes above a horizontal plane including a topmost surface of the peripheral dielectric core portion; and the top tip portion of the dielectric core comprises a planar top surface that contacts a bottom surface of the end cap portion and a cylindrical sidewall that contacts an inner sidewall of the inner portion of the hollow tubular portion of the drain region.

6. A semiconductor structure comprising:

an alternating stack of insulating layers and electrically conductive layers;

a memory opening vertically extending through the alternating stack; and a memory opening fill structure located in the memory opening and comprising a memory film, a vertical semiconductor channel, a dielectric core laterally surrounded by the vertical semiconductor channel, and a drain region overlying the dielectric core and the vertical semiconductor channel, wherein the drain region comprises an end cap portion and a hollow tubular portion vertically protruding downward from the end cap portion and laterally surrounding a top tip portion of the dielectric core;

wherein:

the vertical semiconductor channel comprises a first semiconductor material having a doping of a first conductivity type;

the drain region comprises a second semiconductor material having a doping of a second conductivity type that is an opposite of the first conductivity type;

a p-n junction between the vertical semiconductor channel and the drain region is located entirely below a horizontal plane including a bottom surface of the end cap portion of the drain region;

the hollow tubular portion of the drain region comprises an inner portion and an outer portion surrounding the inner portion;

the dielectric core comprises a peripheral dielectric core portion comprising a first dielectric material, and a central dielectric core portion comprising a second dielectric material and laterally surrounded by the peripheral dielectric core portion;

an outer portion of a bottom surface of the hollow tubular portion of the drain region contacts a topmost annular surface of the vertical semiconductor channel; and an inner portion of the bottom surface of the hollow tubular portion of the drain region contacts a top surface of the peripheral dielectric core portion.

7. The semiconductor structure of claim 6, wherein the memory film comprises a layer stack including a tunneling dielectric layer, a charge storage layer, and a blocking dielectric layer.

* * * * *